US009923536B2

(12) United States Patent
Wang et al.

(10) Patent No.: US 9,923,536 B2
(45) Date of Patent: Mar. 20, 2018

(54) VOLUME LEVELER CONTROLLER AND CONTROLLING METHOD

(71) Applicant: DOLBY LABORATORIES LICENSING CORPORATION, San Francisco, CA (US)

(72) Inventors: Jun Wang, Beijing (CN); Lie Lu, Beijing (CN); Alan Seefeldt, Alameda, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 15/284,953

(22) Filed: Oct. 4, 2016

(65) Prior Publication Data

US 2017/0026017 A1    Jan. 26, 2017

Related U.S. Application Data

(62) Division of application No. 14/777,271, filed as application No. PCT/US2014/030385 on Mar. 17, 2014, now Pat. No. 9,548,713.
(Continued)

(30) Foreign Application Priority Data

Mar. 26, 2013    (CN) .......................... 2013 1 0100422

(51) Int. Cl.
*H03G 3/00*    (2006.01)
*H03G 7/00*    (2006.01)
(Continued)

(52) U.S. Cl.
CPC .......... *H03G 7/002* (2013.01); *G10L 21/0364* (2013.01); *G10L 25/30* (2013.01);
(Continued)

(58) Field of Classification Search
CPC .......... H03G 7/002; G10L 25/30; G10L 25/51
See application file for complete search history.

(56) References Cited

U.S. PATENT DOCUMENTS 4,785,418 A    11/1988    Pearce et al.
6,782,361 B1    8/2004    El-Maleh
(Continued)

FOREIGN PATENT DOCUMENTS

EP    0517233    12/1992
EP    1531478    5/2005
(Continued)

OTHER PUBLICATIONS

Lu, L. et al. "Content-based Audio Classification and Segmentation by Using Support Vector Machines", ACM Multimedia Systems (8), 482-492, Mar. 2003.
(Continued)

*Primary Examiner* — Simon King
(74) *Attorney, Agent, or Firm* — Fish & Richardson P.C.

(57) ABSTRACT

Volume leveler controller and controlling method are disclosed. In one embodiment, A volume leveler controller includes an audio content classifier for identifying the content type of an audio signal in real time; and an adjusting unit for adjusting a volume leveler in a continuous manner based on the content type as identified. The adjusting unit may configured to positively correlate the dynamic gain of the volume leveler with informative content types of the audio signal, and negatively correlate the dynamic gain of the volume leveler with interfering content types of the audio signal.

17 Claims, 28 Drawing Sheets

Related U.S. Application Data

(60) Provisional application No. 61/811,072, filed on Apr. 11, 2013.

(51) Int. Cl.

| | | |
|---|---|---|
| *H03G 3/30* | (2006.01) | |
| *H03G 3/32* | (2006.01) | |
| *H03G 5/16* | (2006.01) | |
| *G10L 25/30* | (2013.01) | |
| *G10L 25/51* | (2013.01) | |
| *G10L 21/0364* | (2013.01) | |
| *H04M 7/00* | (2006.01) | |

(52) U.S. Cl.
CPC ........... *G10L 25/51* (2013.01); *H03G 3/3089* (2013.01); *H03G 3/32* (2013.01); *H03G 5/165* (2013.01); *H03G 7/007* (2013.01); *H04M 7/006* (2013.01); *H04M 2203/305* (2013.01)

(56) References Cited

U.S. PATENT DOCUMENTS

| | | | |
|---|---|---|---|
| 7,369,185 B2 | 5/2008 | Kitamura | |
| 7,454,331 B2 | 11/2008 | Vinton | |
| 7,487,094 B1 | 2/2009 | Konig | |
| 7,747,028 B2 | 6/2010 | Saito | |
| 7,804,974 B2 | 9/2010 | Paludan-Muller | |
| 8,019,094 B2 | 9/2011 | Hsieh | |
| 8,073,684 B2 | 12/2011 | Sundareson | |
| 8,195,454 B2 | 6/2012 | Muesch | |
| 8,199,933 B2 | 6/2012 | Seefeldt | |
| 9,349,384 B2 | 5/2016 | Gunawan | |
| 2005/0131684 A1* | 6/2005 | Clelland | G10L 15/22 704/231 |
| 2005/0131688 A1* | 6/2005 | Goronzy | G10L 25/78 704/240 |
| 2005/0228649 A1 | 10/2005 | Harb | |
| 2006/0196337 A1 | 9/2006 | Breebart | |
| 2007/0021958 A1 | 1/2007 | Visser | |
| 2007/0266402 A1* | 11/2007 | Pawlak | G06F 17/30029 725/46 |
| 2010/0250258 A1 | 9/2010 | Smithers | |
| 2010/0268533 A1 | 10/2010 | Park | |
| 2011/0088053 A1 | 4/2011 | Lee | |
| 2011/0150242 A1 | 6/2011 | Zong | |
| 2011/0218798 A1* | 9/2011 | Gavalda | G06F 17/30 704/201 |
| 2011/0313762 A1 | 12/2011 | Ben-David | |
| 2012/0022864 A1 | 1/2012 | Leman | |
| 2012/0109643 A1* | 5/2012 | Yi | G10L 19/173 704/201 |
| 2012/0224707 A1* | 9/2012 | Kim | H04L 67/18 381/56 |
| 2012/0294461 A1 | 11/2012 | Maeda | |
| 2012/0310635 A1 | 12/2012 | Muesch | |
| 2012/0328114 A1 | 12/2012 | Takeuchi | |
| 2014/0016791 A1 | 1/2014 | Smith | |
| 2014/0162625 A1* | 6/2014 | Zhao | H04N 21/4122 455/420 |
| 2014/0278391 A1* | 9/2014 | Braho | G10L 15/20 704/233 |

FOREIGN PATENT DOCUMENTS

| | | |
|---|---|---|
| JP | 08-250944 | 9/1996 |
| JP | 11-017472 | 1/1999 |
| JP | 2005-229544 | 8/2005 |
| JP | 2007-208407 | 8/2007 |
| JP | 2008-521046 | 6/2008 |
| WO | 02/10974 | 2/2002 |
| WO | 2005/106843 | 11/2005 |
| WO | 2006/132596 | 12/2006 |
| WO | 2007/127023 | 11/2007 |
| WO | 2008/058842 | 5/2008 |
| WO | 2008/078232 | 7/2008 |
| WO | 2008/106036 | 9/2008 |
| WO | 2009/011827 | 1/2009 |
| WO | 2009/046658 | 4/2009 |
| WO | 2010/033387 | 3/2010 |
| WO | 2011/141772 | 11/2011 |
| WO | 2012/075246 | 6/2012 |

OTHER PUBLICATIONS

Lu, L. et al., "Automatic Mood Detection and Tracking of Music Audio Signals" IEEE Transactions on Audio, Speech and Language Processing, vol. 14, No. 1, Jan. 2006, pp. 5-18.

Malfait, L. et al "P.563—The ITU-T Standard for Single-Ended Speech Quality Assessment" IEEE Transactions on Audio, Speech, and Language Processing, vol. 14, Issue 6, pp. 1924-1934, Nov. 2006.

McKinney, M.F. et al. "Features for Audio and Music Classification" Proc. ISMIR, 2003, pp. 1-8.

Platt, J. "Probabilistic Outputs for Support Vector Machines and Comparisons to Regularized Likelihood Methods", Advances in Large Margin Classifiers, Mar. 26, 1999, pp. 1-11.

Wakefield, G.H., "Mathematical Representation of Joint Time-Chroma Distributions" Part of the SPIE Conference on Advanced Signal Processing Algorithms, Architectures, and Implementations, Jul. 1999, vol. 3807, pp. 637-645.

\* cited by examiner

VOLUME LEVELER CONTROLLER AND CONTROLLING METHOD

CROSS REFERENCE TO RELATED APPLICATIONS

This application is a divisional of U.S. patent application Ser. No. 14/777,271, filed Sep. 15, 2015 which in turn is the 371 national stage of PCT/US2014/030385, filed Mar. 17, 2014. PCT Application No. PCT/US2014/030385 claims priority to Chinese Patent Application No. 201310100422.1, filed on Mar. 26, 2013 and U.S. Provisional Patent Application No. 61/811,072, filed on Apr. 11, 2013, each of which is hereby incorporated by reference in its entirety.

TECHNICAL FIELD

The present application relates generally to audio signal processing. Specifically, embodiments of the present application relate to apparatuses and methods for audio classifying and processing, especially controlling of dialog enhancer, surround virtualizer, volume leveler and equalizer.

BACKGROUND

Some audio improving devices tend to modify audio signals, in either temporal domain or spectral domain, in order to improve overall quality of the audio and enhance users' experience correspondingly. Various audio improving devices have been developed for various purposes. Some typical examples of audio improving devices include:

Dialog Enhancer: Dialog is the most important component in a movie and radio or TV program to understand the story. Methods were developed to enhance the dialogs in order to increase their clarity and their intelligibility, especially for elders with decreasing hearing capability.

Surround Virtualizer: A surround virtualizer enables a surround (multi-channel) sound signal to be rendered over the internal speakers of the PC or over headphones. That is, with the stereo device (such as speakers and headphones), it creates virtually surround effect and provides cinematic experience for consumers.

Volume Leveler: A volume leveler aims at tuning the volume of the audio content on playback and keeping it almost consistent over the timeline based on a target loudness value.

Equalizer: An equalizer provides consistency of spectral balance, as known as "tone" or "timbre", and allows users to configure the overall profile (curve or shape) of the frequency response (gain) on each individual frequency band, in order to emphasize certain sounds or remove undesired sounds. In a traditional equalizer, different equalizer presets may be provided for different sounds, such as different music genres. Once a preset is selected, or an equalization profile is set, the same equalization gains will be applied on the signal, until the equalization profile is modified manually, In contrast, a dynamic equalizer achieves the spectral balance consistency by continuously monitoring the spectral balance of the audio, comparing it to a desired tone, and dynamically adjusting an equalization filter to transform the audio's original tone into the desired tone.

In general, an audio improving devices has its own application scenario/context. That is, an audio improving device may be suitable for only a certain set of contents but not for all the possible audio signals, since different contents may need to be processed in different ways. For example, a dialog enhancement method is usually applied on movie content. If it is applied on music in which there are no dialogs, it may falsely boost some frequency sub-bands and introduce heavy timbre change and perceptual inconsistency. Similarly, if a noise suppression method is applied on music signals, strong artifacts will be audible.

However, for an audio processing system that usually comprises a set of audio improving devices, its input could be unavoidably all the possible types of audio signals. For example, an audio processing system, integrated in a PC, will receive audio content from a variety of sources, including movie, music, VoIP and game. Thus, identifying or differentiating the content being processed becomes important, in order to apply better algorithms or better parameters of each algorithm on the corresponding content.

In order to differentiate audio content and apply better parameters or better audio improving algorithms correspondingly, traditional systems usually pre-design a set of presets, and users are asked to choose a preset for the content being played. A preset usually encodes a set of audio improving algorithms and/or their best parameters that will be applied, such as a 'Movie' preset and a 'Music' preset which is specifically designed for movie or music playback.

However, manual selection is inconvenient for users. Users usually don't frequently switch among the predefined presets but just keep using one preset for all the content. In addition, even in some automatic solutions the parameters or algorithms setup in the presets are usually discrete (such as turn On or Off for a specific algorithm with respect to a specific content), it cannot adjust parameters in a content-based continuous manner.

SUMMARY

The first aspect of the present application is to automatically configure audio improving devices in a continuous manner based on the audio content on playback. With this "automatic" mode, users can simply enjoy their content without bothering to select different presets. On the other hand, continuously tuning is more important in order to avoid audible artifacts at the transition points.

According to an embodiment of the first aspect, an audio processing apparatus includes an audio classifier for classifying an audio signal into at least one audio type in real time; an audio improving device for improving experience of audience; and an adjusting unit for adjusting at least one parameter of the audio improving device in a continuous manner based on the confidence value of the at least one audio type.

The audio improving device may be any of dialog enhancer, surround virtualizer, volume leveler and equalizer.

Correspondingly, an audio processing method includes: classifying an audio signal into at least one audio type in real time; and adjusting at least one parameter for audio improvement in a continuous manner based on the confidence value of the at least one audio type.

According to another embodiment of the first aspect, A volume leveler controller includes an audio content classifier for identifying the content type of an audio signal in real time; and an adjusting unit for adjusting a volume leveler in a continuous manner based on the content type as identified. The adjusting unit may configured to positively correlate the dynamic gain of the volume leveler with informative content types of the audio signal, and negatively correlate the dynamic gain of the volume leveler with interfering content types of the audio signal.

Also disclosed is an audio processing apparatus comprising A volume leveler controller as stated above.

Correspondingly, A volume leveler controlling method includes: identifying the content type of an audio signal in real time; and adjusting a volume leveler in a continuous manner based on the content type as identified, by positively correlating the dynamic gain of the volume leveler with informative content types of the audio signal, and negatively correlating the dynamic gain of the volume leveler with interfering content types of the audio signal.

According to yet another embodiment of the first aspect, an equalizer controller includes an audio classifier for identifying the audio type of an audio signal in real time; and an adjusting unit for adjusting an equalizer in a continuous manner based on the confidence value of the audio type as identified.

Also disclosed is an audio processing apparatus comprising an equalizer controller as stated above.

Correspondingly, an equalizer controlling method includes: identifying the audio type of an audio signal in real time; and adjusting an equalizer in a continuous manner based on the confidence value of the audio type as identified.

The present application also provides a computer-readable medium having computer program instructions recorded thereon, when being executed by a processor, the instructions enabling the processor to execute the above-mentioned audio processing method, or The volume leveler controlling method, or the equalizer controlling method.

According to the embodiments of the first aspect, the audio improving device, which may be one of dialog enhancer, surround virtualizer, volume leveler and equalizer, may be continuously adjusted according to the type of the audio signal and/or the confidence value of the type.

The second aspect of the present application is to develop a content identification component to identify multiple audio types, and the detected results may be used to steer/guide the behaviors of various audio improving devices, by finding better parameters in a continuous manner.

According to an embodiment of the second aspect, an audio classifier includes: a short-term feature extractor for extracting short-term features from short-term audio segments each comprising a sequence of audio frames; a short-term classifier for classifying a sequence of short-term segments in a long-term audio segment into short-term audio types using respective short-term features; a statistics extractor for calculating the statistics of the results of the short-term classifier with respect to the sequence of short-term segments in the long-term audio segment, as long-term features; and a long-term classifier for, using the long-term features, classifying the long-term audio segment into long-term audio types.

Also disclosed is an audio processing apparatus comprising an audio classifier as stated above.

Correspondingly, an audio classifying method includes: extracting short-term features from short-term audio segments each comprising a sequence of audio frames; classifying a sequence of short-term segments in a long-term audio segment into short-term audio types using respective short-term features; calculating the statistics of the results of classifying operation with respect to the sequence of short-term segments in the long-term audio segment, as long-term features; and classifying the long-term audio segment into long-term audio types using the long-term features.

According to another embodiment of the second aspect, an audio classifier includes: an audio content classifier for identifying a content type of a short-term segment of an audio signal; and an audio context classifier for identifying a context type of the short-term segment at least partly based on the content type identified by the audio content classifier.

Also disclosed is an audio processing apparatus comprising an audio classifier as stated above.

Correspondingly, an audio classifying method includes: identifying a content type of a short-term segment of an audio signal; and identifying a context type of the short-term segment at least partly based on the content type as identified.

The present application also provides a computer-readable medium having computer program instructions recorded thereon, when being executed by a processor, the instructions enabling the processor to execute the above-mentioned audio classifying methods.

According to the embodiments of the second aspect, an audio signal may be classified into different long-term types or context types, which are different from short-term types or content types. The types of the audio signal and/or the confidence value of the types may be further used to adjust an audio improving device, such as dialog enhancer, surround virtualizer, volume leveler or equalizer.

BRIEF DESCRIPTION OF DRAWINGS

The present application is illustrated by way of example, and not by way of limitation, in the figures of the accompanying drawings, in which like reference numerals refer to similar elements and in which.

DETAILED DESCRIPTION

Figure 1:
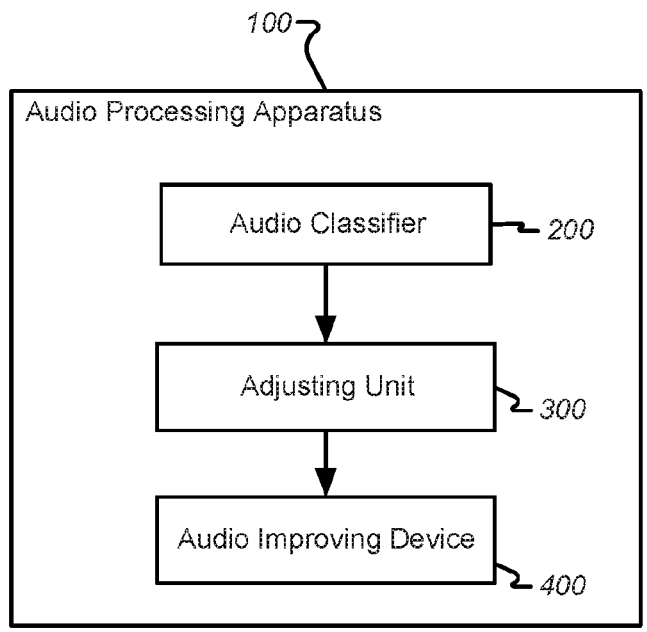
FIG. 1 is a diagram illustrating an audio processing apparatus according to an embodiment of the application.

The embodiments of the present application are below described by referring to the drawings. It is to be noted that, for purpose of clarity, representations and descriptions about those components and processes known by those skilled in the art but not necessary to understand the present application are omitted in the drawings and the description.

As will be appreciated by one skilled in the art, aspects of the present application may be embodied as a system, a device (e.g., a cellular telephone, a portable media player, a personal computer, a server, a television set-top box, or a digital video recorder, or any other media player), a method or a computer program product. Accordingly, aspects of the present application may take the form of an hardware embodiment, an software embodiment (including firmware, resident software, microcodes, etc.) or an embodiment combining both software and hardware aspects that may all generally be referred to herein as a "circuit," "module" or "system." Furthermore, aspects of the present application may take the form of a computer program product embodied in one or more computer readable mediums having computer readable program code embodied thereon.

Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic or optical signal, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wired line, optical fiber cable, RF, etc., or any suitable combination of the foregoing.

Computer program code for carrying out operations for aspects of the present application may be written in any combination of one or more programming languages, including an object oriented programming language such as Java, Smalltalk, C++ or the like and conventional procedural programming languages, such as the "C" programming language or similar programming languages. The program code may execute entirely on the user's computer as a stand-alone software package, or partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present application are described below with reference to flowchart illustrations and/or block diagrams of methods, apparatus (systems) and computer program products according to embodiments of the application. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational operations to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Below will be described in detail the embodiments of the present application. For clarity, the description is organized in the following architecture:

Part 1: Audio Processing Apparatus and Methods
  Section 1.1 Audio Types
  Section 1.2 Confidence Values of Audio Types and Architecture of Classifiers
  Section 1.3 Smoothing of Confidence Values of Audio Types
  Section 1.4 Parameter Adjusting
  Section 1.5 Parameter Smoothing
  Section 1.6 Transition of Audio Types
  Section 1.7 Combination of Embodiments and Application Scenarios
  Section 1.8 Audio Processing Method
Part 2: Dialog Enhancer Controller and Controlling Method
  Section 2.1 Level of Dialog Enhancement
  Section 2.2 Thresholds for Determining Frequency Bands to be Enhanced
  Section 2.3 Adjustment to Background Level
  Section 2.4 Combination of Embodiments and Application Scenarios
  Section 2.5 Dialog Enhancer Controlling Method
Part 3: Surround Virtualizer Controller and Controlling Method
  Section 3.1 Surround Boost Amount
  Section 3.2 Start Frequency
  Section 3.3 Combination of Embodiments and Application Scenarios
  Section 3.4 Surround Virtualizer Controlling Method
Part 4: Volume Leveler Controller and Controlling Method
  Section 4.1 Informative and Interfering Content Types
  Section 4.2 Content Types in Different Contexts
  Section 4.3 Context Types
  Section 4.4 Combination of Embodiments and Application Scenarios
  Section 4.5 Volume Leveler Controlling Method
Part 5: Equalizer Controller and Controlling Method
  Section 5.1 Control Based on Content Type
  Section 5.2 Likelihood Of Dominant Sources In Music
  Section 5.3 Equalizer presets
  Section 5.4 Control Based on Context Type
  Section 5.5 Combination of Embodiments and Application Scenarios
  Section 5.6 Equalizer Controlling Method
Part 6: Audio Classifiers and Classifying Methods
  Section 6.1 Context Classifier Based on Content Type Classification
  Section 6.2 Extraction of Long-term Features
  Section 6.3 Extraction of Short-term Features
  Section 6.4 Combination of Embodiments and Application Scenarios
  Section 6.5 Audio Classifying Methods
Part 7: VoIP Classifiers and Classifying Methods
  Section 7.1 Context Classification Based on Short-term Segment
  Section 7.2 Classification Using VoIP Speech and VoIP Noise
  Section 7.3 Smoothing Fluctuation
  Section 7.4 Combination of Embodiments and Application Scenarios
  Section 7.5 VoIP Classifying Methods Part 1: Audio Processing Apparatus and Methods FIG. 1 illustrates a general framework of a content-adaptive audio processing apparatus 100 that supports automatic configuration of at least one audio improving device 400 with improved parameters based on the audio content on playback. It comprises three major components: an audio classifier 200, an adjusting unit 300 and an audio improving device 400.

The audio classifier 200 is for classifying an audio signal into at least one audio type in real time. It automatically identifies the audio types of the content on playback. Any audio classification technologies, such as through signal processing, machine learning, and pattern recognition, can be applied to identify the audio content. Confidence values, which represent the probabilities of the audio content regarding a set of pre-defined target audio types, are estimated generally at the same time.

The audio improving device 400 is for improving the experience of the audience by performing processing on the audio signal, and will be discussed in detail later.

The adjusting unit 300 is for adjusting at least one parameter of the audio improving device in a continuous manner based on the confidence value of the at least one audio type. It is designed to steer the behavior of the audio improving device 400. It estimates the most suitable parameters of the corresponding audio improving device based on the results obtained from the audio classifier 200.

Figure 2:
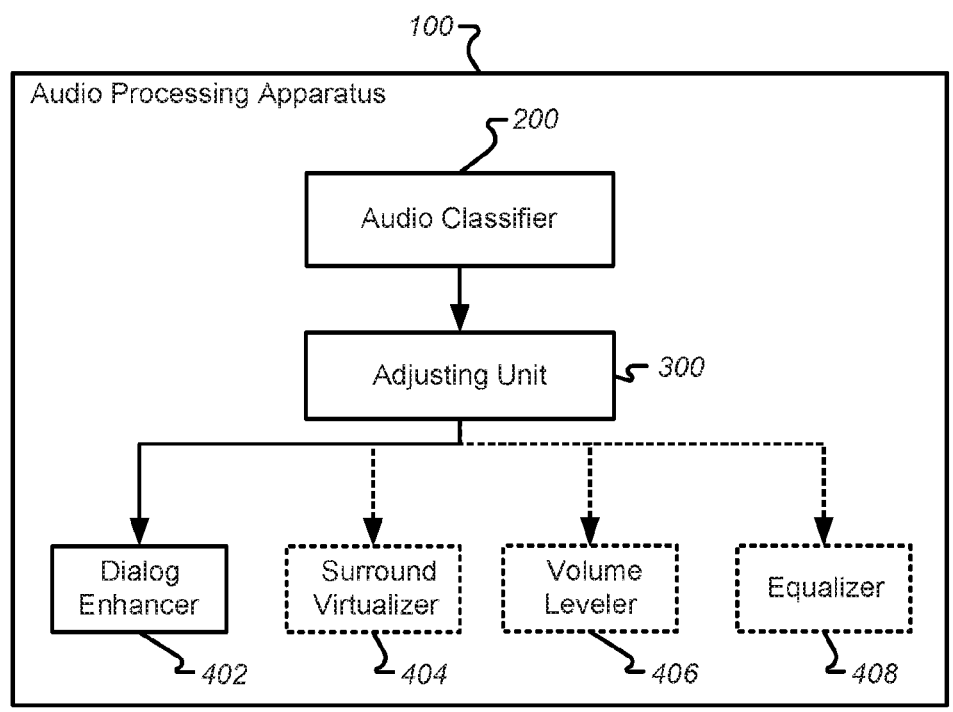
FIGS. 2 and 3 are diagrams illustrating variants of the embodiment as shown in FIG. 1.

Various audio improving devices can be applied in this apparatus. FIG. 2 shows an example system comprising four audio improving devices, including Dialog Enhancer (DE) 402, Surround Virtualizer (SV) 404, Volume Leveler (VL) 406 and Equalizer (EQ) 408. Each audio improving device can be automatically adjusted in a continuous manner, based on the results (audio types and/or confidence values) obtained in the audio classifier 200.

Of course, the audio processing apparatus may not necessarily include all the kinds of audio improving devices, but may include only one or more of them. On the other hand, the audio improving devices are not limited to those devices given in the present disclosure and may include more kinds of audio improving devices which are also within the scope of the present application. Furthermore, the names of those audio improving devices discussed in the present disclosure, including Dialog Enhancer (DE) 402, Surround Virtualizer (SV) 404, Volume Leveler (VL) 406 and Equalizer (EQ) 408, shall not constitute a limitation, and each of them shall be construed as covering any other devices realizing the same or similar functions.

1.1 Audio Types

For properly controlling various kinds of audio improving device, the present application further provides a new architecture of audio types, although those audio types in the prior art are also applicable here.

Specifically, audio types from different semantic levels are modeled, including low-level audio elements representing the fundamental components in audio signals and high-level audio genres representing the most popular audio contents in real-life user entertainment applications. The former may also be nominated as "content type". Fundamental audio content types may include speech, music (including song), background sounds (or sound effects) and noise.

The meaning of speech and music is self-evident. The noise in the present application means physical noise, not semantic noise. Physical noise in the present application may include the noises from, for example, air conditioners, and those noises originating from technical reasons, such as pink noises due to the signal transmitting path. In contrast, the "background sounds" in the present application are those sound effects which may be auditory events happening around the core target of the listener's attention. For example, in an audio signal in a telephone call, besides the voice of the talker, there may be some other sounds not intended, such as the voices of some other persons irrelevant to the telephone call, sounds of keyboards, sounds of footsteps, and so on. These unwanted sounds are referred to as "background sounds", not noise. In other words, we may define "background sounds" as those sounds that are not the target (or core target of the listener's attention), or even are not wanted, but still have some semantic meaning; while "noise" may be defined as those unwanted sounds except the target sounds and the background sounds.

Sometimes background sounds are really not "unwanted" but created intentionally and carry some useful information, such as those background sounds in a movie, a TV program or a radio broadcast program. So, sometimes it may also be referred to as "sound effects". Hereinafter in the present disclosure, only "background sounds" is used for conciseness, and it may be further abbreviated as "background".

Further, the music may be further classified as music without dominant sources and music with dominant sources. If there is a source (voice or an instrument) is much stronger than the other sources in a music piece, it is referred to as "music with dominant source"; otherwise, it is referred to as "music without dominant source". For example, in a polyphonic music accompanied with singing voice and various instruments, if it is harmonically balanced, or the energy of several most salient sources are comparable to each other, it is considered to be a music without dominant source; in contrast, if a source (e.g. voice) is much louder while the others are much quieter, it is considered to contain a dominant source. As another example, singular or distinctive instrument tones are "music with dominant source".

The music may be further classified as different types based on different standards. It can be classified based on genres of the music, such as rock, jazz, rap and folk, but not limited thereto. It can also be classified based on instruments, such as vocal music and instrumental music. Instrumental music may include various music played with different instruments, such as piano music and guitar music. Other example standards include rhythm, tempo, timbre of the music and/or any other musical attributes, so that music can be grouped together based on the similarity of these attributes. For example, according to timbre, vocal music may be classified as tenor, baritone, bass, soprano, mezzo soprano and alto.

The content type of an audio signal may be classified with respect to short-term audio segments, such as comprised of a plurality of frames. Generally an audio frame is of a length of multiple milliseconds, such as 20 ms, and the length of a short-term audio segment to be classified by the audio classifier may have a length from several hundred of milliseconds to several seconds, such as 1 second.

For controlling the audio improving device in a content-adaptive manner, the audio signal may be classified in real time. For the content type stated above, the content type of the present short-term audio segment represents the content type of the present audio signal. Since the length of a short-term audio segment is not so long, the audio signal may be divided as non-overlapped short-term audio segments one after another. However, the short-term audio segments may also be sampled continuously/semi-continuously along the time line of the audio signal. That is, the short-term audio segments may be sampled with a window with a predetermined length (intended length of the short-term audio segment) moving along the time line of the audio signal at a step size of one or more frames.

The high-level audio genres may also be nominated as "context type", since it indicates a long-term type of the audio signal, and may be regarded as an environment or context of the instant sound event, which may be classified into the content types as stated above. According to the present application, the context type may include the most popular audio applications, such as movie-like media, music (including song), game and VoIP (Voice on Internet Protocol).

The meaning of music, game and VoIP is self-evident. Movie-like media may include movie, TV program, radio broadcast program or any other audio media similar to aforementioned. The main characteristic of movie-like media is a mixture of possible speeches, music and various kinds of background sounds (sound effects).

It may be noted both the content type and the context type include music (including song). Hereinafter in the present application, we use the wordings "short-term music" and "long-term music" to distinguish them respectively.

For some embodiments of the present application, some other context type architectures are also proposed.

For example, an audio signal may be classified as high-quality audio (such as movie-like media and music CD) or low-quality audio (such as VoIP, low bit rate online streaming audio and user generated content), which may be collectively referred to as "audio quality types".

As another example, an audio signal may be classified as VoIP or non-VoIP, which may be regarded as a transform of the 4-context type architecture mentioned above (VoIP, movie-like media, (long-term) music and game). In connection with the context of VoIP or non-VoIP, an audio signal may be classified as VoIP-related audio content types, such as VoIP speech, non-VoIP speech, VoIP noise and non-VoIP noise. The architecture of VoIP audio content types are especially useful to differentiate VoIP and non-VoIP contexts since VoIP context is usually the most challenging application scenario of a volume leveler (one kind of audio improving device).

Generally the context type of an audio signal may be classified with respect to long-term audio segments longer than the short-term audio segments. A long-term audio segment is comprised of a plurality of frames in a number more than the number of frames in a short-term audio segment. A long-term audio segment may also be comprised of a plurality of short-term audio segments. Generally a long-term audio segment may have a length in the order of seconds, such as several seconds to several tens of seconds, say 10 seconds.

Similarly, for controlling the audio improving device in an adaptive manner, the audio signal may be classified into context types in real time. Similarly, the context type of the present long-term audio segment represents the context type of the present audio signal. Since the length of a long-term audio segment is relatively long, the audio signal may be sampled continuously/semi-continuously along the time line of the audio signal to avoid abrupt change of its context type and thus abrupt change of the working parameters of the audio improving device(s). That is, the long-term audio segments may be sampled with a window with a predetermined length (intended length of the long-term audio segment) moving along the time line of the audio signal at a step size of one or more frames, or one or more short-term segments.

Figure 3:
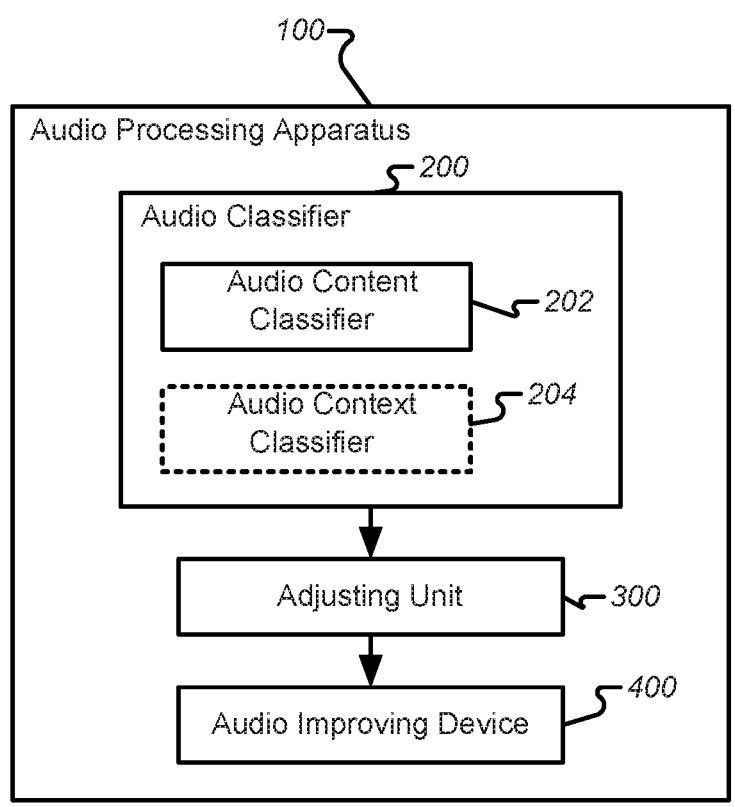

Above have been described both the content type and the context type. In the embodiments of the present application, the adjusting unit 300 may adjust at least one parameter of the audio improving device(s) based on at least one of the various content types, and/or at least one of the various context types. Therefore, as shown in FIG. 3, in a variant of the embodiment shown in FIG. 1, the audio classifier 200 may comprise either an audio content classifier 202 or an audio context classifier 204, or both.

Above have been mentioned different audio types based on different standards (such as for the context types), as well as different audio types on different hierarchical levels (such as for the content types). However, the standards and the hierarchical levels are just for the convenience of description here and are definitely not limiting. In other words, in the present application, any two or more of the audio types mentioned above can be identified by the audio classifier 200 at the same time and be considered by the adjusting unit 300 at the same time, as will be described later. In other words, all the audio types in different hierarchical levels may be parallel, or in the same level.

1.2 Confidence Values of Audio Types and Architecture of Classifiers

The audio classifier 200 may output hard-decision results, or the adjusting unit 300 may regard the results of the audio classifier 200 as hard-decision results. Even for hard decision, multiple audio types can be assigned to an audio segment. For example, an audio segment can be labeled by both 'speech' and 'short-term music' since it may be a mixture signal of speech and short-term music. The obtained labels can be directly used to steer the audio improving device(s) 400. A simple example is to enable the dialog enhancer 402 when speech is present and turn it off when speech is absent. However, this hard decision method may introduce some unnaturalness at the transition points from one audio type to another, if without careful smoothing scheme (which will be discussed later).

In order to have more flexibility and tune the parameters of the audio improving devices in a continuous manner, the confidence value of each target audio type can be estimated (soft decision). A confidence value represents the matched level between the to-be-identified audio content and the target audio type, with values from 0 to 1.

As stated before, many classifying techniques may output confidence values directly. The confidence value can also be calculated from various methods, which may be regarded as a part of the classifier. For example, if the audio models are trained by some probabilistic modeling technologies such as Gaussian Mixture Models (GMM), posterior probability can be used to represent confidence value, as $$p(c_i|x) = \frac{p(x|c_i)}{\sum_{i=1}^{N} p(x|c_i)} \quad (1)$$

where x is a piece of audio segment, c is a target audio type, N is the number of target audio types, $p(x|c_i)$ is the likelihood that the audio segment x is of the audio type $c_i$, and $p(c_i|x)$ is the corresponding posterior probability.

On the other hand, if the audio models are trained from some discriminative methods like Support Vector Machine (SVM) and adaBoost, only scores (real values) are obtained from model comparison. In these cases, a sigmoid function is usually used to map the obtained score (theoretically from $-\infty$ to $\infty$) to the expected confidence (from 0 to 1):

$$conf = \frac{1}{1 + e^{Ay+B}} \quad (2)$$

where the y is the output score from SVM or adaBoost, A and B are two parameters need to be estimated from a training data set by using some well-known technologies.

For some embodiments of the present application, the adjusting unit 300 may use more than two content types and/or more than two context types. Then, the audio content classifier 202 need identify more than two content types and/or the audio context classifier 204 need identify more than two context types. In such a situation, either the audio content classifier 202 or the audio context classifier 204 may be a group of classifiers organized in certain architecture.

Figure 4:
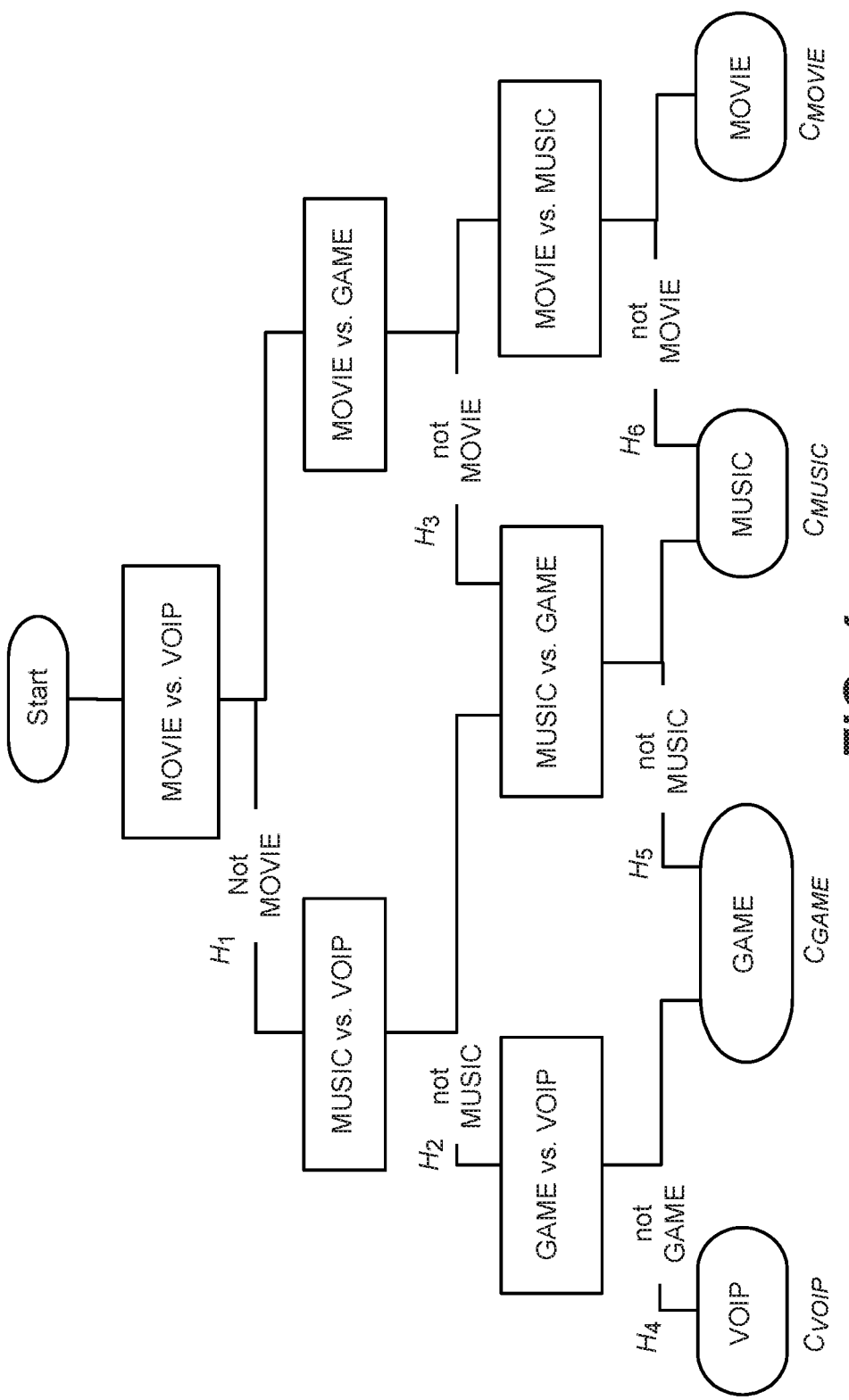
FIGS. 4-6 are diagrams illustrating possible architecture of classifiers for identifying multiple audio types and the calculation of confidence value.
Figure 5:
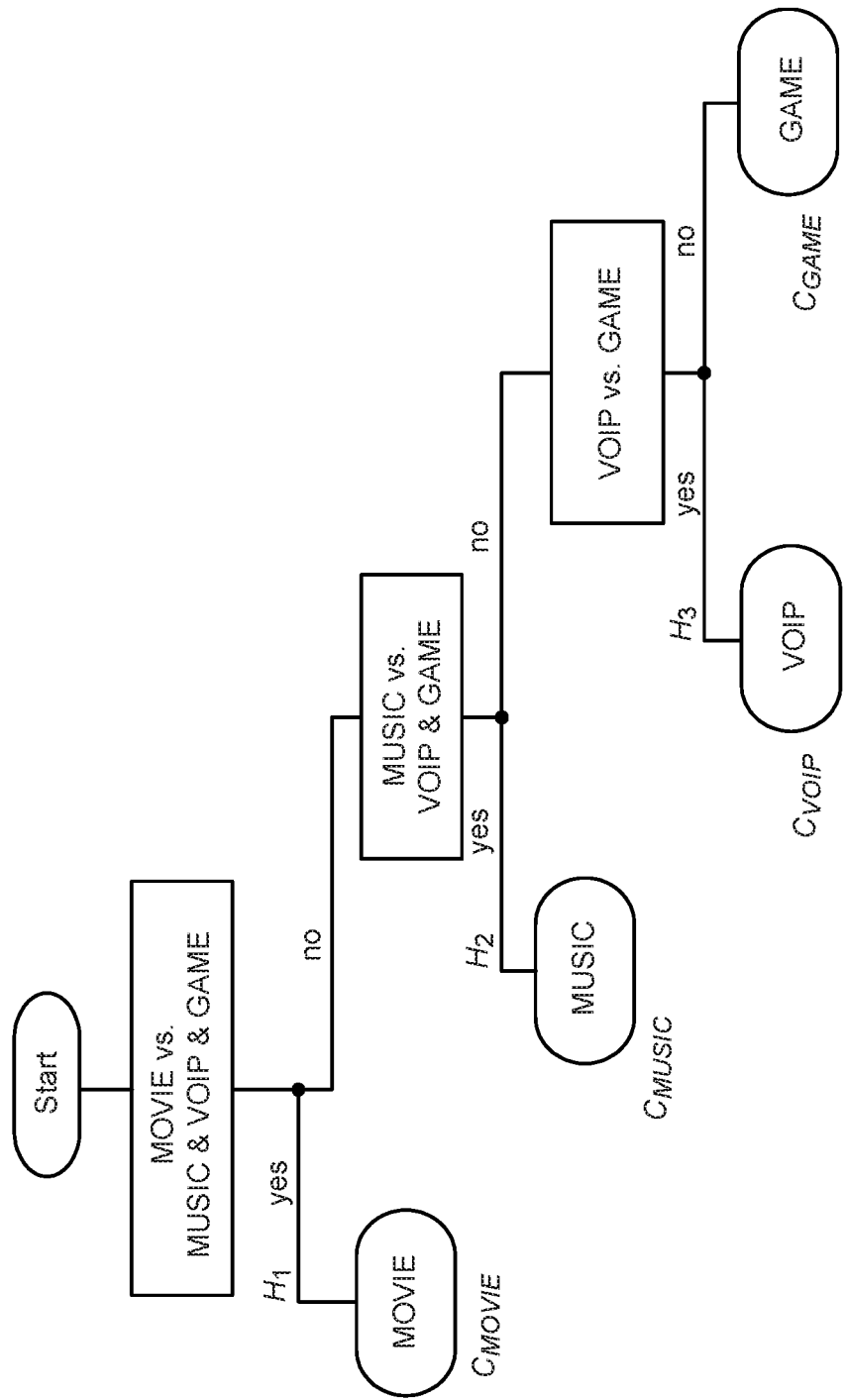
Figure 6:
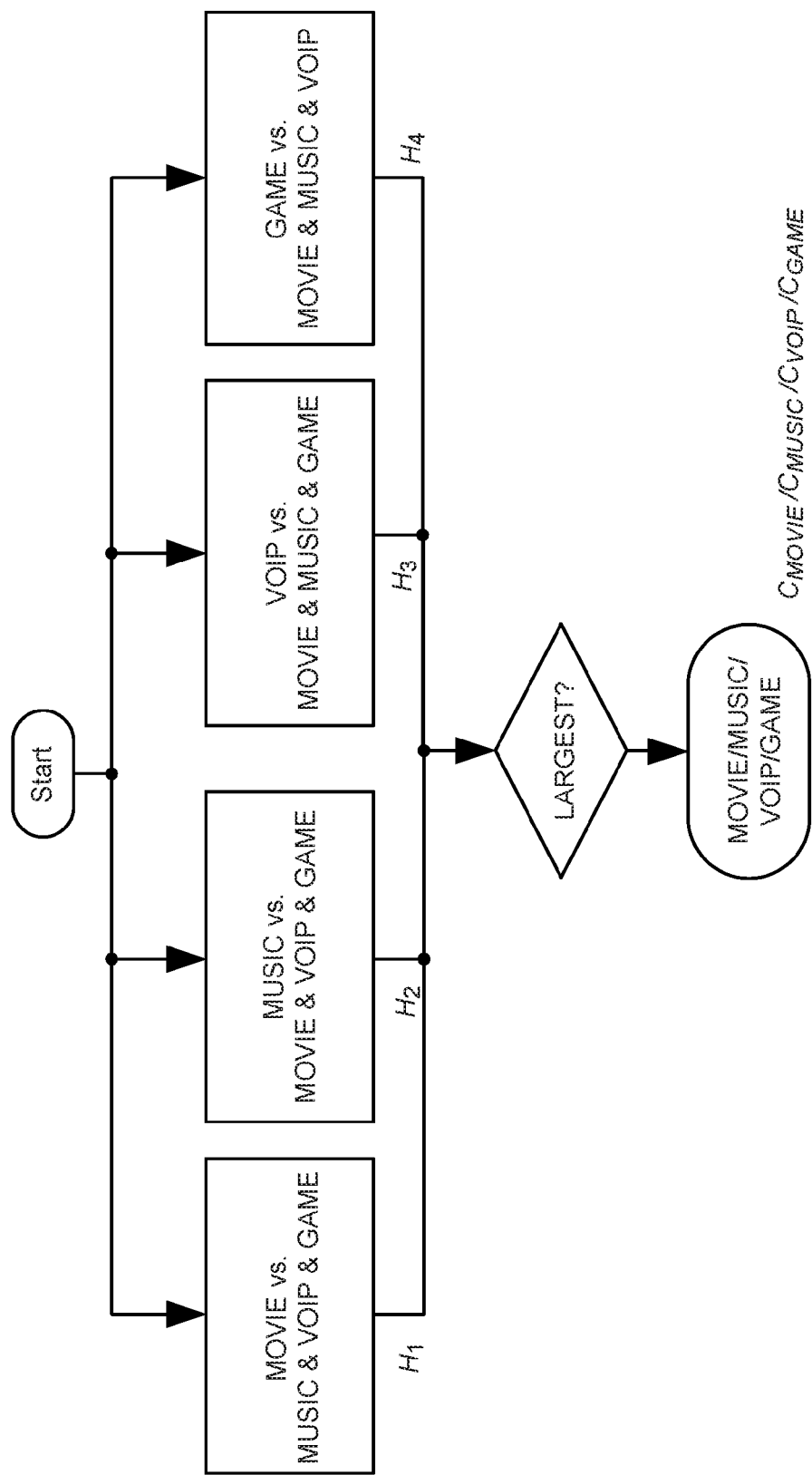

For example, if the adjusting unit 300 needs all the four kinds of context types movie-like media, long-term music, game and VoIP, then the audio context classifier 204 may have the following different architectures:

First, the audio context classifier 204 may comprise 6 one-to-one binary classifiers (each classifier discriminates one target audio type from another target audio type) organized as shown in FIG. 4, 3 one-to-others binary classifiers (each classifier discriminates a target audio type from the others) organized as shown in FIG. 5, and 4 one-to-others classifiers organized as shown in FIG. 6. There are also other architectures such as Decision Directed Acyclic Graph (DDAG) architecture. Note that in FIGS. 4-6 and the corresponding description below, "movie" instead of "movie-like media" is used for conciseness.

Each binary classifier will give a confidence score H(x) for its output (x represents an audio segment). After the outputs of each binary classifier are obtained, we need map them to the final confidence values of the identified context types.

Generally, assuming the audio signal is to be classified into M context types (M is a positive integer). The conventional one-to-one architecture constructs $\mathcal{M}(\mathcal{M}-1)/2$ classifiers where each one is trained on data from two classes, then each one-to-one classifier casts one vote for its preferred class, and the final result is the class with the most votes among the $\mathcal{M}(\mathcal{M}-1)/2$ classifiers' classifications. Comparing to the conventional one-to-one architecture, the hierarchical architecture in FIG. 4 also needs to construct $\mathcal{M}(\mathcal{M}-1)/2$ classifiers. However the testing iterations can be shortened to $\mathcal{M}-1$, as the segment x will be determined to be/not be in the corresponding class at each hierarchy level and the overall level count is $\mathcal{M}-1$. The final confidence values for various context types may be calculated from the binary classification confidence $H_k(x)$, for example (k=1, 2, . . . 6, representing different context types):

$$C_{MOVIE}=(1-H_1(x))\cdot(1-H_3(x))\cdot(1-H_6(x))$$

$$C_{VOIP}=H_1(x)\cdot H_2(x)\cdot H_4(x)$$

$$C_{MUSIC}=H_1(x)\cdot(1-H_2(x))\cdot(1-H_5(x))+H_3(x)\cdot(1-H_1(x))\cdot(1-H_5(x))+H_6(x)\cdot(1-H_1(x))\cdot(1-H_3(x))$$

$$C_{GAME}=H_1(x)\cdot H_2(x)\cdot(1-H_4(x))+H_1(x)\cdot H_5(x)\cdot(1-H_2(x))+H_3(x)\cdot H_5(x)\cdot(1-H_1(x))$$

In the architecture shown in FIG. 5, the mapping function from the binary classification results $H_k(x)$ to the final confidence values can be defined as the following example:

$$C_{MOVIE}=H_1(x)$$

$$C_{MUSIC}=H_2(x)\cdot(1-H_1(x))$$

$$C_{VOIP}=H_3(x)\cdot(1-H_2(x))\cdot(1-H_1(x))$$

$$C_{GAME}=(1-H_3(x))\cdot(1-H_2(x))\cdot(1-H_1(x))$$

In the architecture illustrated in FIG. 6, the final confidence values can be equal to the corresponding binary classification results $H_k(x)$, or if the sum of the confidence values for all classes is required to be 1, then the final confidence values can be simply normalized based on the estimated $H_k(x)$:

$$C_{MOVIE}=H_1(x)/(H_1(x)+H_2(x)+H_3(x)+H_4(x))$$

$$C_{MUSIC}=H_2(x)/(H_1(x)+H_2(x)+H_3(x)+H_4(x))$$

$$C_{VOIP}=H_3(x)/(H_1(x)+H_2(x)+H_3(x)+H_4(x))$$

$$C_{GAME}=H_4(x)/(H_1(x)+H_2(x)+H_3(x)+H_4(x))$$

The one or more with the maximum confidence values can be determined to be the final identified class.

It should be noted that in the architectures shown in FIGS. 4-6, the sequence of different binary classifiers are not necessarily as shown, but may be other sequences, which may be selected by manual assigning or automatic learning according to different requirements of various applications.

The descriptions above are directed to audio context classifiers 204. For the audio content classifier 202, the situation is similar.

Alternatively, either the audio content classifier 202 or the audio context classifier 204 may be implemented as one single classifier identifying all the content types/context types at the same time, and give the corresponding confidence values at the same time. There are many existing techniques for doing this.

Using the confidence value, the output of the audio classifier 200 can be represented as a vector, with each dimension representing the confidence value of each target audio type. For example, if the target audio types are (speech, short-term music, noise, background) sequentially, an example output result could be (0.9, 0.5, 0.0, 0.0), indicating that it is 90% sure the audio content is speech, and 50% sure the audio is music. It is noted that the sum of all the dimensions in the output vector is not necessary to be one (for example, the results from FIG. 6 are not necessary normalized), meaning that the audio signal may be a mixture signal of speech and short-term music.

Later in Part 6 and Part 7, a novel implementation of the audio context classification and the audio content classification will be discussed in detail.

1.3 Smoothing of Confidence Values of Audio Types

Optionally, after each audio segment has been classified into the predefined audio types, an additional step is to smooth the classification results along time line to avoid abrupt jump from one type to another and to make more smooth estimation of the parameters in the audio improving devices. For example, a long excerpt is classified as movie-like media except for only one segment classified as VoIP, then the abrupt VoIP decision can be revised to movie-like media by smoothing.

Figure 7:
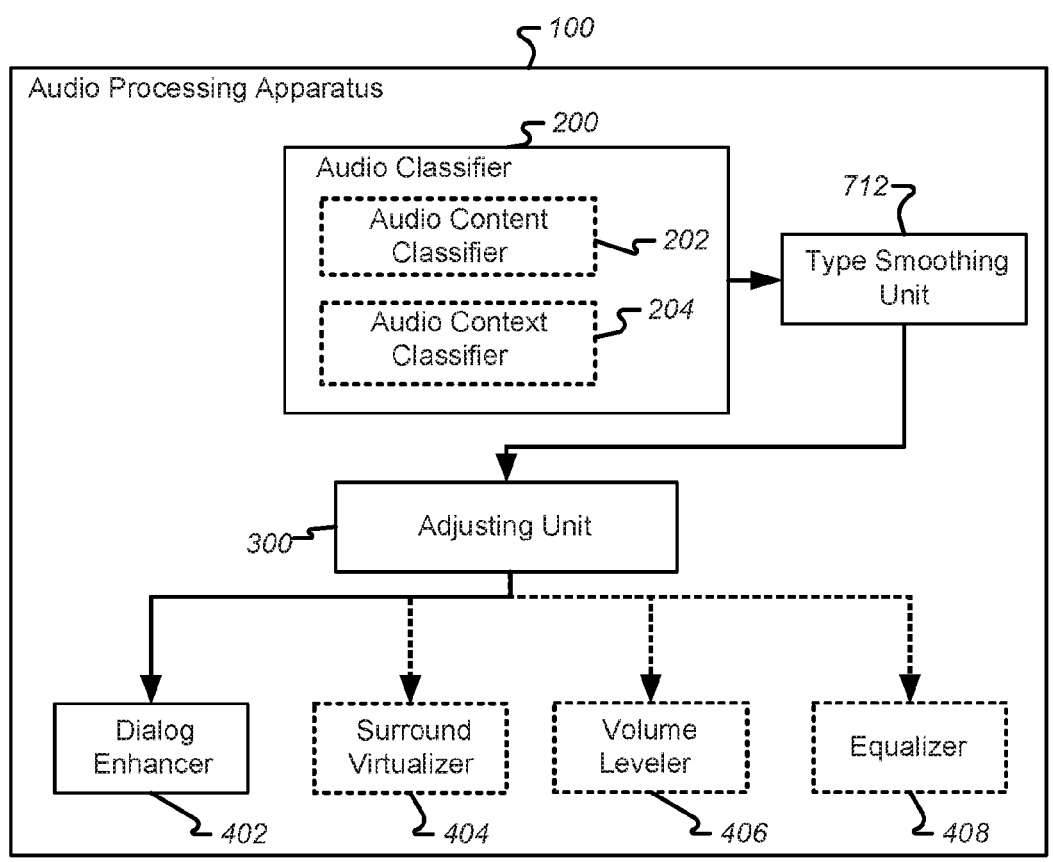
FIGS. 7-9 are diagrams illustrating more embodiments of the audio processing apparatus of the present application.

Therefore, in a variant of the embodiment as shown in FIG. 7, a type smoothing unit 712 is further provided for, for each audio type, smoothing the confidence value of the audio signal at the present time.

A common smoothing method is based on weighted average, such as calculates a weighted sum of the actual confidence value at the present and a smoothed confidence value of the last time, as follows:

$$\text{smoothConf}(t)=\beta\cdot\text{smoothConf}(t-1)+(1-\beta)\text{conf}(t) \quad (3)$$

where t represents the present time (the present audio segment), t−1 represents the last time (the last audio segment), β is the weight, conf and smoothConf are the confidence values before and after smoothing, respectively.

From the confidence values' point of view, the results from hard decision of the classifiers can be also represented with confidence values, with the values being either 0 or 1. That is, if a target audio type is chosen and assigned to an audio segment, the corresponding confidence is 1; otherwise, the confidence is 0. Therefore, even if the audio classifier 200 does not give the confidence value but just gives a hard decision regarding the audio type, continuous adjustment of the adjusting unit 300 is still possible through the smoothing operation of the type smoothing unit 712.

The smoothing algorithm can be 'asymmetric', by using different smoothing weight for different cases. For example, the weights for calculating the weighted sum may be adaptively changed based on confidence value of the audio type of the audio signal. The confidence value of the present segment is larger, is larger its weight.

From another point of view, the weights for calculating the weighted sum may be adaptively changed based on different transition pairs from one audio type to another audio type, especially when the audio improving device(s) is adjusted based on multiple content types as identified by the audio classifier 200, instead of based on the presence or absence of one single content type. For example, for a transition from an audio type more frequently appearing in certain context to another audio type not so frequently appearing in the context, the confidence value of the latter may be smoothed so that it will not increase so fast, because it might just be an occasional interruption.

Another factor is the changing (increasing or decreasing) trend, including the changing rate. Suppose we care more about the latency when an audio type becomes present (that is, when its confidence value increases), we can design the smoothing algorithm in the following way:

$$\text{smoothConf}(t) = \begin{cases} \text{conf}(t) & \text{conf}(t) \geq \text{smoothConf}(t-1) \\ \beta\cdot\text{smoothConf}(t-1) + \\ (1-\beta)\cdot\text{conf}(t) & \text{otherwise} \end{cases} \quad (4)$$

The above formula allows the smoothed confidence value quickly responds to the current state when confidence value increases and slowly smooth away when confidence value decreases. Variants of the smoothing functions can be easily designed in the similar way. For example, the formula (4) may be revised so that the weight of conf(t) becomes larger when conf(t)>=smoothConf(t−1). In fact, in formula (4), it can be regarded that β=0 and the weight of conf(t) becomes the largest, that is 1.

From a different point of view, considering the changing trend of certain audio type is just a specific example of considering different transition pairs of audio types. For example, increasing of the confidence value of type A may be regarded as transition from non-A to A, and decreasing of the confidence value of type A may be regarded as transition of A to non-A.

1.4 Parameter Adjusting

The adjusting unit 300 is designed to estimate or adjust proper parameters for the audio improving device(s) 400 based on the obtained results from the audio classifier 200. Different adjusting algorithms may be designed for different audio improving devices, by using either the content type or context type, or both for a joint decision. For example, with context type information such as movie-like media and long-term music, the presets as mentioned before can be automatically selected and applied on the corresponding content. With the content type information available, the parameters of each audio improving device can be tuned in a finer manner, as shown in the subsequent parts. The content type information and the context information can be further jointly used in the adjusting unit 300 to balance the long-term and short-term information. The specific adjusting algorithm for a specific audio improving device may be regarded as a separate adjusting unit, or the different adjusting algorithms may be collectively regarded as a united adjusting unit.

That is, the adjusting unit 300 may be configured to adjust the at least one parameter of the audio improving device based on the confidence value of at least one content type and/or the confidence value of at least one context type. For a specific audio improving device, some of the audio types are informative, and some of the audio types are interfering. Accordingly, the parameters of the specific audio improving device may be either positively or negatively correlate to the confidence value(s) of the informative audio type(s) or the interfering audio type(s). Here, "positively correlate" means the parameter increases or decreases with the increasing or decreasing of the confidence value of the audio type, in a linear manner or in a non-linear manner. "Negatively correlate" means the parameter increases or decreases with, respectively, the decreasing or increasing of the confidence value of the audio type, in a linear manner or in a non-linear manner.

Here, the decreasing and increasing of the confidence value are directly "transferred" to the parameters to be adjusted by the positive or negative correlation. In mathematics, such correlation or "transfer" may be embodied as linear proportion or inverse proportion, plus or minus (addition or subtraction) operation, multiplying or dividing operation or non-linear function. All these forms of correlation may be referred to as "transfer function". To determine increasing or decreasing of the confidence value, we can also compare the present confidence value or its mathematical transform with the last confidence value or a plurality of history confidence values, or their mathematical transforms. In the context of the present application, the term "compare" means either comparison through subtraction operation or comparison through division operation. We can determine an increase or decrease by determining whether the difference is greater than 0 or whether the ratio is greater than 1.

In specific implementations, we can directly relate the parameters with the confidence values or their ratios or differences through proper algorithm (such as transfer function) and it is not necessary for an "external observer" to know explicitly whether a specific confidence value and/or a specific parameter has increased or decreased. Some specific examples will be given in subsequent Parts 2-5 about specific audio improving devices.

As stated in the previous section, with respect to the same audio segment, the classifier 200 may identify multiple audio types with respective confidence values, which confidence values may not necessarily amount to 1, since the audio segment may comprise multiple components at the same time, such as music and speech and background sounds. In such a situation, the parameters of the audio improving devices shall be balanced between different audio types. For example, the adjusting unit 300 may be configured to consider at least some of the multiple audio types through weighting the confidence values of the at least one audio type based on the importance of the at least one audio type. More important is a specific audio type, more is the parameters influenced thereby.

The weight can also reflect informative and interfering effect of the audio type. For example, for an interfering audio type, a minus weight may be given. Some specific examples will be given in the subsequent Parts 2-5 about specific audio improving devices.

Please note in the context of the present application, "weight" has a broader meaning than coefficients in a multinomial. Besides the coefficients in a multinomial, it can also take the form of exponent or power. When being the coefficients in a multinomial, the weighting coefficients may be or may be not normalized. In brief, the weight just represents how much influence the weighted object has upon the parameter to be adjusted.

In some other embodiments, for the multiple audio types contained in the same audio segment, the confidence values thereof may be converted to weights through being normalized, then the final parameter may be determined through calculating a sum of parameter preset values predefined for each audio type and weighted by the weights based on the confidence values. That is, the adjusting unit 300 may be configured to consider the multiple audio types through weighting the effects of the multiple audio types based on the confidence values.

As a specific example of weighting, the adjusting unit is configured to consider at least one dominant audio type based on the confidence values. For those audio types having too low confidence values (less than a threshold), they may not be considered. This is equivalent to that the weights of the other audio types the confidence values of which are less than the threshold are set as zero. Some specific examples will be given in the subsequent Parts 2-5 about specific audio improving devices.

The content type and the context type can be considered together. In one embodiment, they can be regarded as on the same level and their confidence values may have respective weights. In another embodiment, just as the nomination shows, the "context type" is the context or environment where the "content type" is located, and thus the adjusting unit 200 may be configured so that the content type in an audio signal of a different context type is assigned a different weight depending on the context type of the audio signal. Generally speaking, any audio type can constitute a context of another audio type, and thus the adjusting unit 200 may be configured to modify the weight of one audio type with the confidence value of another audio type. Some specific examples will be given in the subsequent Parts 2-5 about specific audio improving devices.

In the context of the present application, "parameter" has a broader meaning than its literal meaning. Besides a parameter having one single value, it may also means a preset as mentioned before, including a set of different parameters, a vector comprised of different parameters, or a profile. Specifically, in the subsequent Parts 2-5 the following parameters will be discussed but the present application is not limited thereto: the level of dialog enhancement, the thresholds for determining frequency bands to be dialog-enhanced, the background level, the surround boost amount, the start frequency for the surround virtualizer, the dynamic gain or the range of the dynamic gain of a volume leveler, the parameters indicating the degree of the audio signal being a new perceptible audio event, the equalization level, equalization profiles and spectral balance presets.

1.5 Parameter Smoothing

In Section 1.3, we have discussed smoothing the confidence value of an audio type to avoid its abrupt change, and thus avoid abrupt change of the parameters of the audio improving device(s). Other measures are also possible. One is to smooth the parameter adjusted based on the audio type, and will be discussed in this section; the other is to configure the audio classifier and/or the adjusting unit to delay the change of the results of the audio classifier, and this will be discussed in Section 1.6.

In one embodiment, the parameter can be further smoothed to avoid rapid change which may introduce audible artifacts at transition points, as $$\tilde{L}(t) = \tau \tilde{L}(t-1) + (1-\tau)L(t) \quad (3')$$

where $\tilde{L}(t)$ is the smoothed parameter, L(t) is the non-smoothed parameter $\tau$ is a coefficient representing a time constant, t is the present time and t−1 is the last time.

Figure 8:
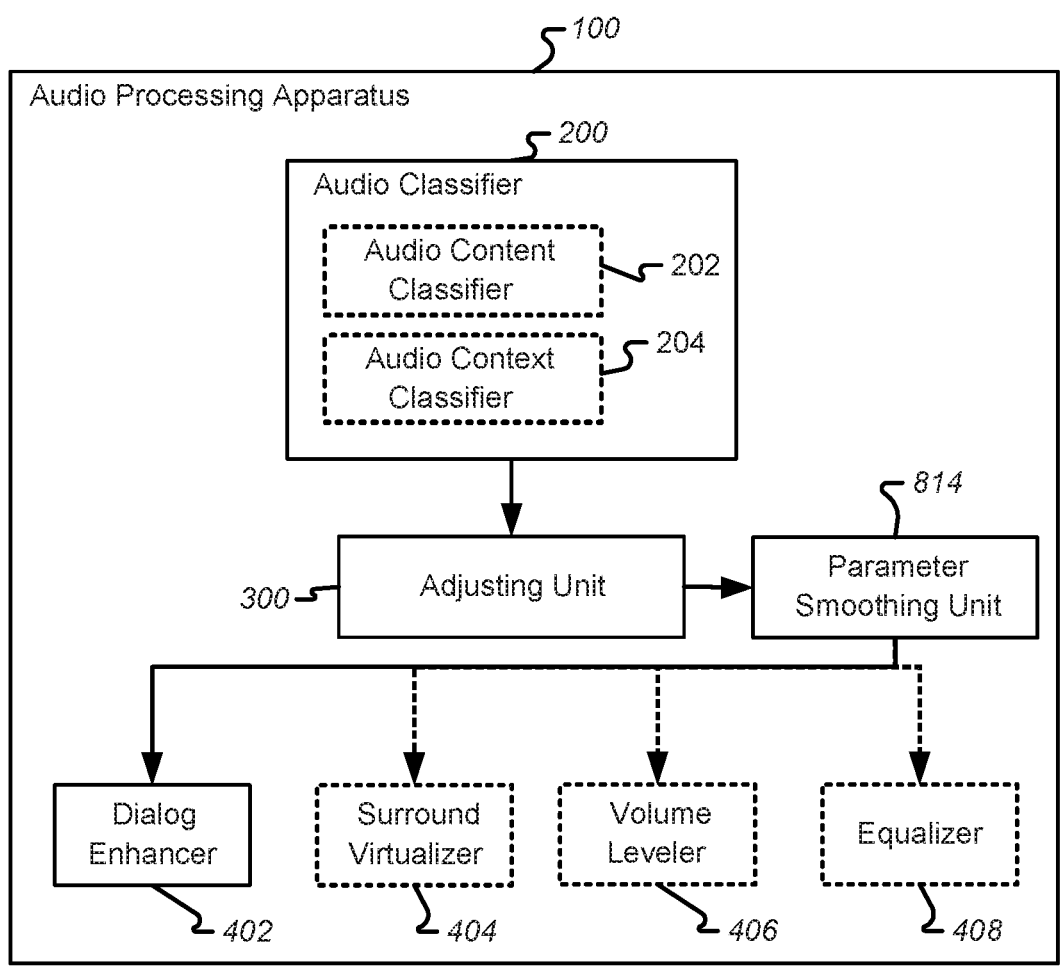

That is, as shown in FIG. 8 the audio processing apparatus may comprise a parameter smoothing unit 814 for, for a parameter of the audio improving device (such as at least one of the dialog enhancer 402, the surround virtualizer 404, the volume leveler 406 and the equalizer 408) adjusted by the adjusting unit 300, smoothing the parameter value determined by the adjusting unit 300 at the present time by calculating a weighted sum of the parameter value determined by the adjusting unit at the present time and a smoothed parameter value of the last time.

The time constant $\tau$ can be a fixed value based on the specific requirement of an application and/or the implementation of the audio improving device 400. It could be also adaptively changed based on the audio type, especially based on the different transition types from one audio type to another, such as from music to speech, and from speech to music.

Take equalizer as an example (further details may be referred to in Part 5). Equalization is good to apply on music content but not on speech content. Thus, for smoothing the level of equalization, the time constant can be relatively small when the audio signal transits from music to speech, so that a smaller equalization level can be applied on speech content more quickly. On the other hand, the time constant for the transition from speech to music can be relatively large in order to avoid the audible artifacts at the transition points.

To estimate the transition type (e.g., from speech to music or from music to speech), the content classification results can be used directly. That is, classifying the audio content into either music or speech makes it straightforward to get the transition type. To estimate the transition in a more continuous manner, we can also rely on the estimated unsmoothed equalization level, instead of directly comparing the hard decisions of the audio types. The general idea is, if the unsmoothed equalization level is increasing, it indicates a transition from speech to music (or more music like); otherwise, it is more like a transition from music to speech (or more speech like). By differentiating different transition types, the time constant can be set correspondingly, one example is:

$$\tau(t) = \begin{cases} \tau_1 & L(t) \geq L(t-1) \\ \tau_2 & L(t) < L(t-1) \end{cases} \quad (4')$$

where $\tau(t)$ is the time-variant time constant depending on the content, $\tau_1$ and $\tau_2$ are two preset time constant values, usually satisfying $\tau_1 > \tau_2$. Intuitively, the above function indicates a relatively slow transition when the equalization level is increasing, and a relatively fast transition when equalization level is decreasing, but the present application is not limited thereto. Further, the parameter is not limited to the equalization level, but may be other parameters. That is, the parameter smoothing unit 814 may be configured so that the weights for calculating the weighted sum are adaptively changed based on an increasing or decreasing trend of the parameter value determined by the adjusting unit 300.

1.6 Transition of Audio Types

Figure 9:
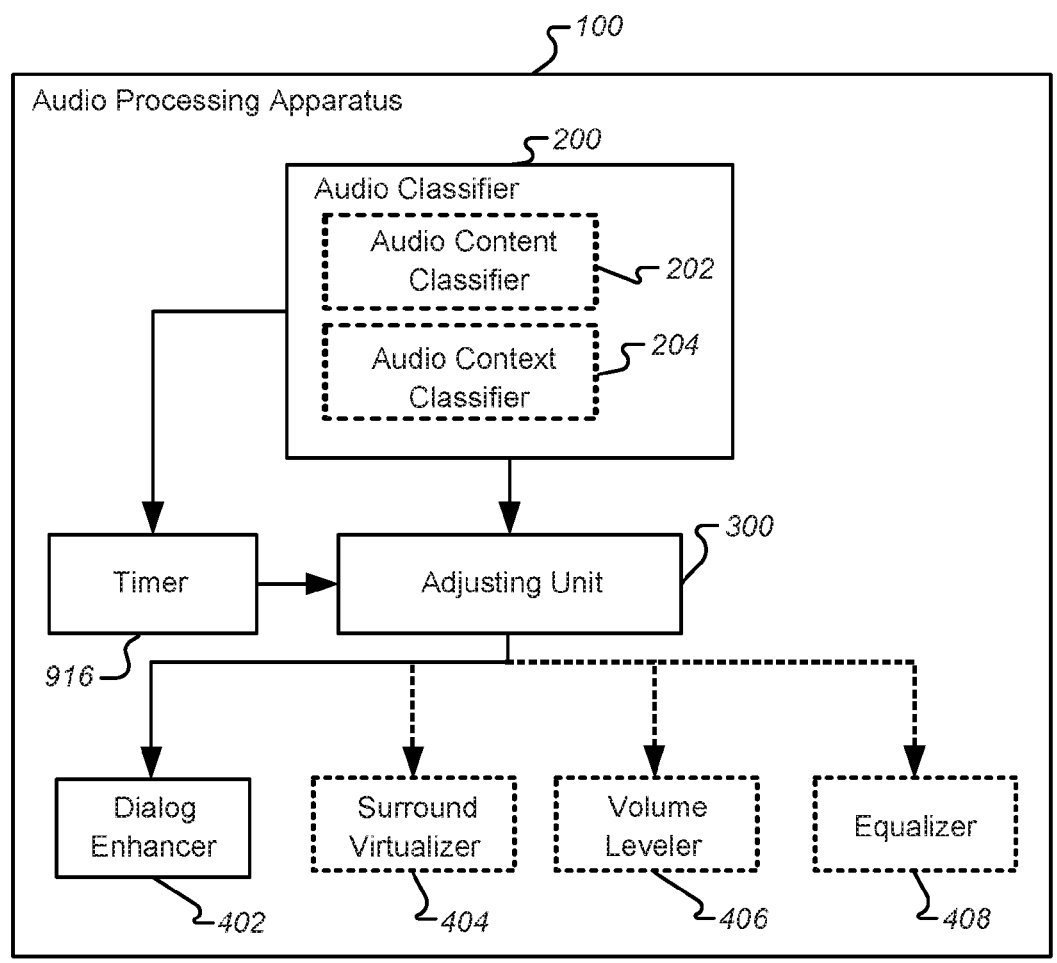
Figure 10:
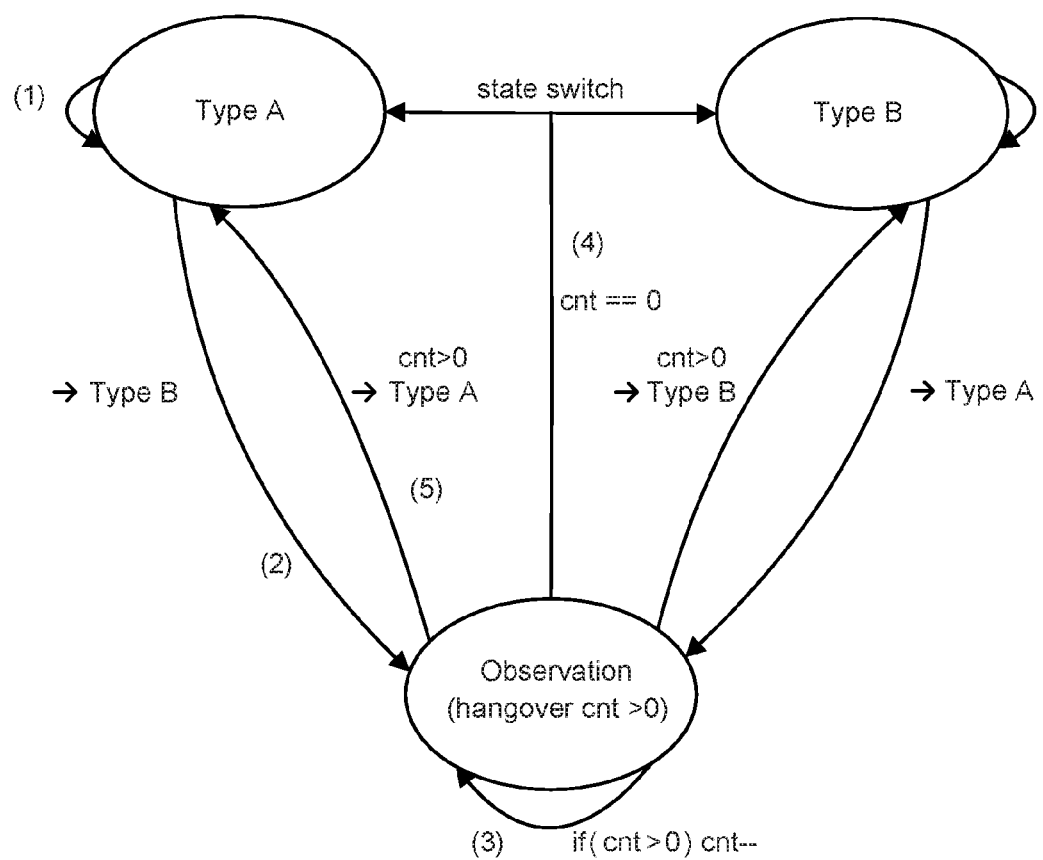
FIG. 10 is a diagram illustrating delay of transition between different audio types.

With reference to FIGS. 9 and 10 will be described another scheme for avoiding abrupt change of audio type, and thus avoiding abrupt change of the parameters of the audio improving device(s).

As shown in FIG. 9, the audio processing apparatus 100 may further comprise a timer 916 for measuring the lasting time during which the audio classifier 200 continuously outputs the same new audio type, wherein the adjusting unit 300 may be configured to continue to use the present audio type until the length of the lasting time of the new audio type reaches a threshold.

In other words, an observation (or sustaining) phase is introduced, as illustrated in FIG. 10. With the observation phase (corresponding to the threshold of the length of the lasting time), the change of audio type is further monitored for a consecutive amount of time to confirm if the audio type has really changed, before the adjusting unit 300 really uses the new audio type.

As shown in FIG. 10, the arrow (1) illustrates the situation where the current state is type A and the result of the audio classifier 200 does not change.

If the current state is type A and the result of the audio classifier 200 becomes type B, then the timer 916 starts timing, or, as shown in FIG. 10, the process enters an observation phase (the arrow (2)), and an initial value of the hangover count cnt is set, indicating the amount of observation duration (equal to the threshold).

Then, if the audio classifier 200 continuously output type B, then cnt continuously decreases (the arrow (3)) until cnt is equal to 0 (that is, the length of the lasting time of the new type B reaches the threshold), then the adjusting unit 300 may use the new audio type B (the arrow (4)), or in other words, only up to now may the audio type be regarded having really changed to the type B.

Otherwise, if before the cnt becomes zero (before the length of the lasting time reaches the threshold) the output of the audio classifier 200 becomes back to the old type A, then the observation phase is terminated and the adjusting unit 300 still uses the old type A (the arrow (5)).

The change from type B to type A may be similar to the process described above.

In the above process, the threshold (or the hangover count) may be set based on the application requirement. It can be a predefined fixed value. It can be also adaptively set. In one variant, the threshold is different for different transition pairs from one audio type to another audio type. For example, when changing from type A to type B, the threshold may be a first value; and when changing from type B to type A, the threshold may be a second value.

In another variant, the hangover count (threshold) may be negatively correlated with the confidence value of the new audio type. The general idea is, if the confidence shows confusing between two types (e.g., when the confidence value is only around 0.5), the observation duration needs to be long; otherwise, the duration can be relatively short. Following this guideline, an example hangover count can be set by the following formula, $$\text{HangCnt} = C \cdot |0.5 - \text{Conf}| + D$$

where HangCnt is the hangover duration or the threshold, C and D are two parameters that can be set based on the application requirement, usually C is negative while D is a positive value.

Incidentally, the timer 916 (and thus the transition process described above) has been described above as a part of the audio processing apparatus but outside of the audio classifier 200. In some other embodiments, it may be regarded as a part of the audio classifier 200, just as described in Section 7.3.

1.7 Combination of Embodiments and Application Scenarios

All the embodiments and variants there of discussed above may be implemented in any combination thereof, and any components mentioned in different parts/embodiments but having the same or similar functions may be implemented as the same or separate components.

Specifically, when describing the embodiments and their variations hereinbefore, those components having reference signs similar to those already described in previous embodiments or variants are omitted, and just different components are described. In fact, these different components can either be combined with the components of other embodiments or variants, or constitute separate solutions alone. For example, any two or more of the solutions described with reference to FIGS. 1 to 10 may be combined with each other. As the most complete solution, the audio processing apparatus may comprise both the audio content classifier 202 and the audio context classifier 204, as well as the type smoothing unit 712, the parameter smoothing unit 814 and the timer 916.

As mentioned before, the audio improving devices 400 may include the dialog enhancer 402, the surround virtualizer 404, the volume leveler 406 and the equalizer 408. The audio processing apparatus 100 may include any one or more of them, with the adjusting unit 300 adapted to them. When involving multiple audio improving devices 400, the adjusting unit 300 may be regarded as including multiple sub-units 300A to 300D (FIGS. 15, 18, 20 and 22) specific to respective audio improving devices 400, or still be regarded as one united adjusting unit. When specific to an audio improving device, the adjusting unit 300 together with the audio classifier 200, as well as other possible components, may be regarded as the controller of the specific audio improving device, which will be discussed in detail in subsequent Parts 2-5.

In addition, the audio improving devices 400 are not limited to the examples as mentioned and may include any other audio improving device.

Further, any solutions already discussed or any combinations thereof may be further combined with any embodiment described or implied in the other parts of this disclosure. Especially, the embodiments of the audio classifiers as will be discussed in Parts 6 and 7 may be used in the audio processing apparatus.

1.8 Audio Processing Method

In the process of describing the audio processing apparatus in the embodiments hereinbefore, apparently disclosed are also some processes or methods. Hereinafter a summary of these methods is given without repeating some of the details already discussed hereinbefore, but it shall be noted that although the methods are disclosed in the process of describing the audio processing apparatus, the methods do not necessarily adopt those components as described or are not necessarily executed by those components. For example, the embodiments of the audio processing apparatus may be realized partially or completely with hardware and/or firmware, while it is possible that the audio processing method discussed below may be realized totally by a computer-executable program, although the methods may also adopt the hardware and/or firmware of the audio processing apparatus.

The methods will be described below with reference to FIGS. 11-14. Please note that in correspondence to the streaming property of the audio signal, the various operations are repeated when the method is implemented in real time, and different operations are not necessarily with respect to the same audio segment.

Figure 11:
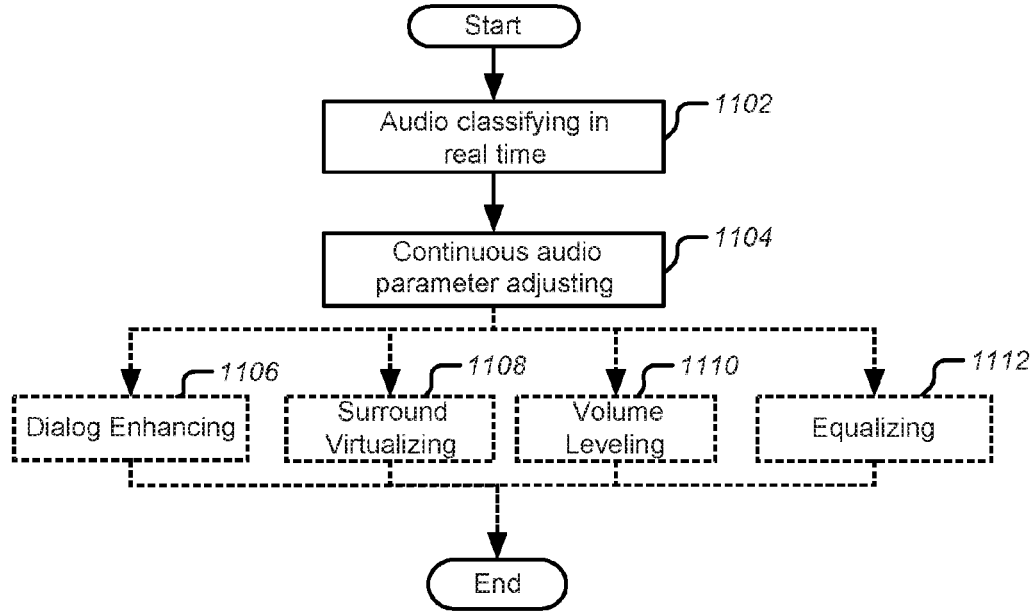
FIGS. 11-14 are flow charts illustrating an audio processing method according to embodiments of the present application.

In an embodiment as shown in FIG. 11, an audio processing method is provided. First, the audio signal to be processed is classified into at least one audio type in real time (operation 1102). Based on the confidence value of the at least one audio type, at least one parameter for audio improvement can be continuously adjusted (operation 1104). The audio improvement may be dialog enhancing (operation 1106), surround virtualizing (operation 1108), volume leveling (1110) and/or equalizing (operation 1112). Correspondingly, the at least one parameter may comprise at least one parameter for at least one of dialog enhancement processing, surround virtualizing processing, volume leveling processing and equalizing processing.

Here, "in real time" and "continuously" means the audio type, and thus the parameter will change in real time with the specific content of the audio signal, and "continuously" also means the adjustment is a continuous adjustment based on the confidence value, rather than abrupt or discrete adjustment.

The audio type may comprise content type and/or context type. Correspondingly, the operation 1104 of adjusting may be configured to adjust the at least one parameter based on the confidence value of at least one content type and the confidence value of at least one context type. The content type may further comprise at least one of content types of short-term music, speech, background sound and noise. The context type may further comprise at least one of context types of long-term music, movie-like media, game and VoIP.

Some other context type schemes are also proposed, like VoIP related context types including VoIP and non-VoIP, and audio quality types including high-quality audio or low-quality audio.

The short-term music may be further classified into sub-types according to different standards. Depending on the presence of dominant source, it may comprise music without dominant sources and music with dominant sources. In addition, the short-term music may comprise at least one genre-based cluster or at least one instrument-based cluster or at least one music cluster classified based on rhythm, tempo, timbre of music and/or any other musical attributes.

When both content types and the context types are identified, the importance of a content type may be determined by the context type where the content type is located. That is, the content type in an audio signal of a different context type is assigned a different weight depending on the context type of the audio signal. More generally, one audio type may influence or may be premise of another audio type. Therefore, the operation of adjusting 1104 may be configured to modify the weight of one audio type with the confidence value of another audio type.

When an audio signal is classified into multiple audio types at the same time (that is with respect to the same audio segment), the operation of adjusting 1104 may consider some or all of the identified audio types for adjusting the parameter(s) for improving that audio segment. For example, the operation of adjusting 1104 may be configured to weight the confidence values of the at least one audio type based on the importance of the at least one audio type. Or, the operation of adjusting 1104 may be configured to consider at least some of the audio types through weighting them based on their confidence values. In a special case, the operation of adjusting 1104 may be configured to consider at least one dominant audio type based on the confidence values.

For avoiding abrupt changes of results, smoothing schemes may be introduced.

Figures 12, 13:
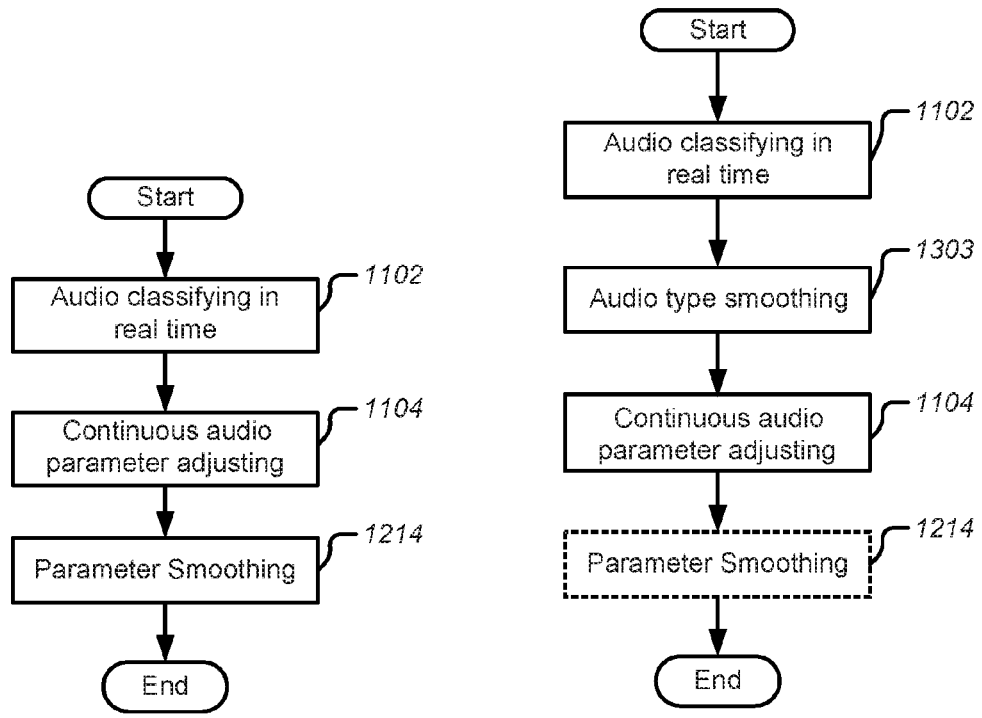
Figure 14:
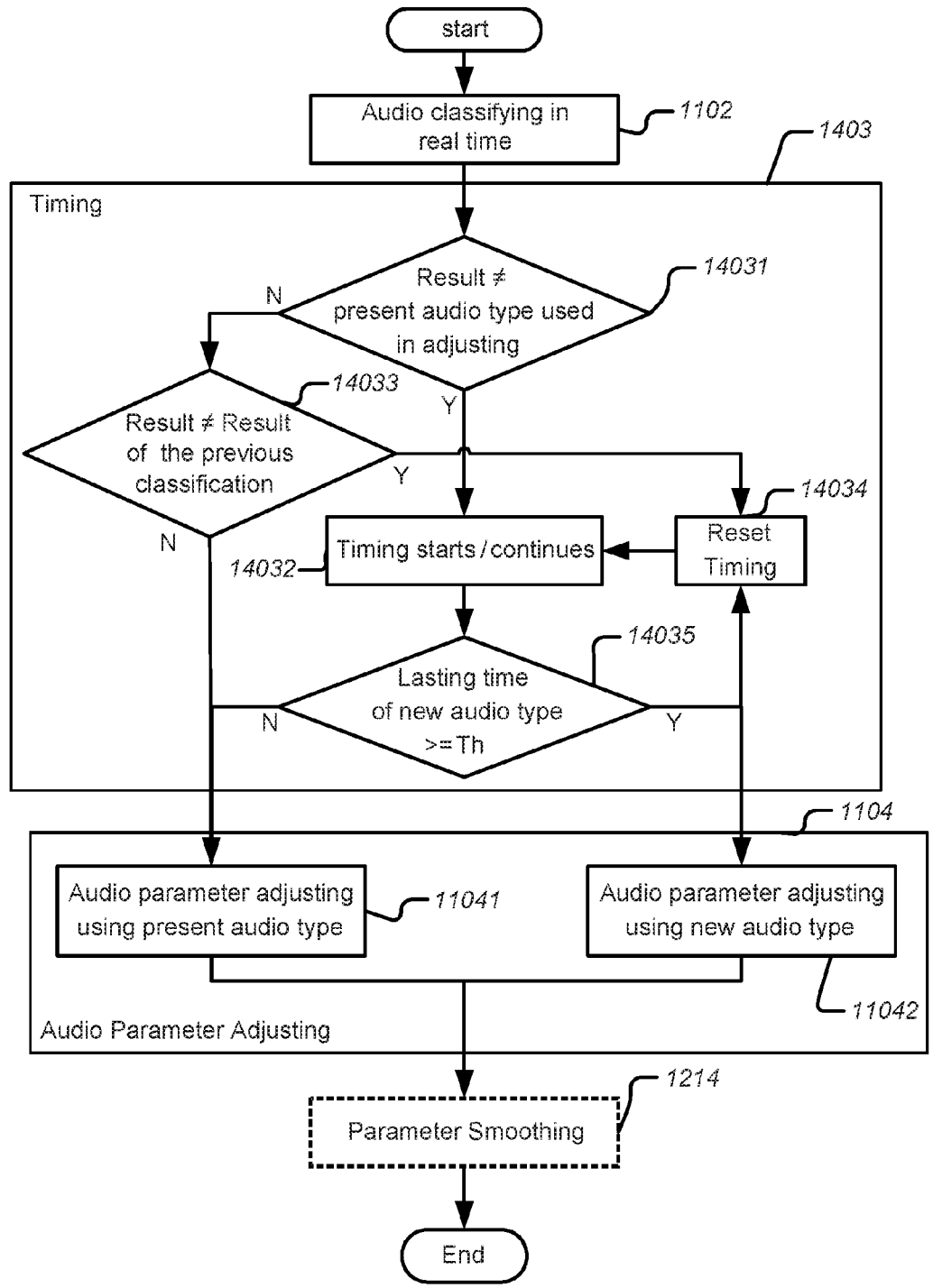

The adjusted parameter value may be smoothed (operation 1214 in FIG. 12). For example, the parameter value determined by the operation of adjusting 1104 at the present time may be replaced with a weighted sum of the parameter value determined by the operation of adjusting at the present time and a smoothed parameter value of the last time. Thus, through the iterated smoothing operation, the parameter value is smoothed on the time line.

The weights for calculating the weighted sum may be adaptively changed based on the audio type of the audio signal, or based on different transition pairs from one audio type to another audio type. Alternatively, the weights for calculating the weighted sum are adaptively changed based on an increasing or decreasing trend of the parameter value determined by the operation of adjusting.

Another smoothing scheme is shown in FIG. 13. That is, the method may further comprise, for each audio type, smoothing the confidence value of the audio signal at the present time by calculating a weighted sum of the actual confidence value at the present and a smoothed confidence value of the last time (operation 1303). Similarly to the parameter smoothing operation 1214, the weights for calculating the weighted sum may be adaptively changed based on confidence value of the audio type of the audio signal, or based on different transition pairs from one audio type to another audio type.

Another smoothing scheme is a buffer mechanism for delaying the transition from one audio type to another audio type even if the output of the audio classifying operation 1102 changes. That is, the operation of adjusting 1104 do not use the new audio type immediately but wait for the stabilization of the output of the audio classifying operation 1102.

Specifically, the method may comprise measuring the lasting time during which the classifying operation continuously outputs the same new audio type (operation 1403 in FIG. 14), wherein the operation of adjusting 1104 is configured to continue to use the present audio type ("N" in operation 14035 and operation 11041) until the length of the lasting time of the new audio type reaches a threshold ("Y" in operation 14035 and operation 11042). Specifically, when the audio type output from the audio classifying operation 1102 changes with respect to the present audio type used in the audio parameter adjusting operation 1104("Y" in operation 14031), then the timing starts (operation 14032). If the audio classifying operation 1102 continues to output the new audio type, that is, if the judgment in operation 14031 continues to be "Y", then the timing continues (operation 14032). Finally when the lasting time of the new audio type reaches a threshold ("Y" in operation 14035), the adjusting operation 1104 uses the new audio type (operation 11042), and the timing is reset (operation 14034) for preparing for the next switch of the audio type. Before reaching the threshold ("N" in operation 14035), the adjusting operation 1104 continues to use the present audio type (operation 11041).

Here the timing may be implemented with the mechanism of a timer (counting up or counting down). If after the timing starts but before reaching the threshold, the output of the audio classifying operation 1102 becomes back to the present audio type used in the adjusting operation 1104, it should be regarded that there is no change ("N" in operation 14031) with respect to the present audio type used by the adjusting operation 1104. But the present classification result (corresponding to the present audio segment to be classified in the audio signal) changes with respect to the previous output (corresponding to the previous audio segment to be classified in the audio signal) of the audio classifying operation 1102 ("Y" in operation 14033), thus the timing is reset (operation 14034), until the next change ("Y" in operation 14031) starts the timing. Of course, if the classification result of the audio classifying operation 1102 does not change with respect to the present audio type used by the audio parameter adjusting operation 1104 ("N" in operation 14031), nor changes with respect to the previous classification ("N" in operation 14033), it shows the audio classification is in a stable state and the present audio type continues to be used.

The threshold used here may also be different for different transition pairs from one audio type to another audio type, because when the state is not so stable, generally we may prefer the audio improving device is in its default conditions rather than others. On the other hand, if the confidence value of the new audio type is relatively high, it is safer to transit to the new audio type. Therefore, the threshold may be negatively correlated with the confidence value of the new audio type. Higher is the confidence value, lower is the threshold, meaning the audio type may transit to the new one faster.

Similar to the embodiments of the audio processing apparatus, any combination of the embodiments of the audio processing method and their variations are practical on one hand; and on the other hand, every aspect of the embodiments of the audio processing method and their variations may be separate solutions. Especially, in all the audio processing methods, the audio classifying methods as discussed in Parts 6 and 7 may be used.

Part 2: Dialog Enhancer Controller and Controlling Method

One example of the audio improving device is Dialog Enhancer (DE), which aims at continually monitoring the audio on playback, detecting the presence of dialog, and enhancing the dialog to increase their clarity and intelligibility (making the dialog easier to be heard and understood), especially for elders with decreasing hearing capability. Besides detecting if a dialog is present, the frequencies most important to intelligibility are also detected if a dialog is present and then correspondingly enhanced (with dynamic spectral rebalancing). An example dialog enhancement method is presented in H. Muesch. "Speech Enhancement in Entertainment Audio" published as WO 2008/106036 A2, the entirety of which is incorporated herein by reference.

A common manual configuration on Dialog Enhancer is that it is usually enabled on movie-like media content but disabled on music content, because dialog enhancement may falsely trigger too much on music signals.

Figure 15:
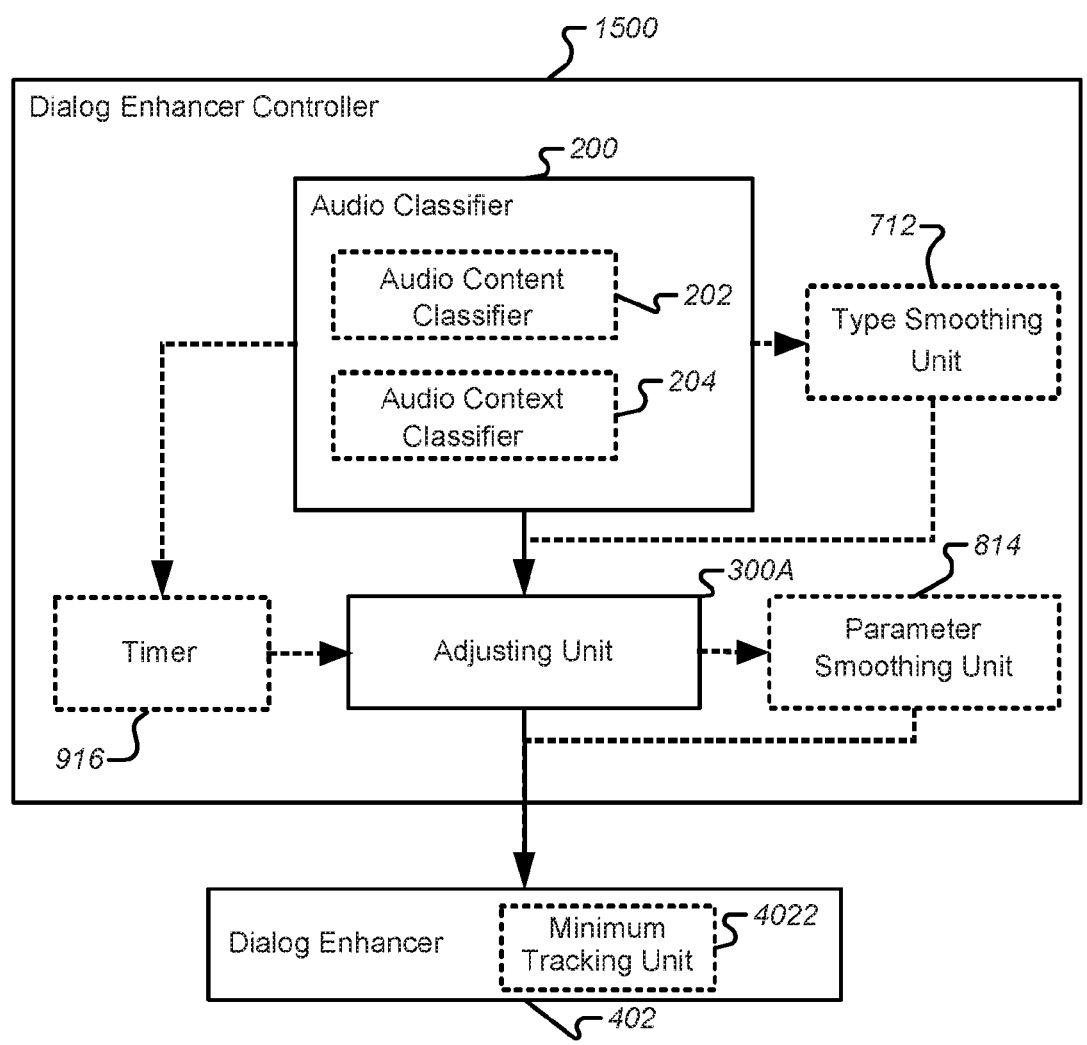
FIG. 15 is a diagram illustrating a dialog enhancer controller according to an embodiment of the present application.

With audio type information available, the level of dialog enhancement and other parameters can be tuned based on the confidence values of the identified audio types. As a specific example of the audio processing apparatus and method discussed earlier, the dialog enhancer may make use of all the embodiments discussed in Part 1 and any combinations of those embodiments. Specifically, in the case of controlling the dialog enhancer, the audio classifier 200 and the adjusting unit 300 in the audio processing apparatus 100 as shown in FIGS. 1-10 may constitute a dialog enhancer controller 1500 as shown in FIG. 15. In this embodiment, since the adjusting unit is specific to the dialog enhancer, it may be referred to as 300A. And, as discussed in the previous part, the audio classifier 200 may comprise at least one of the audio content classifier 202 and the audio context classifier 204, and the dialog enhancer controller 1500 may further comprise at least one of the type smoothing unit 712, the parameter smoothing unit 814 and the timer 916.

Therefore, in this part, we will not repeat those contents already described in the previous part, and just give some specific examples thereof.

For a dialog enhancer, the adjustable parameters include but are not limited to the level of dialog enhancement, the background level, and the thresholds for determining frequency bands to be enhanced. See H. Muesch. "Speech Enhancement in Entertainment Audio" published as WO 2008/106036 A2, the entirety of which is incorporated herein by reference.

2.1 Level of Dialog Enhancement

When involving the level of dialog enhancement, the adjusting unit 300A may be configured to positively correlate the level of dialog enhancement of the dialog enhancer with the confidence value of speech. Additionally or alternatively, the level may be negatively correlated to the confidence value of the other content types. Thus, the level of dialog enhancement can be set to be proportional (linearly or non-linearly) to the speech confidence, so that the dialog enhancement is less effective in non-speech signals, such as music and background sound (sound effects).

As to the context type, the adjusting unit 300A may be configured to positively correlate the level of dialog enhancement of the dialog enhancer with the confidence value of movie-like media and/or VoIP, and or negatively correlate the level of dialog enhancement of the dialog enhancer with the confidence value of the long-term music and/or game. For example, the level of dialog enhancement can be set to be proportional (linearly or non-linearly) the confidence value of movie-like media. When the movie-like media confidence value is 0 (e.g. in the music content), the level of dialog enhancement is also 0, which is equivalent to disable the dialog enhancer.

As described in the previous part, the content type and the context type may be considered jointly.

2.2 Thresholds for Determining Frequency Bands to be Enhanced

During the working of the dialog enhancer, there is a threshold (usually energy or loudness threshold) for each frequency band to determine if it needs to be enhanced, that is, those frequency bands above respective energy/loudness thresholds will be enhanced. For adjusting the thresholds, the adjusting unit 300A may be configured to positively correlate the thresholds with a confidence value of short-term music and/or noise and/or background sounds, and/or negatively correlate the thresholds with a confidence value of speech. For example, the thresholds can be lowered down if speech confidence is high, assuming more reliable speech detection, to allow more frequency bands to be enhanced; on the other hand, when music confidence value is high, the thresholds can be increased to make less frequency bands to be enhanced (and thus fewer artifacts).

2.3 Adjustment to Background Level

Another component in the dialog enhancer is minimum tracking unit 4022, as shown in FIG. 15, which is used to estimate the background level in the audio signal (for SNR estimation, and frequency band threshold estimation as mentioned in Section 2.2). It can be also tuned based on the confidence values of audio content types. For example, if speech confidence is high, the minimum tracking unit can be more confident to set the background level to the current minimum. If music confidence is high, the background level can be set to a little higher than that current minimum, or in another way, set to a weighted average of current minimum and the energy of current frame, with a large weight on the current minimum. If noise and background confidence is high, the background level can be set much higher than the current minimum value, or in another way, set to a weighted average of current minimum and the energy of current frame, with a small weight on the current minimum.

Thus, the adjusting unit 300A may be configured to assign an adjustment to the background level estimated by the minimum tracking unit, wherein the adjusting unit is further configured to positively correlate the adjustment with a confidence value of short-term music and/or noise and/or background sound, and/or negatively correlate the adjustment with a confidence value of speech. In a variant, the adjusting unit 300A may be configured to correlate the adjustment with the confidence value of noise and/or background more positively than the short-term music.

2.4 Combination of Embodiments and Application Scenarios

Similar to Part 1, all the embodiments and variants there of discussed above may be implemented in any combination thereof, and any components mentioned in different parts/embodiments but having the same or similar functions may be implemented as the same or separate components.

For example, any two or more of the solutions described in Sections 2.1 to 2.3 may be combined with each other. And these combinations may be further combined with any embodiment described or implied in Part 1 and the other parts that will be described later. Especially, many formulas are actually applicable to each kind of audio improving device or method, but they are not necessarily recited or discussed in each part of this disclosure. In such a situation, cross-reference may be made among the parts of this disclosure for applying a specific formula discussed in one part to another part, with only relevant parameter(s), coefficient(s), power(s)(exponents) and weight(s) being adjusted properly according to specific requirements of the specific application.

2.5 Dialog Enhancer Controlling Method

Similar to Part 1, in the process of describing the dialog enhancer controller in the embodiments hereinbefore, apparently disclosed are also some processes or methods. Hereinafter a summary of these methods is given without repeating some of the details already discussed hereinbefore.

Firstly, the embodiments of the audio processing method as discussed in Part 1 may be used for a dialog enhancer, the parameter(s) of which is one of the targets to be adjusted by the audio processing method. From this point of view, the audio processing method is also a dialog enhancer controlling method.

In this section, only those aspects specific to the control of the dialog enhancer will be discussed. For general aspects of the controlling method, reference may be made to Part 1.

According to one embodiment, the audio processing method may further comprise dialog enhancement processing, and the operation of adjusting 1104 comprises positively correlating the level of dialog enhancement with the confidence value of movie-like media and/or VoIP, and or negatively correlating the level of dialog enhancement with the confidence value of the long-term music and/or game.

That is, dialog enhancement is mainly directed to the audio signal in the context of movie-like media, or VoIP.

More specifically, the operation of adjusting 1104 may comprise positively correlating the level of dialog enhancement of the dialog enhancer with the confidence value of speech.

Figure 16:
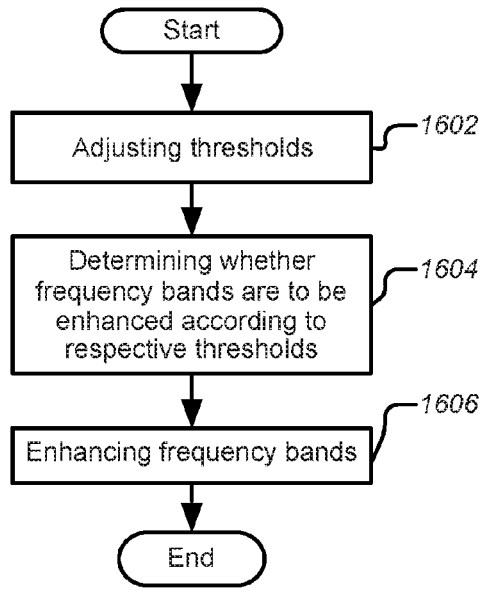
FIGS. 16 and 17 are flowcharts illustrating the use of the audio processing method according to the present application in the controlling of a dialog enhancer.
Figure 17:
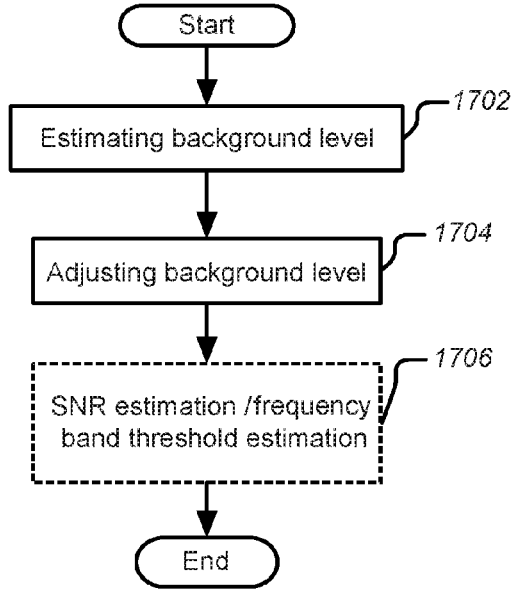

The present application may also adjust frequency bands to be enhanced in the dialog enhancement processing. As shown in FIG. 16, the thresholds (usually energy or loudness) for determining whether respective frequency bands are to be enhanced may be adjusted based on the confidence value(s) of identified audio types (operation 1602) according to the present application. Then, within the dialog enhancer, based on the adjusted thresholds, frequency bands above respective thresholds are selected (operation 1604) and enhanced (operation 1606).

Specifically, the operation of adjusting 1104 may comprise positively correlating the thresholds with a confidence value of short-term music and/or noise and/or background sounds, and/or negatively correlating the thresholds with a confidence value of speech.

The audio processing method (especially the dialog enhancement processing) generally further comprises estimating the background level in the audio signal, which is generally implemented by a minimum tracking unit 4022 realized in the dialog enhancer 402, and used in SNR estimation or frequency band threshold estimation. The present application may also be used to adjust the background level. In such a situation, after the background level is estimated (operation 1702), it is first adjusted based on the confidence value(s) of the audio type(s) (operation 1704), and then is used in the SNR estimation and/or frequency band threshold estimation (operation 1706). Specifically, the operation of adjusting 1104 may be configured to assign an adjustment to the estimated background level, wherein the operation of adjusting 1104 may be further configured to positively correlate the adjustment with a confidence value of short-term music and/or noise and/or background sound, and/or negatively correlate the adjustment with a confidence value of speech.

More specifically, the operation of adjusting 1104 may be configured to correlate the adjustment with the confidence value of noise and/or background more positively than the short-term music.

Similar to the embodiments of the audio processing apparatus, any combination of the embodiments of the audio processing method and their variations are practical on one hand; and on the other hand, every aspect of the embodiments of the audio processing method and their variations may be separate solutions. In addition, any two or more solutions described in this section may be combined with each other, and these combinations may be further combined with any embodiment described or implied in Part 1 and the other parts that will be described later.

Part 3: Surround Virtualizer Controller and Controlling Method

A surround virtualizer enables a surround sound signal (such as multichannel 5.1 and 7.1) to be rendered over the internal speakers of the PC or over headphones. That is, with stereo devices such as internal laptop speakers or headphones, it creates virtually surround effect and provides cinematic experience for consumers. Head Related Transfer Functions (HRTFs) are usually utilized in the surround virtualizer to simulate the arrival of sound at the ears coming from the various speaker locations associated with the multi-channel audio signal.

While current surround virtualizer works well on headphones, it works differently on different contents with built-in speakers. In general, movie-like media content enables Surround Virtualizer for speakers, while music does not since it may sound too thin.

Since the same parameters in Surround Virtualizer cannot create good sound image for both movie-like media and music content simultaneously, parameters have to be tuned based on the content more precisely. With audio type information available, especially the music confidence value and speech confidence value, as well as some other content type information and context information, the work can be done with the present application.

Figure 18:
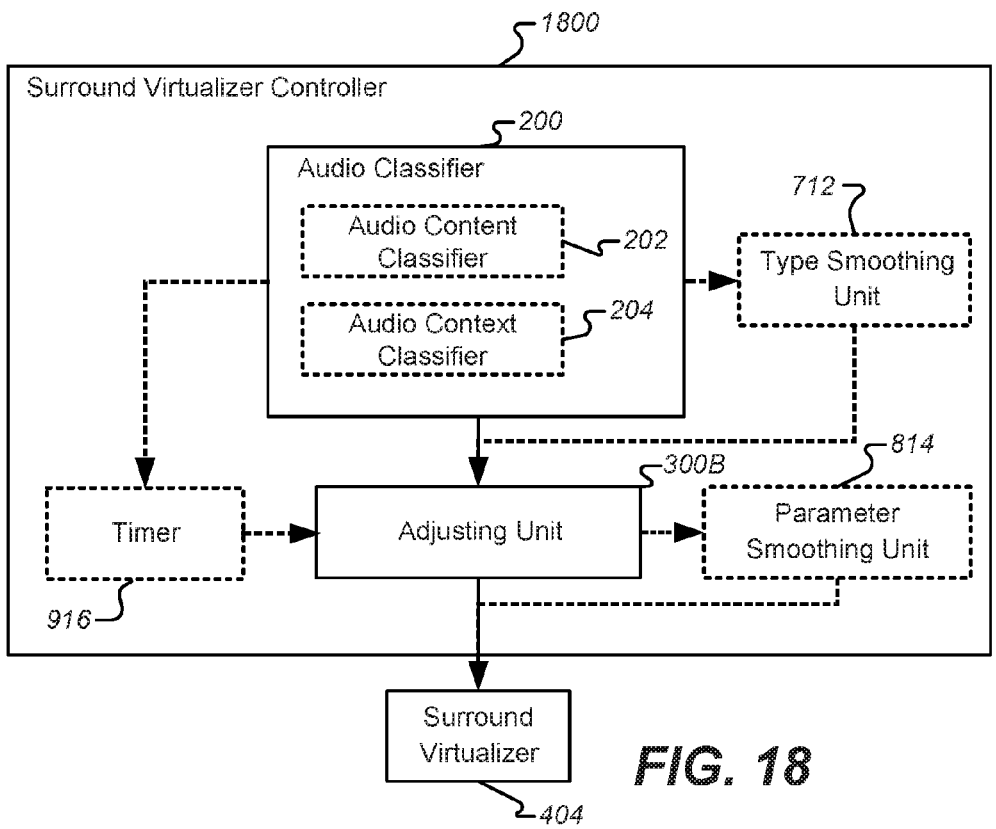
FIG. 18 is a diagram illustrating a surround virtualizer controller according to an embodiment of the present application.

Similar to Part 2, as a specific example of the audio processing apparatus and method discussed in Part 1, the surround virtualizer 404 may make use of all the embodiments discussed in Part 1 and any combinations of those embodiments disclosed therein. Specifically, in the case of controlling the surround virtualizer 404, the audio classifier 200 and the adjusting unit 300 in the audio processing apparatus 100 as shown in FIGS. 1-10 may constitute a surround virtualizer controller 1800 as shown in FIG. 18. In this embodiment, since the adjusting unit is specific to the surround virtualizer 404, it may be referred to as 300B. And, similar to Part 2, the audio classifier 200 may comprise at least one of the audio content classifier 202 and the audio context classifier 204, and the surround virtualizer controller 1800 may further comprise at least one of the type smoothing unit 712, the parameter smoothing unit 814 and the timer 916.

Therefore, in this part, we will not repeat those contents already described in Part 1, and just give some specific examples thereof.

For a surround virtualizer, the adjustable parameters include but are not limited to surround boost amount and the start frequency for the surround virtualizer 404.

3.1 Surround Boost Amount

When involving the surround boost amount, the adjusting unit 300B may be configured to positively correlate the surround boost amount of the surround virtualizer 404 with a confidence value of noise and/or background and/or speech, and/or negatively correlate the surround boost amount with a confidence value of short-term music.

Specifically, to modify the surround virtualizer 404 in order that music (content type) sounds acceptable, an example implementation of the adjusting unit 300B could tune the amount of the surround boost based on the short-term music confidence value, such as:

$$SB \propto (1 - \text{Conf}_{music}) \quad (5)$$

where SB indicates surround boost amount, $\text{Conf}_{music}$ is the confidence value of short-term music.

It helps to decrease the surround boost for music and prevent it from sounding washed out.

Similarly, the speech confidence value can be also utilized, for example:

$$SB \propto (1 - \text{Conf}_{music}) * \text{Conf}_{speech}^{\alpha} \quad (6)$$

where $\text{Conf}_{speech}$ is the confidence value of speech, $\alpha$ is a weighting coefficient in the form of exponent, and may be in the range of 1-2. This formula indicates the surround boost amount will be high for only pure speech (high speech confidence and low music confidence).

Or we can consider only the confidence value of speech:

$$SB \propto \text{Conf}_{speech} \quad (7)$$

Various variants can be designed in a similar way. Especially, for noise or background sound, formulae similar to formulas (5) to (7) may be constructed. In addition, the effects of the four content types may be considered together in any combination. In such a situation, noise and background are ambience sounds and they are more safe to have a large boost amount; speech can have a middle boost amount, supposing a talker usually sit in the front of the screen; and music uses less boost amount. Therefore, the adjusting unit 300B may be configured to correlate the surround boost amount with the confidence value of noise and/or background more positively than the content type speech.

Supposing we predefined an expected boost amount (that is equivalent to a weight) for each content type, another alternative can be also applied:

$$\hat{a} = \frac{a_{speech} \cdot \text{Conf}_{speech} + a_{music} \cdot \text{Conf}_{music} + a_{noise} \cdot \text{Conf}_{noise} + a_{bkg} \cdot \text{Conf}_{bkg}}{\text{Conf}_{speech} + \text{Conf}_{music} + \text{Conf}_{noise} + \text{Conf}_{bkg}} \quad (8)$$

where $\hat{a}$ is the estimated boost amount, the $\alpha$ with an subscript of the content type is the expected/predefined boost amount (weight) of the content type, Conf with an subscript of the content type is the confidence value of the content type (where bkg represents "background sound"). Depending on situations, $a_{music}$ may be (but not necessarily) set as 0, indicating that the surround virtualizer 404 will be disabled for pure music (content type).

From another point of view, the $\alpha$ with an subscript of the content type in formula (8) is the expected/predefined boost amount of the content type, and the quotient of the confidence value of the corresponding content type divided by the sum of the confidence values of all the identified content types may be regarded as normalized weight of the predefined/expected boost amount of the corresponding content type. That is, the adjusting unit 300B may be configured to consider at least some of the multiple content types through weighting the predefined boost amounts of the multiple content types based on the confidence values.

As to the context type, the adjusting unit 300B may be configured to positively correlate the surround boost amount of the surround virtualizer 404 with a confidence value of movie-like media and/or game, and/or negatively correlate the surround boost amount with a confidence value of long-term music and/or VoIP. Then, formulas similar to (5) to (8) may be constructed.

As a special example, the surround virtualizer 404 can be enabled for pure movie-like media and/or game, but disabled for music and/or VoIP. Meanwhile, the boost amount of the surround virtualizer 404 can be set differently for movie-like media and game. movie-like media uses a higher boost amount, and game uses less. Therefore, the adjusting unit 300B may be configured to correlate the surround boost amount with the confidence value of movie-like media more positively than game.

Similar to the content type, the boost amount of an audio signal can also be set to a weighted average of the confidence values of the context types:

$$\hat{a} = \frac{a_{MOVIE} \cdot \text{Conf}_{MOVIE} + a_{MUSIC} \cdot \text{Conf}_{MUSIC} + a_{GAME} \cdot \text{Conf}_{GAME} + a_{VOIP} \cdot \text{Conf}_{VOIP}}{\text{Conf}_{MOVIE} + \text{Conf}_{MUSIC} + \text{Conf}_{GAME} + \text{Conf}_{VOIP}} \quad (9)$$

where $\hat{a}$ is the estimated boost amount, the $\alpha$ with an subscript of the context type is the expected/predefined boost amount (weight) of the context type, Conf with an subscript of the context type is the confidence value of the context type. Depending on situations, $a_{music}$ and $a_{VOIP}$ may be (but not necessarily) set as 0, indicating that the surround virtualizer 404 will be disabled for pure music (context type) and or pure VoIP.

Again, similar to the content type, the $\alpha$ with an subscript of the context type in formula (9) is the expected/predefined boost amount of the context type, and the quotient of the confidence value of the corresponding context type divided by the sum of the confidence values of all the identified context types may be regarded as normalized weight of the predefined/expected boost amount of the corresponding context type. That is, the adjusting unit 300B may be configured to consider at least some of the multiple context types through weighting the predefined boost amounts of the multiple context types based on the confidence values.

3.2 Start Frequency

Other parameters can be also modified in the surround virtualizer, such as the start frequency. Generally, high frequency components in an audio signal are more suitable to be spatially rendered. For example, in music, it will sound strange if the bass is spatially rendered to have more surround effects. Therefore, for a specific audio signal, the surround virtualizer need determine a frequency threshold, the components above which are spatially rendered while the components below which are retained. The frequency threshold is the start frequency.

According to an embodiment of the present application, the start frequency for the surround virtualizer can be increased on the music content so that more bass can be retained for music signals. Then, the adjusting unit 300B may be configured to positively correlate the start frequency of the surround virtualizer with a confidence value of short-term music.

3.3 Combination of Embodiments and Application Scenarios

Similar to Part 1, all the embodiments and variants thereof discussed above may be implemented in any combination thereof, and any components mentioned in different parts/embodiments but having the same or similar functions may be implemented as the same or separate components.

For example, any two or more of the solutions described in Sections 3.1 and 3.2 may be combined with each other. And any of the combinations may be further combined with any embodiment described or implied in Part 1, Part 2 and the other parts that will be described later.

3.4 Surround Virtualizer Controlling Method

Similar to Part 1, in the process of describing the surround virtualizer controller in the embodiments hereinbefore, apparently disclosed are also some processes or methods. Hereinafter a summary of these methods is given without repeating some of the details already discussed hereinbefore.

Firstly, the embodiments of the audio processing method as discussed in Part 1 may be used for a surround virtualizer, the parameter(s) of which is one of the targets to be adjusted by the audio processing method. From this point of view, the audio processing method is also a surround virtualizer controlling method.

In this section, only those aspects specific to the control of the surround virtualizer will be discussed. For general aspects of the controlling method, reference may be made to Part 1.

According to one embodiment, the audio processing method may further comprise surround virtualizing processing, and the operation of adjusting 1104 may be configured to positively correlate the surround boost amount of the surround virtualizing processing with a confidence value of noise and/or background and/or speech, and/or negatively correlate the surround boost amount with a confidence value of short-term music.

Specifically, the operation of adjusting 1104 may be configured to correlate the surround boost amount with the confidence value of noise and/or background more positively than the content type speech.

Alternatively or additionally, the surround boost amount may also be adjusted based on the confidence value(s) of context type(s). Specifically, the operation of adjusting 1104 may be configured to positively correlate the surround boost amount of the surround virtualizing processing with a confidence value of movie-like media and/or game, and/or negatively correlate the surround boost amount with a confidence value of long-term music and/or VoIP.

More specifically, the operation of adjusting 1104 may be configured to correlate the surround boost amount with the confidence value of movie-like media more positively than game.

Figure 19:
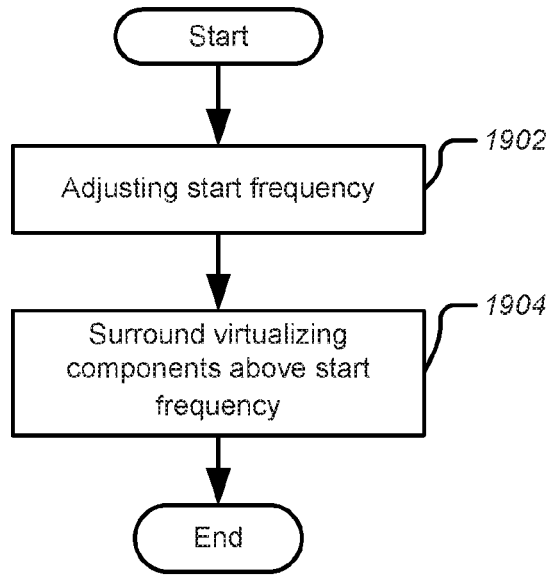
FIG. 19 is a flowchart illustrating the use of the audio processing method according to the present application in the controlling of a surround virtualizer.

Another parameter to be adjusted is the start frequency for the surround virtualizing processing. As shown in FIG. 19, the start frequency is adjusted firstly based on the confidence value(s) of the audio type(s) (operation 1902), then the surround virtualizer process those audio components above the start frequency (operation 1904). Specifically, the operation of adjusting 1104 may be configured to positively correlate the start frequency of the surround virtualizing processing with a confidence value of short-term music.

Similar to the embodiments of the audio processing apparatus, any combination of the embodiments of the audio processing method and their variations are practical on one hand; and on the other hand, every aspect of the embodiments of the audio processing method and their variations may be separate solutions. In addition, any two or more solutions described in this section may be combined with each other, and these combinations may be further combined with any embodiment described or implied in the other parts of this disclosure.

Part 4: Volume Leveler Controller and Controlling Method

The volume of different audio sources or different pieces in the same audio source sometime changes a lot. It is annoying since users have to adjust the volume frequently. Volume Leveler (VL) aims at tuning the volume of the audio content on playback and keeping it almost consistent over the timeline based on a target loudness value. Example Volume Levelers are presented in A. J. Seefeldt et al. "*Calculating and Adjusting the Perceived Loudness and/or the Perceived Spectral Balance of an Audio Signal*", published as US2009/0097676A1; B. G. Grockett et al. "*Audio Gain Control Using Specific-Loudness-Based Auditory Event Detection*", published as WO2007/127023A1; and A. Seefeldt et al. "*Audio Processing Using Auditory Scene Analysis and Spectral Skewness*", published as WO 2009/011827 A1. The three documents are incorporated herein in their entirety by reference.

The volume leveler continuously measures the loudness of an audio signal in some manner and then modifies the signal by an amount of gain that is a scaling factor to modify the loudness of an audio signal and usually is a function of the measured loudness, the desired target loudness, and several other factors. A number of factors needed to be considered to estimate a proper gain, with underlying criteria to both approach to the target loudness and keep the dynamic range. It usually comprises several sub-elements such as automatic gain control (AGC), auditory event detection, dynamic range control (DRC).

A control signal is generally applied in the volume leveler to control the "gain" of the audio signal. For example, a control signal can be an indicator of the change in the magnitude of the audio signal derived by pure signal analysis. It can be also an audio event indicator to represent if a new audio event appears, through psycho-acoustical analysis such as auditory scene analysis or specific-loudness-based auditory event detection. Such a control signal is applied in volume leveler for gain controlling, for example, by ensuring that the gain is nearly constant within an auditory event and by confining much of the gain change to the neighborhood of an event boundary, in order to reduce possible audible artifacts due to a rapid change of the gain in the audio signal.

However, the conventional methods of deriving control signals cannot differentiate informative auditory events from non-informative (interfering) auditory events. Here, the informative auditory event stands for the audio event that contains meaningful information and may be paid more attention by users, such as dialog and music, while the non-informative signal does not contain meaningful information for users, such as noise in VoIP. As a consequent, the non-informative signals may also be applied by a large gain and boosted to close to the target loudness. It will be unpleasing in some applications. For example, in VoIP calls, the noise signal that appears in the pause of a conversation is often boosted up to a loud volume after processed by a volume leveler. This is unwanted by users.

In order to address this problem at least in part, the present application proposes to control the volume leveler based on the embodiments discussed in Part 1.

Figure 20:
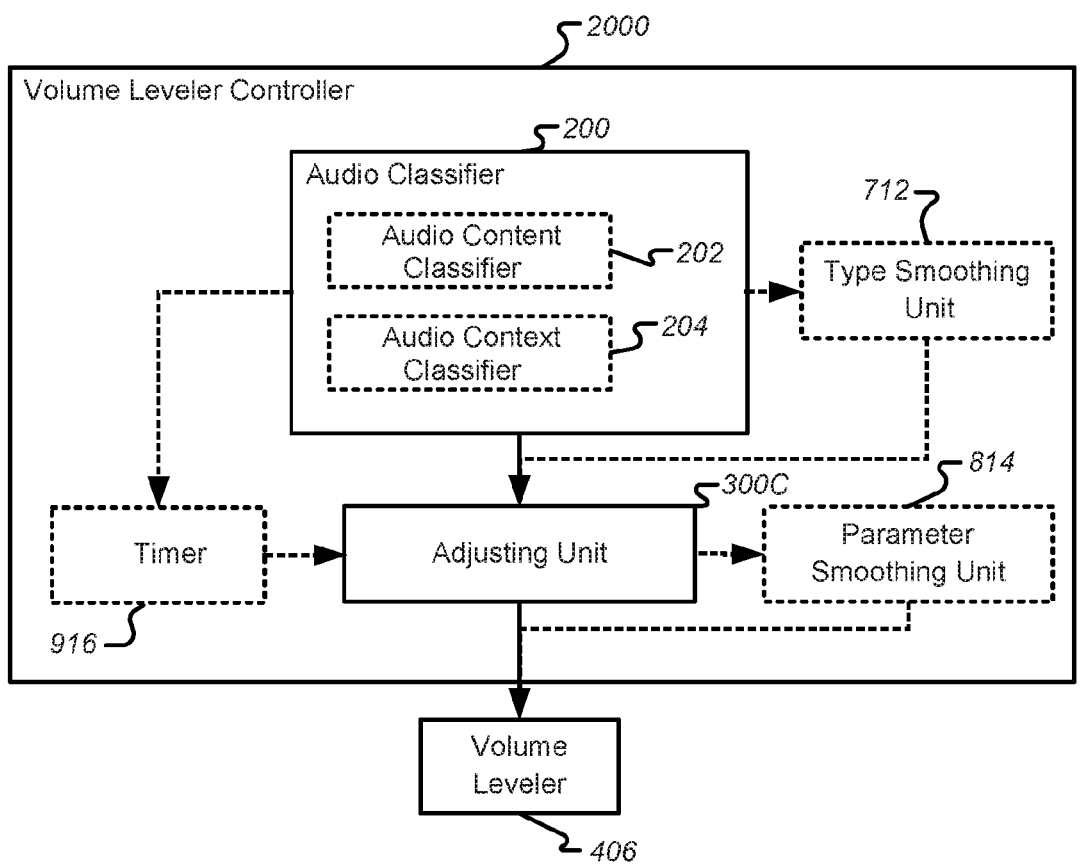
FIG. 20 is a diagram illustrating a volume leveler controller according to an embodiment of the present application.

Similar to Part 2 and Part 3, as a specific example of the audio processing apparatus and method discussed in Part 1, the volume leveler 406 may make use of all the embodiments discussed in Part 1 and any combinations of those embodiments disclosed therein. Specifically, in the case of controlling the volume leveler 406, the audio classifier 200 and the adjusting unit 300 in the audio processing apparatus 100 as shown in FIGS. 1-10 may constitute a volume leveler 406 controller 2000 as shown in FIG. 20. In this embodiment, since the adjusting unit is specific to the volume leveler 406, it may be referred to as 300C.

That is, based on the disclosure of Part 1, a volume leveler controller 2000 may comprise an audio classifier 200 for continuously identifying the audio type (such as content type and/or context type) of an audio signal; and an adjusting unit 300C for adjusting a volume leveler in a continuous manner based on the confidence value of the audio type as identified. Similarly, the audio classifier 200 may comprise at least one of the audio content classifier 202 and the audio context classifier 204, and the volume leveler controller 2000 may further comprise at least one of the type smoothing unit 712, the parameter smoothing unit 814 and the timer 916.

Therefore, in this part, we will not repeat those contents already described in Part 1, and just give some specific examples thereof.

Different parameters in the volume leveler 406 can be adaptively tuned based on the classification results. We can tune the parameters directly related to the dynamic gain or the range of the dynamic gain, for example, by reducing the gain for the non-informative signals. We can also tune the parameters which indicate the degree of the signal being a new perceptible audio event, and then indirectly control the dynamic gain (the gain will change slowly within an audio event, but may change rapidly at the boundary of two audio events). In this application, several embodiments of the parameter tuning or volume leveler controlling mechanism are presented.

4.1 Informative and Interfering Content Types

As mentioned above, in connection with the control of the volume leveler, the audio content types may be classified as informative content types and interfering content types. And the adjusting unit 300C may be configured to positively correlate the dynamic gain of the volume leveler with informative content types of the audio signal, and negatively correlate the dynamic gain of the volume leveler with interfering content types of the audio signal.

As an example, supposing noise is interfering (non-informative) and it will be annoying to be boosted into a loud volume, the parameter directly controlling the dynamic gain, or the parameter indicating new audio events can be set to be proportional to a decreasing function of the noise confidence value ($Conf_{noise}$), such as $$\text{GainControl} \propto 1 - \text{Conf}_{noise} \quad (10)$$

Here, for simplicity, we use the symbol GainControl to represent all the parameters (or their effects) related to gain controlling in the volume leveler, since different implementations of volume leveler may use different names of parameters with different underlying meaning. Using the single term GainControl can have a short expression without losing generality. In essence, adjusting these parameters is equivalent to applying a weight on the original gain, either linear or non-linear. As one example, the GainControl can be directly used to scale the gain so that the gain will be small if GainControl is small. As another specific example, the gain is indirectly controlled by scaling with GainControl the event control signal described in B. G. Grockett et al. "*Audio Gain Control Using Specific-Loudness-Based Auditory Event Detection*", published as WO2007/127023A1, which is incorporated herein in its entirety by reference. In this case, when GainControl is small, the controls of the volume leveler's gain are modified to prevent the gain from changing significantly with time. When GainControl is high, the controls are modified so that the gain of the leveler is allowed to change more freely.

With the gain control described in formula (10) (either directly scaling the original gain or the event control signal), the dynamic gain of an audio signal is correlated (linear or nonlinearly) to its noise confidence value. If the signal is noise with a high confidence value, the final gain will be small due to the factor ($1 - \text{Conf}_{noise}$). In this way, it avoids boosting a noise signal into an unpleasing loud volume.

As an example variant from formula (10), if the background sound is also not interested in an application (such as in VoIP), it can be dealt with similarly and applied by a small gain as well. A controlling function can consider both noise confidence value ($Conf_{noise}$) and background confidence value ($Conf_{bkg}$), for example $$\text{GainControl} \propto (1 - \text{Conf}_{noise}) \cdot (1 - \text{Conf}_{bkg}) \quad (11)$$

In above formula, since both noise and background sounds are not wanted, the GainControl is equally affected by the confidence value of noise and the confidence value of background, and it may be regarded that noise and background sounds have the same weight. Depending on situations, they may have different weights. For example, we may give the confidence values of noise and background sounds (or their difference with 1) different coefficients or different exponents ($\alpha$ and $\gamma$). That is, formula (11) may be rewritten as:

$$\text{GainControl} \propto (1 - \text{Conf}_{noise})^{\alpha} \cdot (1 - \text{Conf}_{bkg})^{\gamma} \quad (12)$$

or $$\text{GainControl} \propto (1 - \text{Conf}_{noise}{}^{\alpha}) \cdot (1 - \text{Conf}_{bkg}{}^{\gamma}) \quad (13)$$

Alternatively, the adjusting unit 300C may be configured to consider at least one dominant content type based on the confidence values. For example:

$$\text{GainControl} \propto 1 - \max(\text{Conf}_{noise}, \text{Conf}_{bkg}) \quad (14)$$

Both formula (11) (and its variants) and formula (14) indicate a small gain for noise signals and background sound signals, and the original behavior of the volume leveler is kept only when both noise confidence and background confidence is small (such as in speech and music signal) so that GainControl is close to one.

The example above is to consider the dominant interfering content type. Depending on situation, the adjusting unit 300C may also be configured to consider the dominant informative content type based on the confidence values. To be more general, the adjusting unit 300C may be configured to consider at least one dominant content type based on the confidence values, no matter whether the identified audio types are/include informative and/or interfering audio types.

As another example variant of formula (10), supposing speech signal is the most informative content and needs less modification on the default behavior of the volume leveler, the controlling function can consider both noise confidence value ($Conf_{noise}$) and speech confidence value ($Conf_{speech}$), as $$\text{GainControl} \propto 1 - \text{Conf}_{noise} \cdot (1 - \text{Conf}_{speech}) \quad (15)$$

With this function, a small GainControl is obtained only for those signals with high noise confidence and low speech confidence (e.g., pure noise), and the GainControl will be close to 1 if the speech confidence is high (and thus keep the original behavior of the volume leveler). More generally, it can be regarded that the weight of one content type (such as $Conf_{noise}$) may be modified with the confidence value of at least one other content type (such as $Conf_{speech}$). In above formula (15), it can be regarded that the confidence of speech changes the weight coefficient of the confidence of noise (another kind of weight if compared to the weights in formula (12 and 13)). In other words, in formula (10), the coefficient of $Conf_{noise}$ can be regarded as 1; while in formula (15), some other audio types (such as speech, but not limited thereto) will affect the importance of the confidence value of noise, thus we can say the weight of $Conf_{noise}$ is modified by the confidence value of the speech. In the context of the present disclosure, the term "weight" shall be construed to include this. That is, it indicates the importance of a value, but not necessarily normalized. Reference may be made to Section 1.4.

From another viewpoint, similar to formula (12) and (13), weights in the form of exponents can be applied on the confidence values in the above function to indicate the priority (or importance) of different audio signals, for example, the formula (15) can be changed to:

$$\text{GainControl} \propto 1-\text{Conf}_{noise}{}^{\alpha} \cdot (1-\text{Conf}_{speech})^{\gamma} \quad (16)$$

where α and γ are two weights, which can be set smaller if it is expected to be more respondent to modify leveler parameters.

The formulas (10)-(16) can be freely combined to form various controlling functions which may be suitable in different applications. The confidence values of other audio content types, such as music confidence value, can be also easily incorporated in the controlling functions in a similar way.

In the case where the GainContrtol is used to tune the parameters which indicate the degree of the signal being a new perceptible audio event, and then indirectly control the dynamic gain (the gain will change slowly within an audio event, but may change rapidly at the boundary of two audio events), it may be regarded that there is another transfer function between the confidence value of content types and the final dynamic gain.

4.2 Content Types in Different Contexts

The above controlling functions in formula (10)-(16) take consideration of the confidence values of audio content types, such as noise, background sounds, short-term music, and speech, but do not consider their audio contexts where the sounds come from, such as movie-like media and VoIP. It is possible that the same audio content type might need to be processed differently in different audio contexts, for example, the background sounds. Background sound comprises various sounds such as car engine, explosion, and applause. It may be not meaningful in a VoIP call but it could be important in a movie-like media. This indicates that the interested audio contexts need to be identified and different controlling functions need to be designed for different audio contexts.

Therefore, the adjusting unit 300C may be configured to regard the content type of the audio signal as informative or interfering based on the context type of the audio signal. For example, by considering noise confidence value and background confidence value, and differentiating VoIP and non-VoIP contexts, an audio context-dependent controlling function can be,

```
if the audio context is VoIP
    GainControl ∝ 1 - max(Conf_noise, Conf_bkg)
else
    GainControl ∝ 1 - Conf_noise                    (17)
```

That is, in the VoIP context, noise and background sounds are regarded as interfering content types; while in the non-VoIP context, background sounds is regarded as informative content type.

As another example, an audio context-dependent controlling function considering confidence values of speech, noise, and background, and differentiating VoIP and non-VoIP contexts, could be

```
if the audio context is VoIP
    GainControl ∝ 1 - max(Conf_noise, Conf_bkg)
else
    GainControl ∝ 1- Conf_noise ·(1- Conf_speech)   (18)
```

Here, speech is emphasized as an informative content type.

Supposing music is also important informative information in non-VoIP context, we can extend the second part of formula (18) to:

$$\text{GainControl} \propto 1-\text{Conf}_{noise} \cdot (1-\max(\text{Conf}_{speech}, \text{Conf}_{music})) \quad (19)$$

In fact, each of the controlling functions in (10)-(16) or their variants can be applied in different/corresponding audio contexts. Thus, it can generate a large number of combinations to form audio context-dependent controlling functions.

Besides VoIP and non-VoIP contexts as differentiated and utilized in formula (17) and (18), other audio contexts, such as movie-like media, long-term music, and game, or low-quality audio and high-quality audio, can be utilized in a similar way.

4.3 Context Types

Context types can also be directly used to control the volume leveler to avoid those annoying sounds, such as noise, to be boosted too much. For example, the VoIP confidence value can be used to steer the volume leveler, making it less sensitive when its confidence value is high.

Specifically, with the VoIP confidence value $\text{Conf}_{VOIP}$, the level of the volume leveler can be set to be proportional to $(1-\text{Conf}_{VOIP})$. That is, the volume leveler is almost deactivated in the VoIP content (when the VoIP confidence value is high), which is consistent with the traditional manual setup (preset) that disables the volume leveler for VoIP context.

Alternatively, we can set different dynamic gain ranges for different contexts of audio signals. In general, a VL (volume leveler) amount further adjusts the amount of gain applied on an audio signal, and can be seen as another (nonlinear) weight on the gain. In one embodiment, a setup could be:

TABLE 1

|  | MOVIE-LIKE MEDIA | LONG-TERM MUSIC | VOIP | GAME |
|---|---|---|---|---|
| VL Amount | high | middle | Off (or lowest) | low |

Furthermore, supposing an expected VL amount is predefined for each context type. For example, the VL amount is set as 1 for Movie-like media, 0 for VoIP, 0.6 for Music, and 0.3 for Game, but the present application is not limited thereto. According to the example, if the range of the dynamic gain of movie-like media is 100%, then the range of the dynamic gain of VoIP is 60%, and so on. If the classification of the audio classifier 200 is based on hard decision, then the range of the dynamic gain may be directly set as the above example. If the classification of the audio classifier 200 is based on soft decision, then the range may be adjusted based on the confidence value of the context type.

Similarly, the audio classifier 200 may identify multiple context types from the audio signal, and the adjusting unit 300C may be configured to adjust the range of the dynamic gain by weighting the confidence values of the multiple content types based on the importance of the multiple content types.

Generally, for context type, the functions similar to (10)-(16) can be also used here to set the appropriate VL amount adaptively, with the content types therein replaced with context types, and actually Table 1 reflects the importance of a different context types.

From another point of view, the confidence value may be used to derive a normalized weight as discussed in Section 1.4. Supposing a specific amount is predefined for each context type in Table 1, then a formula similar to formula (9) can be also applied. Incidentally, similar solutions may also be applied to multiple content types and any other audio types.

4.4 Combination of Embodiments and Application Scenarios

Similar to Part 1, all the embodiments and variants there of discussed above may be implemented in any combination thereof, and any components mentioned in different parts/embodiments but having the same or similar functions may be implemented as the same or separate components. For example, any two or more of the solutions described in Sections 4.1 to 4.3 may be combined with each other. And any of the combinations may be further combined with any embodiment described or implied in Parts 1-3 and the other parts that will be described later.

Figure 21:
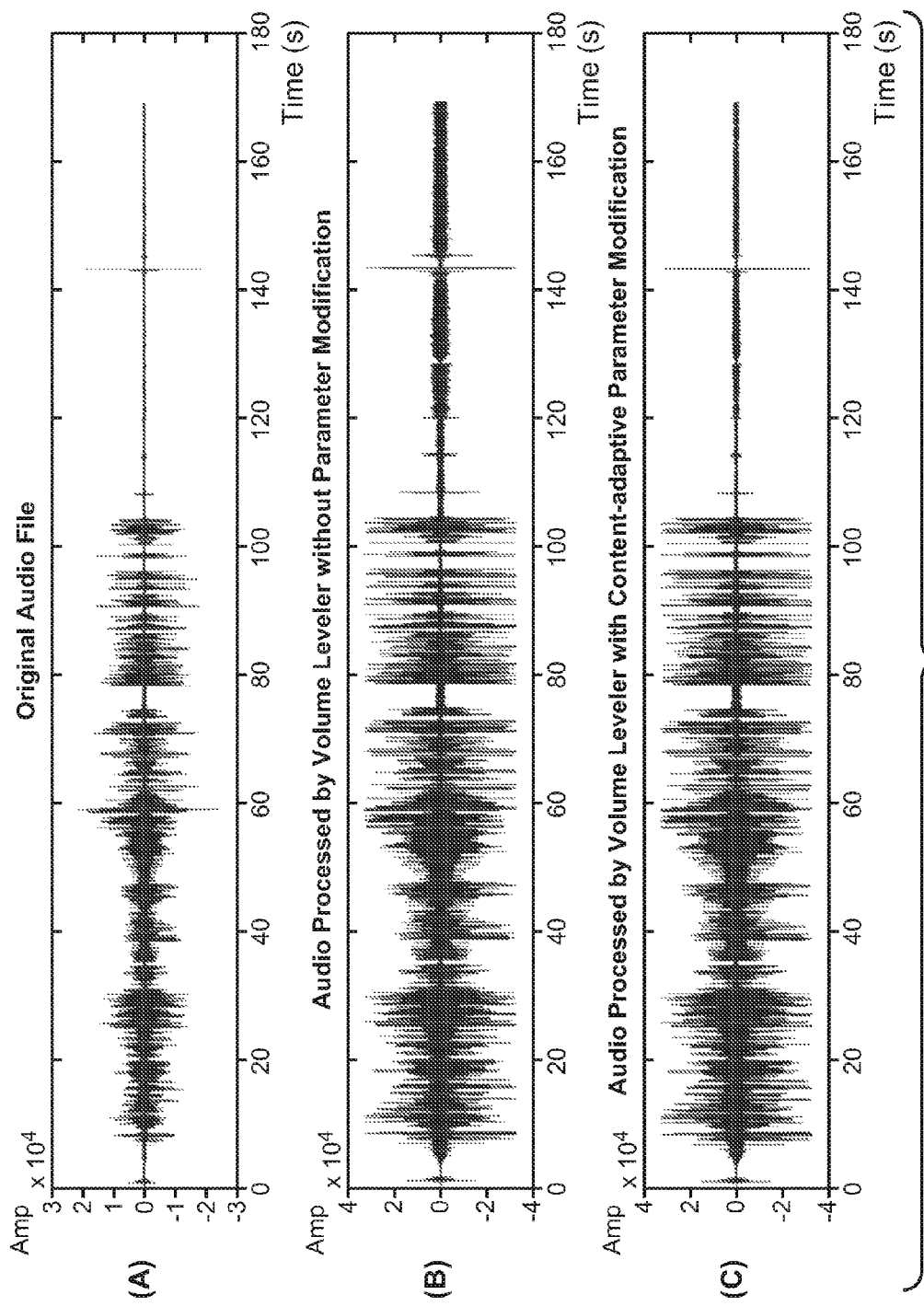
FIG. 21 is a diagram illustrating the effect of the volume leveler controller according to the present application.

FIG. 21 illustrates the effect of the volume leveler controller proposed in the application by comparing an original short-term segment (FIG. 21(A)), the short-term segment processed by a conventional volume leveler without parameter modification (FIG. 21(B), and the short-term segment processed by a volume leveler as presented in this application (FIG. 21(C)). As seen, in the conventional volume leveler as shown in FIG. 21(B), the volume of the noise (the second half of the audio signal) is also boosted and is annoying. In contrast, in the new volume leveler as shown in FIG. 21(C), the volume of the effective part of the audio signal is boosted without apparently boosting the volume of the noise, giving the audience good experience.

4.5 Volume Leveler Controlling Method

Similar to Part 1, in the process of describing the volume leveler controller in the embodiments hereinbefore, apparently disclosed are also some processes or methods. Hereinafter a summary of these methods is given without repeating some of the details already discussed hereinbefore.

Firstly, the embodiments of the audio processing method as discussed in Part 1 may be used for a volume leveler, the parameter(s) of which is one of the targets to be adjusted by the audio processing method. From this point of view, the audio processing method is also A volume leveler controlling method.

In this section, only those aspects specific to the control of the volume leveler will be discussed. For general aspects of the controlling method, reference may be made to Part 1.

According to the present application, A volume leveler controlling method is provided, comprising identifying the content type of an audio signal in real time, and adjusting a volume leveler in a continuous manner based on the content type as identified, by positively correlating the dynamic gain of the volume leveler with informative content types of the audio signal, and negatively correlating the dynamic gain of the volume leveler with interfering content types of the audio signal.

The content type may comprise speech, short-term music, noise and background sound. Generally, noise is regarded as an interfering content type.

When adjusting the dynamic gain of the volume leveler, it may be adjusted directly based on the confidence value of the content type, or may be adjusted via a transfer function of the confidence value of the content type.

As already described, the audio signal may be classified into multiple audio types at the same time. When involving multiple content types, the adjusting operation 1104 may be configured to consider at least some of the multiple audio content types through weighting the confidence values of the multiple content types based on the importance of the multiple content types, or through weighting the effects of the multiple content types based on the confidence values. Specifically, and the adjusting operation 1104 may be configured to consider at least one dominant content type based on the confidence values. When the audio signal contains both interfering content type(s) and informative content type(s), the adjusting operation may be configured to consider at least one dominant interfering content type based on the confidence values, and/or consider at least one dominant informative content type based on the confidence values.

Different audio types may affect each other. Therefore, the adjusting operation 1104 may be configured to modify the weight of one content type with the confidence value of at least one other content type.

As described in Part 1, the confidence value of the audio type of the audio signal may be smoothed. For the detail of the smoothing operation, please refer to Part 1.

The method may further comprise identifying the context type of the audio signal, wherein the adjusting operation 1104 may be configured to adjust the range of the dynamic gain based on the confidence value of the context type.

The role of a content type is limited by the context type where it is located. Therefore, when both content type information and context type information are obtained for an audio signal at the same time (that is for the same audio segment), the content type of the audio signal may be determined as informative or interfering based on the context type of the audio signal. Further, the content type in an audio signal of a different context type may be assigned a different weight depending on the context type of the audio signal. From another point of view, we can use different weight (larger or smaller, plus value or minus value) to reflect the informative nature or interfering nature of a content type.

The context type of the audio signal may comprise VoIP, movie-like media, long-term music and game. And in the audio signal of the context type VoIP, the background sound is regarded as an interfering content type; while in the audio signal of the context type non-VoIP, the background and/or speech and/or music is regarded as an informative content type. Other context types may include high-quality audio or low-quality audio.

Similar to the multiple content types, when the audio signal is classified into multiple context types with corresponding confidence values at the same time (with respect to the same audio segment), the adjusting operation 1104 may be configured to consider at least some of the multiple context types through weighting the confidence values of the multiple context types based on the importance of the multiple context types, or through weighting the effects of the multiple context types based on the confidence values. Specifically, the adjusting operation may be configured to consider at least one dominant context type based on the confidence values.

Finally, the embodiments of the method as discussed in this section may use the audio classifying method as will be discussed in Parts 6 and 7, and detailed description is omitted here.

Similar to the embodiments of the audio processing apparatus, any combination of the embodiments of the audio processing method and their variations are practical on one hand; and on the other hand, every aspect of the embodiments of the audio processing method and their variations may be separate solutions. In addition, any two or more solutions described in this section may be combined with each other, and these combinations may be further combined with any embodiment described or implied in the other parts of this disclosure.

Part 5: Equalizer Controller and Controlling Method

Equalization is usually applied on a music signal to adjust or modify its spectral balance, as known as "tone" or "timbre". A traditional equalizer allows users to configure the overall profile (curve or shape) of the frequency response (gain) on each individual frequency band, in order to emphasize certain instruments or remove undesired sounds. Popular music players, such as windows media player, usually provide a graphic equalizer to adjust the gain at each frequency band, and also provide a set of equalizer presets for different music genres, such as Rock, Rap, Jazz and Folk, to get best experience in listening to different genres of music. Once a preset is selected, or a profile is set, the same equalization gains will be applied on the signal, until the profile is modified manually.

In contrast, a dynamic equalizer provides a way to automatically adjust the equalization gains at each frequency bands in order to keep overall consistency of spectral balance with regard to a desired timbre or tone. This consistency is achieved by continuously monitoring the spectral balance of the audio, comparing it to a desired preset spectral balance, and dynamically adjusting the applied equalization gains to transform the audio's original spectral balance into the desired spectral balance. The desired spectral balance is manually selected or pre-set before processing.

Both kinds of the equalizers share the following disadvantage: the best equalization profile, the desired spectral balance, or the related parameters have to be selected manually, and they cannot be automatically modified based on the audio content on playback. Discriminating audio content types will be very important to provide overall good quality for different kinds of audio signals. For example, different music pieces need different equalization profiles, such as those of different genres.

In an equalizer system in which any kinds of audio signals (not just music) are possible to be input, the equalizer parameters need to be adjusted based on the content types. For example, equalizer is usually enabled on music signals, but disabled on speech signals, since it may change the timbre of speech too much and correspondingly make the signal sound unnatural.

In order to address this problem at least in part, the present application proposes to control the equalizer based on the embodiments discussed in Part 1.

Figure 22:
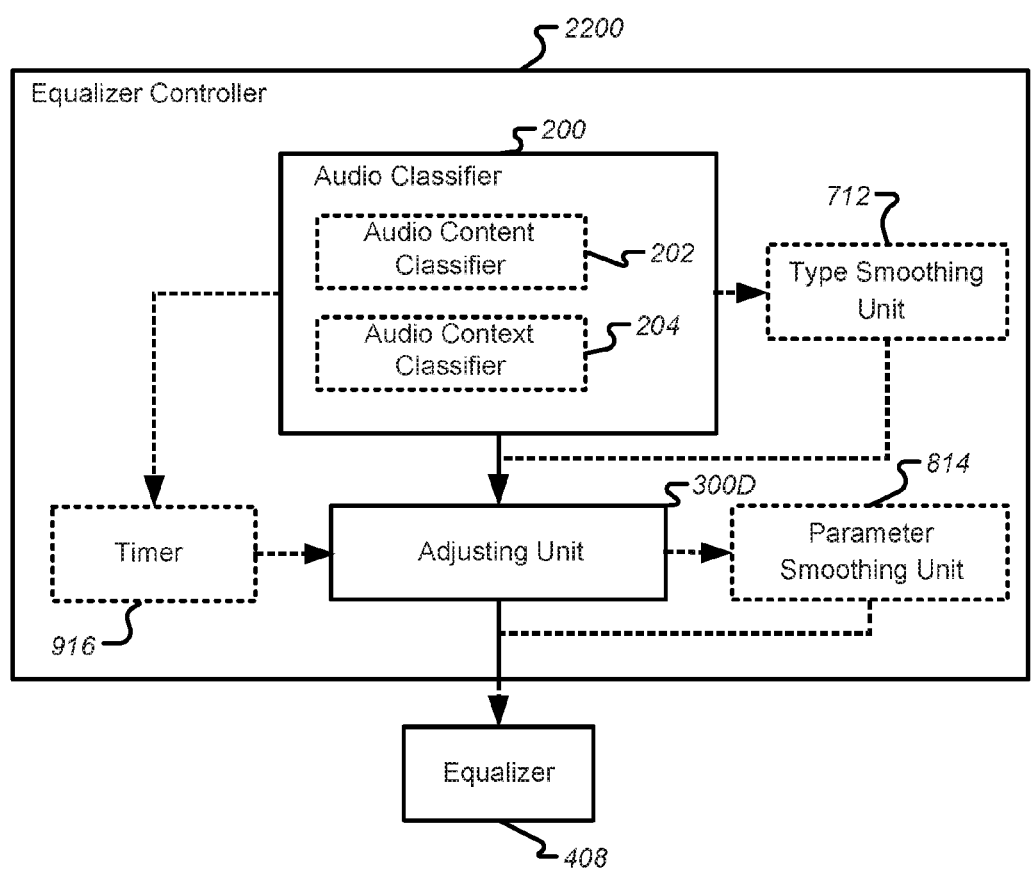
FIG. 22 is a diagram illustrating an equalizer controller according to an embodiment of the present application.

Similar to Parts 2-4, as a specific example of the audio processing apparatus and method discussed in Part 1, the equalizer 408 may make use of all the embodiments discussed in Part 1 and any combinations of those embodiments disclosed therein. Specifically, in the case of controlling the equalizer 408, the audio classifier 200 and the adjusting unit 300 in the audio processing apparatus 100 as shown in FIGS. 1-10 may constitute an equalizer 408 controller 2200 as shown in FIG. 22. In this embodiment, since the adjusting unit is specific to the equalizer 408, it may be referred to as 300D.

That is, based on the disclosure of Part 1, an equalizer controller 2200 may comprise an audio classifier 200 for continuously identifying the audio type of an audio signal; and an adjusting unit 300D for adjusting an equalizer in a continuous manner based on the confidence value of the audio type as identified. Similarly, the audio classifier 200 may comprise at least one of the audio content classifier 202 and the audio context classifier 204, and the volume equalizer controller 2200 may further comprise at least one of the type smoothing unit 712, the parameter smoothing unit 814 and the timer 916.

Therefore, in this part, we will not repeat those contents already described in Part 1, and just give some specific examples thereof.

5.1 Control Based on Content Type

Generally speaking, for general audio content types such as music, speech, background sound and noise, the equalizer should be set differently on different content types. Similar to the traditional setup, the equalizer can be automatically enabled on music signals, but disabled on speech; or in a more continuous manner, set a high equalization level on music signals and low equalization level on speech signals. In this way, the equalization level of an equalizer can automatically set for different audio content.

Specifically for music, it is observed that equalizer does not work so well on a music piece that has a dominant source, since the timbre of the dominant source may change significantly and sound unnatural if an inappropriate equalization is applied. Considering this, it would be better to set a low equalization level on music pieces with dominant sources, while the equalization level can be kept high on music pieces without dominant sources. With this information, the equalizer can automatically set the equalization level for different music content.

Music can also be grouped based on different properties, such as genre, instrument, and general music characteristics including rhythm, tempo, and timbre. In the same way that different equalizer presets are used for different music genres, these music groups/clusters may also have their own optimal equalization profiles or equalizer curves (in traditional equalizer) or optimal desired spectral balance (in dynamic equalizer).

As mentioned above, the equalizer is generally enabled on music content but disabled on speech since the equalizer may make dialog not sound so good due to the timbre change. One method to automatically achieve it is to relate the equalization level to the content, in particular the music confidence value and/or speech confidence value obtained from the audio content classification module. Here, the equalization level can be explained as the weight of the applied equalizer gains. The higher the level is, the stronger the applied equalization is. For the example, if the equalization level is 1, a full equalization profile gets applied; if the equalization level is zero, all gains are correspondingly 0 dB and thus non-equalization is applied. The equalization level may be represented by different parameters in different implementations of the equalizer algorithms. An example embodiment of this parameter is the equalizer weight as implemented in A. Seefeldt et. al. "*Calculating and Adjusting the Perceived Loudness and/or the Perceived Spectral Balance of an Audio Signal*", published as US 2009/0097676 A1, which is incorporated herein in its entirety by reference.

Various controlling schemes can be designed to tune the equalization level. For example, with the audio content type information, either the speech confidence value or music confidence value can be used to set the equalization level, as $$L_{eq} \propto \text{Conf}_{music} \qquad (20)$$

Or $$L_{eq} \propto 1 - \text{Conf}_{speech} \qquad (21)$$

where $L_{eq}$ is the equalization level and $\text{Conf}_{music}$ and $\text{Conf}_{speech}$ stands for the confidence value of music and speech.

That is, the adjusting unit 300D may be configured to positively correlate an equalization level with a confidence value of short-term music, or negatively correlate the equalization level with a confidence value of speech.

The speech confidence value and music confidence value can be further jointly used to set the equalization level. The general idea is that the equalization level should be high only when both music confidence value is high and speech confidence value is low, and otherwise the equalization level is low. For example, $$L_{eq} = \text{Conf}_{music}(1 - \text{Conf}_{speech}^\alpha) \qquad (22)$$

where the speech confidence value is powered to α in order to deal with the non-zero speech confidence in music signals which may frequently happen. With the above formula, equalization will be fully applied (with the level equal to 1) on the pure music signals without any speech components. As stated in Part 1, α may be regarded as a weighting coefficient based on the importance of the content type, and can be typically set to 1 to 2.

If posing greater weight on the confidence value of speech, the adjusting unit 300D may be configured to disable the equalizer 408 when the confidence value for the content type speech is greater than a threshold.

In above description the content types of music and speech are taken as examples. Alternatively or additionally, the confidence values of background sound and/or noise may also be considered. Specifically, the adjusting unit 300D may be configured to positively correlate an equalization level with a confidence value of background, and/or negatively correlate the equalization level with a confidence value of noise.

As another embodiment, the confidence value may be used to derive a normalized weight as discussed in Section 1.4. Supposing an expected equalization level is predefined for each content type (e.g., 1 for music, 0 for speech, 0.5 for noise and background), a formula similar to formula (8) can be exactly applied.

The equalization level can be further smoothed to avoid rapid change which may introduce audible artifacts at transition points. This can be done with the parameter smoothing unit 814 as described in Section 1.5.

5.2 Likelihood of Dominant Sources in Music

In order to avoid the music with dominant sources being applied a high equalization level, the equalization level may be further correlated to the confidence value $\text{Conf}_{dom}$ indicating if a music piece contains a dominant source, for example, $$L_{eq} = 1 - \text{Conf}_{dom} \qquad (23)$$

In this way, the equalization level will be low on music pieces with dominant sources, and high on music pieces without dominant sources.

Here, although the confidence value of music with a dominant source is described, we can also use the confidence value of music without a dominant source. That is, the adjusting unit 300D may be configured to positively correlate an equalization level with a confidence value of short-term music without dominant sources, and/or negatively correlate the equalization level with a confidence value of short-term music with dominant sources.

As stated in Section 1.1, although music and speech on one hand, and music with or without dominant sources on the other hand, are content types on different hierarchical levels, they can be considered in parallel. By jointly considering the confidence value of dominant sources and the speech and music confidence values as described above, the equalization level can be set by combining at least one of formula (20)-(21) with (23). An example is combining all the three formula:

$$L_{eq} = \text{Conf}_{music}(1 - \text{Conf}_{speech})(1 - \text{Conf}_{dom}) \qquad (24)$$

Different weights based on the importance of the content type can be further applied to different confidence values for generality, such as in the manner of the formula (22).

As another example, supposing $\text{Conf}_{dom}$ is computed only when the audio signal is music, a stepwise function can be designed, as $$L_{eq} = \begin{cases} (1 - \text{Conf}_{dom}) & \text{Conf}_{music} > \text{threshold} \\ \text{Conf}_{music}(1 - \text{conf}_{speech}^\alpha) & \text{otherwise} \end{cases} \qquad (25)$$

This function sets the equalization level based on the confidence value of dominant scores if the classification system fairly ascertain that the audio is music (the music confidence value is larger than a threshold); otherwise, it is set based on the music and speech confidence values. That is, the adjusting unit 300D may be configured to consider the short-term music without/with dominant sources when the confidence value for the short-term music is greater than a threshold. Of course, either the first or the second half in formula (25) may be modified in the manner of formula (20) to (24).

The same smoothing scheme as discussed in Section 1.5 can be applied as well, and the time constant α can be further set based on the transition type, such as the transition from music with dominant sources to music without dominant sources, or the transition from music without dominant sources to music with dominant sources. For this purpose, a similar formula as the formula (4') can also be applied.

5.3 Equalizer Presets

Besides adaptively tuning the equalization level based on the confidence values of audio content types, appropriate equalization profiles or desired spectral balance presets can also be automatically chosen for different audio content, depending on their genre, instrument, or other characteristics. The music with the same genre, containing the same instrument, or having the same musical characteristics, can share the same equalization profiles or desired spectral balance presets.

Figure 23:
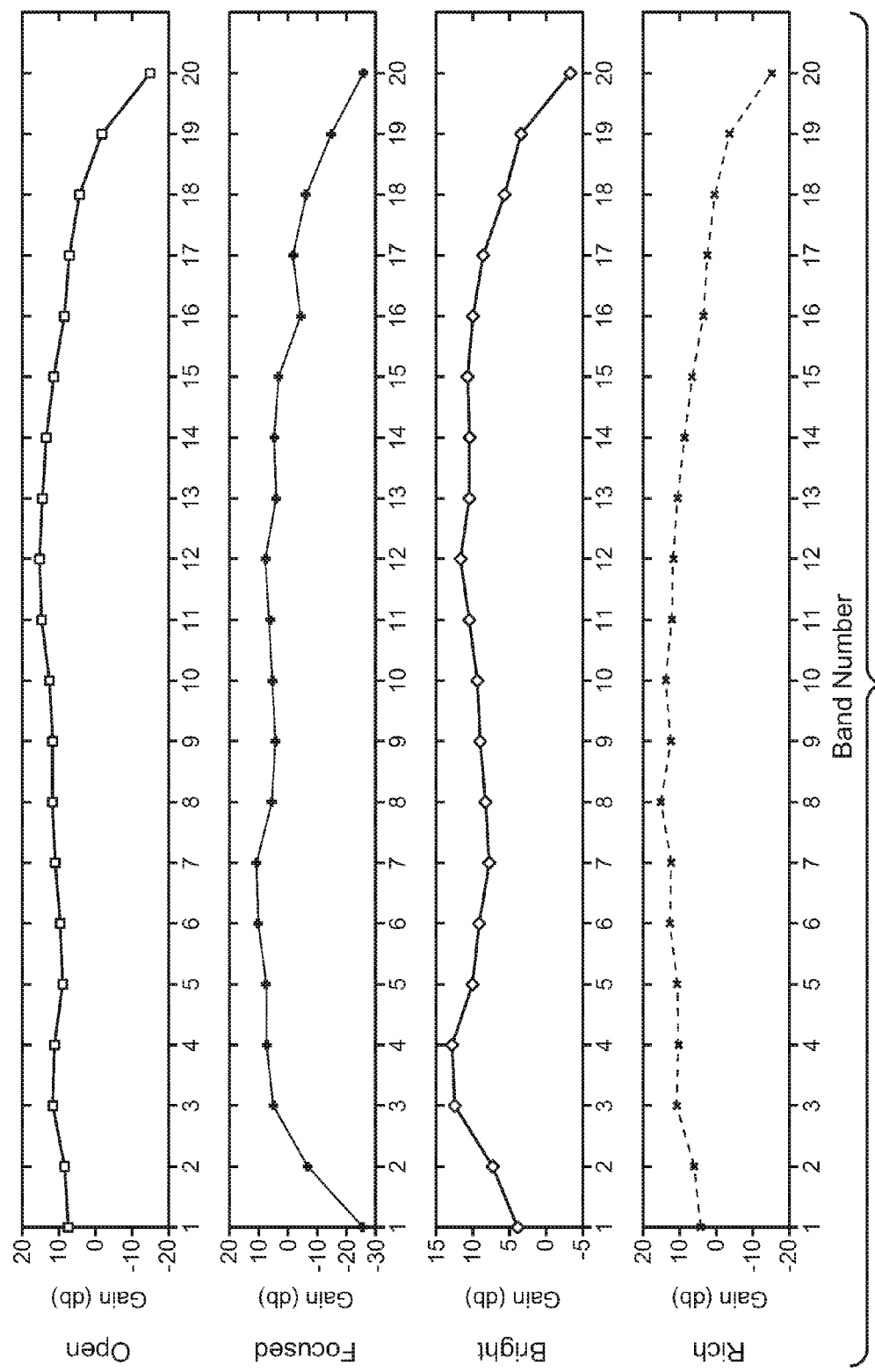
FIG. 23 illustrates several examples of desired spectral balance presets.

For generality, we use the term "music clusters" to represent the music groups with the same genre, the same instrument, or similar musical attributes, and they can be regarded as another hierarchical level of audio content types as stated in Section 1.1. Appropriate equalization profile, equalization level, and/or desired spectral balance preset, may be associated to each music cluster. The equalization profile is the gain curve applied on the music signal and can be any one of the equalizer presets used for different music genres (such as Classical, Rock, Jazz, and Folk), and the desired spectral balance preset represents the desired timbre for each cluster. FIG. 23 illustrates several examples of desired spectral balance presets as implemented in Dolby Home Theater technologies. Each one describes the desired spectral shape across the audible frequency range. This shape is continuously compared to the spectral shape of the incoming audio, and equalization gains are computed from this comparison to transform the spectral shape of the incoming audio into that of the preset.

For a new music piece, the closest cluster can be determined (hard decision), or the confidence value with regard to each music cluster can be computed (soft decision). Based on this information, proper equalization profile, or desired spectral balance preset, can be determined for the given music piece. The simplest way is to assign it the corresponding profile of the best matched cluster, as $$P_{eq} = P_{c^*} \qquad (26)$$

where $P_{eq}$ is the estimated equalization profile or desired spectral balance preset, and c* is the index of the best matched music cluster (the dominant audio type), which can be obtained by picking up the cluster with the highest confidence value.

Moreover, there may be more than one music cluster having confidence value that is larger than zero, meaning the music piece has more or less similar attributes as those clusters. For example, a music piece may have multiple instruments, or it may have attributes of multiple genres. It inspires another way to estimate the proper equalization profile by considering all the clusters, instead of by using only the closest cluster. For example, a weighted sum can be used:

$$P_{eq} = \sum_{c=1}^{N} w_c P_c \qquad (27)$$

where N is the number of predefined clusters, and $w_c$ is the weight of the designed profile $P_c$ regarding each pre-defined music cluster (with index c), which should be normalized to 1 based on their corresponding confidence values. In this way, the estimated profile would be a mixture of the profiles of music clusters. For example, for a music piece having both attributes of Jazz and Rock, the estimated profile would be something in between.

In some applications, we may not want to involve all the clusters as shown in formula (27). Only a subset of the clusters the clusters most related to the current music piece need to be considered, the formula (27) can be slightly revised to:

$$P_{eq} = \sum_{c'=1}^{N'} w_{c'} P_{c'} \qquad (28)$$

where the N' is number of clusters to be considered, and c' is the cluster index after decreasingly sorting the clusters based on their confidence values. By using a subset, we can focus more on the most related clusters and exclude those less relevant. In other words, the adjusting unit 300D may be configured to consider at least one dominant audio type based on the confidence values.

In the description above, music clusters are taken as example. In fact, the solutions are applicable to audio types on any hierarchical level as discussed in Section 1.1. Therefore, in general, the adjusting unit 300D may be configured to assign an equalization level and/or equalization profile and/or spectral balance preset to each audio type.

5.4 Control Based on Context Type

In the previous sections, discussion is focused on various content types. In more embodiments to be discussed in this section, context type may be alternatively or additionally considered.

In general, the equalizer is enabled for music but disabled for movie-like media content since equalizer may make dialogs in movie-like media not sound so good due to obvious timbre change. It indicates that the equalization level may be related to the confidence value of the long-term music and/or the confidence value of movie-like media:

$$L_{eq} \propto \mathrm{Conf}_{MUSIC} \qquad (29)$$

Or $$L_{eq} \propto 1 - \mathrm{Conf}_{MOVIE} \qquad (30)$$

where $L_{eq}$ is the equalization level, $\mathrm{Conf}_{MUSIC}$ and $\mathrm{Conf}_{MOVIE}$ stands for the confidence value of long-term music and movie-like media.

That is, the adjusting unit 300D may be configured to positively correlate an equalization level with a confidence value of long-term music, or negatively correlate the equalization level with a confidence value of movie-like media.

That is, for a movie-like media signal, the movie-like media confidence value is high (or music confidence is low), and thus the equalization level is low; on the other hand, for a music signal, the movie-like media confidence value will be low (or music confidence is high) and thus the equalization level is high.

The solutions shown in formula (29) and (30) may be modified in the same manner as formula (22) to (25), and/or may be combined with any one of the solutions shown in formula (22) to (25).

Additionally or alternatively, the adjusting unit 300D may be configured to negatively correlate the equalization level with a confidence value of game.

As another embodiment, the confidence value may be used to derive a normalized weight as discussed in Section 1.4. Supposing an expected equalization level/profile is predefined for each context type (equalization profiles are shown in the following Table 2), a formula similar to formula (9) can be also applied.

TABLE 2

|  | MOVIE-LIKE MEDIA | LONG-TERM MUSIC | VoIP | GAME |
|---|---|---|---|---|
| equalization profile | Profile 1 | Profile 2 | Profile 3 | Profile 4 |

Here, in some profiles, all the gains can be set to zero, as a way to disable the equalizer for that certain context type, such as movie-like media and game.

5.5 Combination of Embodiments and Application Scenarios

Similar to Part 1, all the embodiments and variants there of discussed above may be implemented in any combination thereof, and any components mentioned in different parts/embodiments but having the same or similar functions may be implemented as the same or separate components.

For example, any two or more of the solutions described in Sections 5.1 to 5.4 may be combined with each other. And any of the combinations may be further combined with any embodiment described or implied in Parts 1-4 and the other parts that will be described later.

5.6 Equalizer Controlling Method

Similar to Part 1, in the process of describing the equalizer controller in the embodiments hereinbefore, apparently disclosed are also some processes or methods. Hereinafter a summary of these methods is given without repeating some of the details already discussed hereinbefore.

Firstly, the embodiments of the audio processing method as discussed in Part 1 may be used for an equalizer, the parameter(s) of which is one of the targets to be adjusted by the audio processing method. From this point of view, the audio processing method is also an equalizer controlling method.

In this section, only those aspects specific to the control of the equalizer will be discussed. For general aspects of the controlling method, reference may be made to Part 1.

According to embodiments, an equalizer controlling method may comprise identifying the audio type of an audio signal in real time, and adjusting an equalizer in a continuous manner based on the confidence value of the audio type as identified.

Similar to other parts of the present application, when involving multiple audio types with corresponding confidence values, the operation of adjusting 1104 may be configured to consider at least some of the multiple audio types through weighting the confidence values of the multiple audio types based on the importance of the multiple audio types, or through weighting the effects of the multiple audio types based on the confidence values. Specifically, the adjusting operation 1104 may be configured to consider at least one dominant audio type based on the confidence values.

As described in Part 1, the adjusted parameter value may be smoothed. Reference may be made to Section 1.5 and Section 1.8, and detailed description is omitted here.

The audio type may be either content type or context type, or both. When involving the content type, the adjusting operation 1104 may be configured to positively correlate an equalization level with a confidence value of short-term music, and/or negatively correlate the equalization level with a confidence value of speech. Additionally or alternatively, the adjusting operation may be configured to positively correlate an equalization level with a confidence value of background, and/or negatively correlate the equalization level with a confidence value of noise.

When involving the context type, the adjusting operation 1104 may be configured to positively correlate an equalization level with a confidence value of long-term music, and/or negatively correlate the equalization level with a confidence value of movie-like media and/or game.

For the content type of short-term music, the adjusting operation 1104 may be configured to positively correlate an equalization level with a confidence value of short-term music without dominant sources, and/or negatively correlate the equalization level with a confidence value of short-term music with dominant sources. This can be done only when the confidence value for the short-term music is greater than a threshold.

Besides adjusting the equalization level, other aspects of an equalizer may be adjusted based on the confidence value(s) of the audio type(s) of an audio signal. For example, the adjusting operation 1104 may be configured to assign an equalization level and/or equalization profile and/or spectral balance preset to each audio type.

About the specific instances of the audio types, reference may be made to Part 1.

Similar to the embodiments of the audio processing apparatus, any combination of the embodiments of the audio processing method and their variations are practical on one hand; and on the other hand, every aspect of the embodiments of the audio processing method and their variations may be separate solutions. In addition, any two or more solutions described in this section may be combined with each other, and these combinations may be further combined with any embodiment described or implied in the other parts of this disclosure.

Part 6: Audio Classifiers and Classifying Methods

As stated in Sections 1.1 and 1.2, the audio types discussed in the present application, including various hierarchical levels of content types and context types, can be classified or identified with any existing classifying scheme, including machine-learning based methods. In this part and the subsequent part, the present application proposes some novel aspects of classifiers and methods for classifying context types as mentioned in the previous parts.

6.1 Context Classifier Based on Content Type Classification

As stated in the previous parts, the audio classifier 200 is used to identify the content type of an audio signal and/or identify the context type of the audio signal. Therefore, the audio classifier 200 may comprises an audio content classifier 202 and/or an audio context classifier 204. When adopting existing techniques to implement the audio content classifier 202 and the audio context classifier 204, the two classifiers may be independent from each other, although they may share some features and thus may share some schemes for extracting the features.

In this part and the subsequent Part 7, according to the novel aspect proposed in the present application, the audio context classifier 204 may make use of the results of the audio content classifier 202, that is, the audio classifier 200 may comprise: an audio content classifier 202 for identifying the content type of an audio signal; and an audio context classifier 204 for identifying the context type of the audio signal based on the results of the audio content classifier 202. Thus, the classification results of the audio content 202 may be used by both the audio context classifier 204 and the adjusting unit 300 (or the adjusting units 300A to 300D) as discussed in the previous parts. However, although not shown in the drawings, the audio classifier 200 may also contain two audio content classifiers 202 to be used respectively by the adjusting unit 300 and the audio context classifier 204.

Further, as discussed in Section 1.2, especially when classifying multiple audio types, either the audio content classifier 202 or the audio context classifier 204 may be comprised a group of classifiers cooperating with each other, although it is also possible to be implemented as one single classifier.

As discussed in Section 1.1, the content type is a kind of audio type with respect to short-term audio segments generally having a length in the order of several to several tens of frames (such as 1 s), and the context type is a kind of audio type with respect to long-term audio segments generally having a length in the order of several to several tens of seconds (such as 10 s). Therefore, corresponding to "content type" and "context type", we use "short-term" and "long-term" respectively when necessary. However, as will be discussed in the subsequent Part 7, although the context type is for indicating the property of the audio signal in a relatively long timescale, it can also be identified based on features extracted from short-term audio segments.

Figure 24:
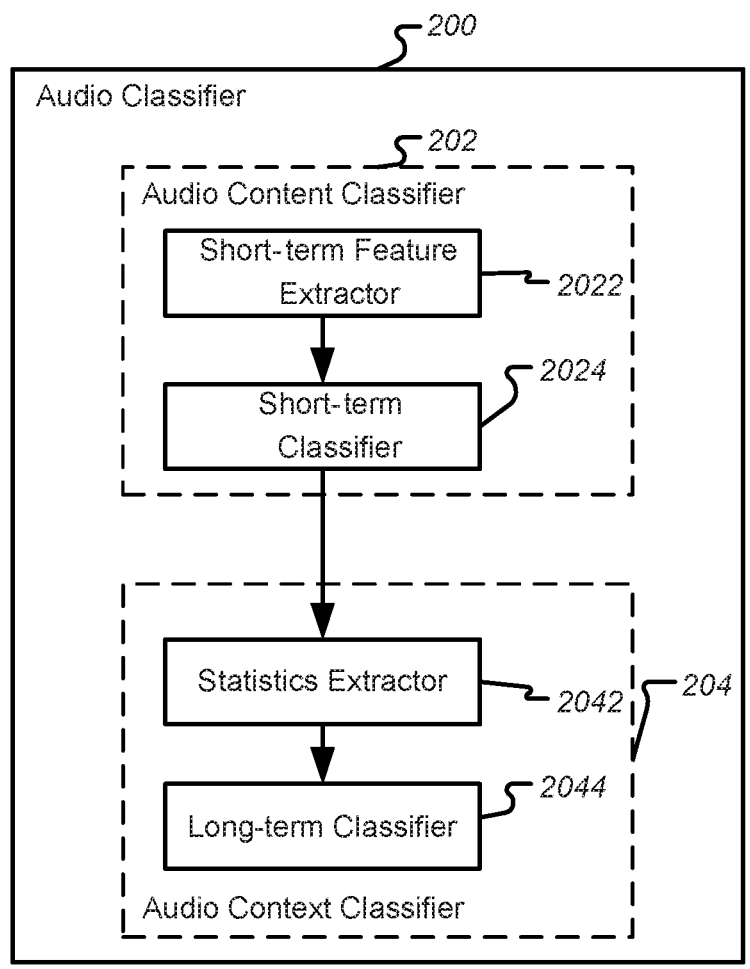
FIG. 24 is a diagram illustrating an audio classifier according to an embodiment of the present application.

Now turn to the structures of the audio content classifier 202 and the audio context classifier 204 with reference to FIG. 24.

As shown in FIG. 24, the audio content classifier 202 may comprise a short-term feature extractor 2022 for extracting short-term features from short-term audio segments each comprising a sequence of audio frames; and a short-term classifier 2024 for classifying a sequence of short-term segments in a long-term audio segment into short-term audio types using respective short-term features. Both the short-term feature extractor 2022 and the short-term classifier 2024 may be implemented with existing techniques, but also some modifications are proposed for the short-term feature extractor 2022 in subsequent Section 6.3.

The short-term classifier 2024 may be configured to classify each of the sequence of short-term segments into at least one of the following short-term audio types (content types): speech, short-term music, background sound and noise, which have been explained in Section 1.1. Each of the content type may be further classified into content types on lower hierarchical level, such as discussed in Section 1.1 but not limited thereto.

As known in the art, confidence values of the classified audio types may also be obtained by the short-term classifier 2024. In the present application, when mentioning the operation of any classifier, it shall be understood that confidence values are obtained at the same time if necessary, whether or not it is explicitly recorded. An example of audio type classification may be found in L. Lu, H.-J. Zhang, and S. Li, "*Content-based Audio Classification and Segmentation by Using Support Vector Machines*", ACM Multimedia Systems Journal 8 (6), pp. 482-492, March, 2003, which is incorporated herein in its entirety by reference.

On the other hand, as shown in FIG. 24, the audio context classifier 204 may comprise a statistics extractor 2042 for calculating the statistics of the results of the short-term classifier with respect to the sequence of short-term segments in the long-term audio segment, as long-term features; and a long-term classifier 2044 for, using the long-term features, classifying the long-term audio segment into long-term audio types. Similarly, both the statistics extractor 2042 and the long-term classifier 2044 may be implemented with existing techniques, but also some modifications are proposed for the statistics extractor 2042 in subsequent Section 6.2.

The long-term classifier 2044 may be configured to classify the long-term audio segment into at least one of the following long-term audio types (context types): movie-like media, long-term music, game and VoIP, which have been explained in Section 1.1. Alternatively or additionally, The long-term classifier 2044 may be configured to classify the long-term audio segment into VoIP or non-VoIP, which have been explained in Section 1.1. Alternatively or additionally, The long-term classifier 2044 may be configured to classify the long-term audio segment into high-quality audio or low-quality audio, which have been explained in Section 1.1. In practice, various target audio types can be chosen and trained based on the needs of application/system.

About the meaning and selection of the short-term segment and long-term segment (as well as frame to be discussed in Section 6.3), reference may be made to Section 1.1.

6.2 Extraction of Long-Term Features

As shown in FIG. 24, in one embodiment, only the statistics extractor 2042 is used to extract long-term features from the results of the short-term classifier 2024. As long-term features, at least one of the following may be calculated by the statistics extractor 2042: mean and variance of confidence values of the short-term audio types of the short-term segments in the long-term segment to be classified, the mean and the variance weighted by the importance degrees of the short-term segments, occurrence frequency of each short-term audio type and frequency of transitions between different short-term audio types in the long-term segment to be classified.

Figure 25:
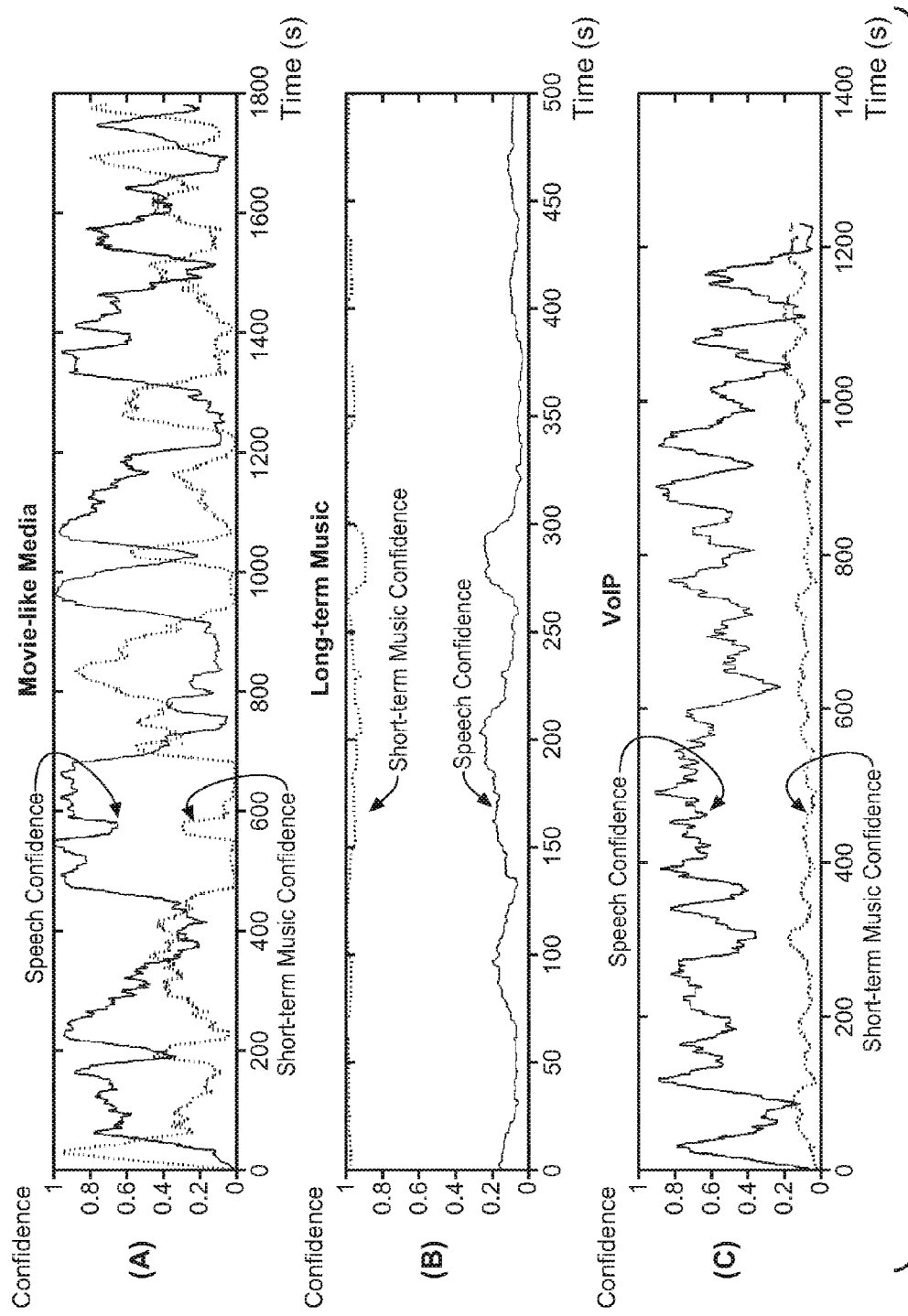
FIGS. 25 and 26 are diagrams illustrating some features to be used by the audio classifier of the present application.

We illustrate in FIG. 25 the mean of the speech and short-term music confidence values in each short-term segment (of a length of 1 s). For comparison, the segments are extracted from three different audio contexts: movie-like media (FIG. 25(A)), long-term music (FIG. 25(B)), and VoIP (FIG. 25(C)). It can be observed that for movie-like media context, high confidence values are gained either for speech type or for music type and it alternates between these two audio types frequently. By contrast, the segment of long-term music gives a stable and high short-term music confidence value and a relatively stable and low speech confidence value. Whereas the segment of VoIP gives a stable and low short-term music confidence value, but gives fluctuating speech confidence values because of the pauses during the VoIP conversation.

Figure 26:
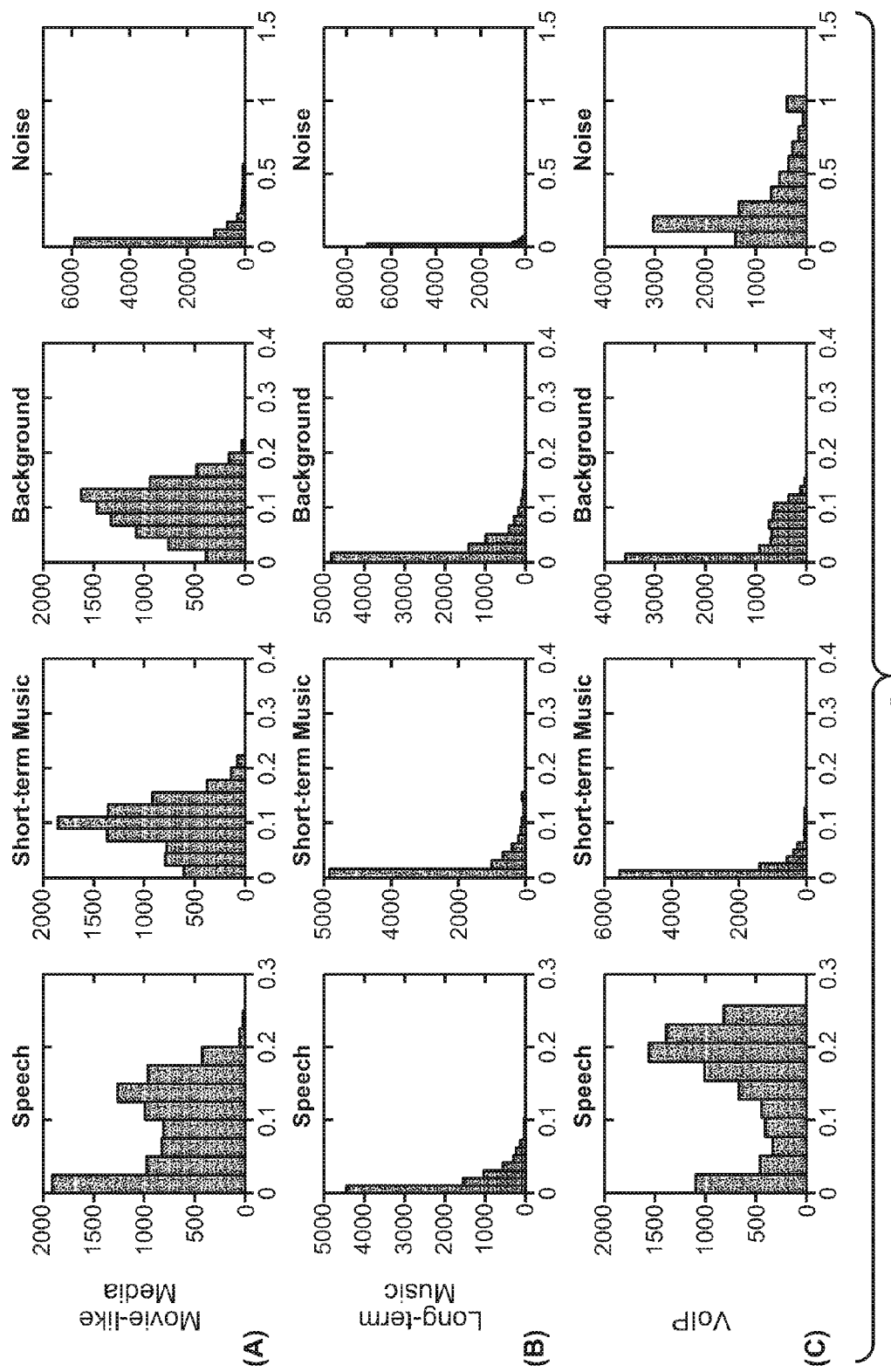

The variance of the confidence values for each audio type is also an important feature for classifying different audio contexts. FIG. 26 gives histograms of the variance of the confidence values of speech, short-term music, background and noise in movie-like media, long-term music and VoIP audio contexts (the abscissa is the variance of confidence values in a dataset, and the ordinate is the number of occurrences of each bin of variance values s in the dataset, which can be normalized to indicate the occurrence probability of each bin of variance values). For movie-like media, all the variances of confidence value of speech, short-term music and background are relatively high and widely distributed, indicating that the confidence values of those audio types are changing intensively; For long-term music, all the variances of confidence value of speech, short-term music, background and noise are relatively low and narrowly distributed, indicating that the confidence values of those audio types are keeping stable: speech confidence value keeps constantly low and music confidence value keeps constantly high; For VoIP, the variances of confidence value of short-term music are low and narrowly distributed, whereas that of speech are relatively widely distributed, which is due to frequent pauses during VoIP conversations.

About the weights used in calculating the weighted mean and variance, they are determined based on each short-term segment's importance degree. The important degree of a short-term segment may be measured by its energy or loudness, which can be estimated with many existing techniques.

The occurrence frequency of each short-term audio type in the long-term segment to be classified is the count of each audio type to which the short-term segments in the long-term segment have been classified, normalized with the length of the long-term segment.

The frequency of transitions between different short-term audio types in the long-term segment to be classified is the count of audio type changes between adjacent short-term segments in the long-term segment to be classified, normalized with the length of the long-term segment.

When discussing the mean and the variance of the confidence values with reference to FIG. 25, the occurrence frequency of each short-term audio type and the transition frequency among those different short-term audio types are also touched in fact. These features are also highly relevant to audio context classification. For example, the long-term music mostly contains short-term music audio type so it has high occurrence frequency of short-term music, whereas the VoIP mostly contains speech and pauses so it has high occurrence frequency of speech or noise. For another example, the movie-like media transits among different short-term audio types more frequently than long-term music or VoIP does, so it generally has a higher transition frequency among short-term music, speech and background; VoIP usually transits between speech and noise more frequently than the others do, so it generally has a higher transition frequency between speech and noise.

Generally, we assume the long-term segments are of the same length in the same application/system. If this is the case, then the occurrence count of each short-term audio type, and the transition count between different short-term audio types in the long-term segment may be directly used without normalization. If the length of the long-term segment is variable, then the occurrence frequency and the frequency of transitions as mentioned above shall be used. And the claims in the present application shall be construed as covering both situations.

Additionally or alternatively, the audio classifier 200 (or the audio context classifier 204) may further comprise a long-term feature extractor 2046 (FIG. 27) for extracting further long-term features from the long-term audio segment based on the short-term features of the sequence of short-term segments in the long-term audio segment. In other words, the long-term feature extractor 2046 does not use the classification results of the short-term classifier 2024, but directly use the short-term features extracted by the short-term feature extractor 2022 to derive some long-term features to be used by the long-term classifier 2044. The long-term feature extractor 2046 and the statistics extractor 2042 may be used independently or jointly. In other words, the audio classifier 200 may comprise either the long-term feature extractor 2046 or the statistics extractor 2042, or both.

Any features can be extracted by the long-term feature extractor 2046. In the present application, it is proposed to calculate, as the long-term features, at least one of the following statistics of the short-term features from the short-term feature extractor 2022: mean, variance, weighted mean, weighted variance, high average, low average, and ratio (contrast) between the high average and the low average.

Mean and variance of the short-term features extracted from the short-term segments in the long-term segment to be classified;

Weighted mean and variance of the short-term features extracted from the short-term segments in the long-term segment to be classified. The short-term features are weighted based on each short-term segment's importance degree that is measured with its energy or loudness as mentioned just now;

High average: an average of selected short-term features extracted from the short-term segments in the long-term segment to be classified. The short-term features are selected when meeting at least one of the following conditions: greater than a threshold; or within a predetermined proportion of short-term features not lower than all the other short-term features, for example, the highest 10% of the short-term features;

Low average: an average of selected short-term features extracted from the short-term segments in the long-term segment to be classified. The short-term features are selected when satisfying at least one of the following conditions: smaller than a threshold; or within a predetermined proportion of the short-term features not higher than all the other short-term features, for example, the lowest 10% of the short-term features; and Contrast: a ratio between the high average and the low average to represent the dynamic of the short-term features in a long-term segment.

The short-term feature extractor 2022 may be implemented with existing techniques, and any features can be extracted thereby. Nevertheless, some modifications are proposed for the short-term feature extractor 2022 in subsequent Section 6.3.

6.3 Extraction of Short-Term Features

Figure 27:
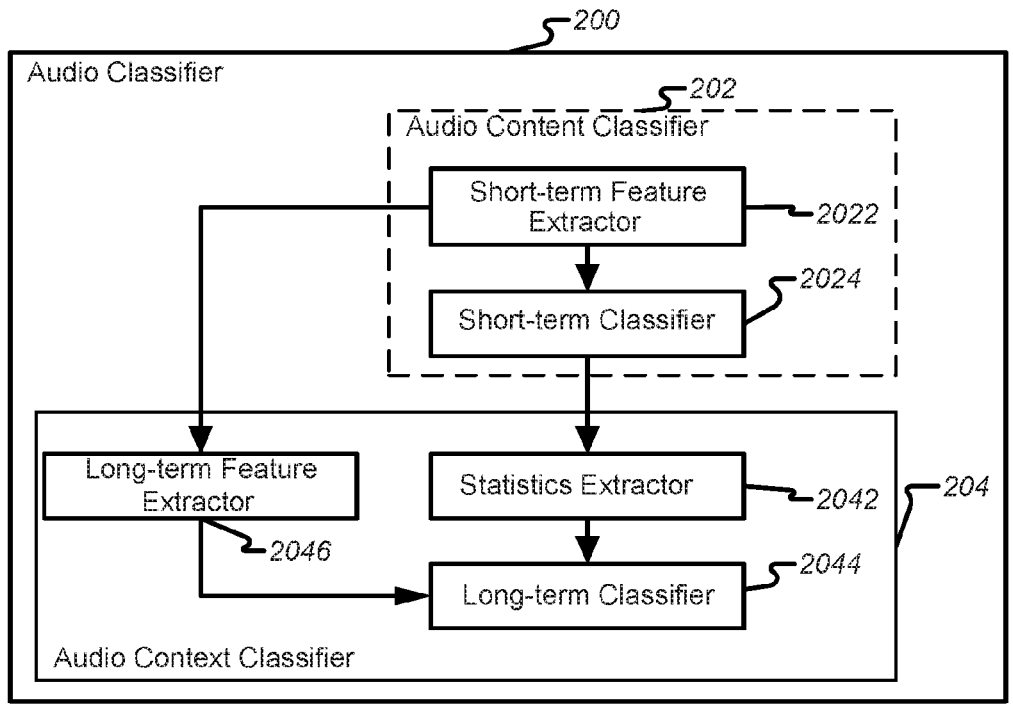
FIGS. 27-29 are diagrams illustrating more embodiments of the audio classifier according to the present application.

As shown in FIG. 24 and FIG. 27, the short-term feature extractor 2022 may be configured to extract, as short-term features, at least one of the following features directly from each short-term audio segment: rhythmic characteristics, interruptions/mutes characteristics and short-term audio quality features.

The rhythmic characteristics may include rhythm strength, rhythm regularity, rhythm clarity (see L. Lu, D. Liu, and H.-J. Zhang. "*Automatic mood detection and tracking of music audio signals*". IEEE Transactions on Audio, Speech, and Language Processing, 14(1):5-18, 2006, which is incorporated herein in its entirety by reference) and 2D sub-band modulation (M. F McKinney and J. Breebaart. "*Features for audio and music classification*", Proc. ISMIR, 2003, which is incorporated herein in its entirety by reference).

The interruptions/mutes characteristics may include speech interruptions, sharp declines, mute length, unnatural silence, mean of unnatural silence, total energy of unnatural silence, etc.

The short-term audio quality features are audio quality features with respect to short term segments, which are similar to audio quality features extracted from audio frames, which are to be discussed below.

Figure 28:
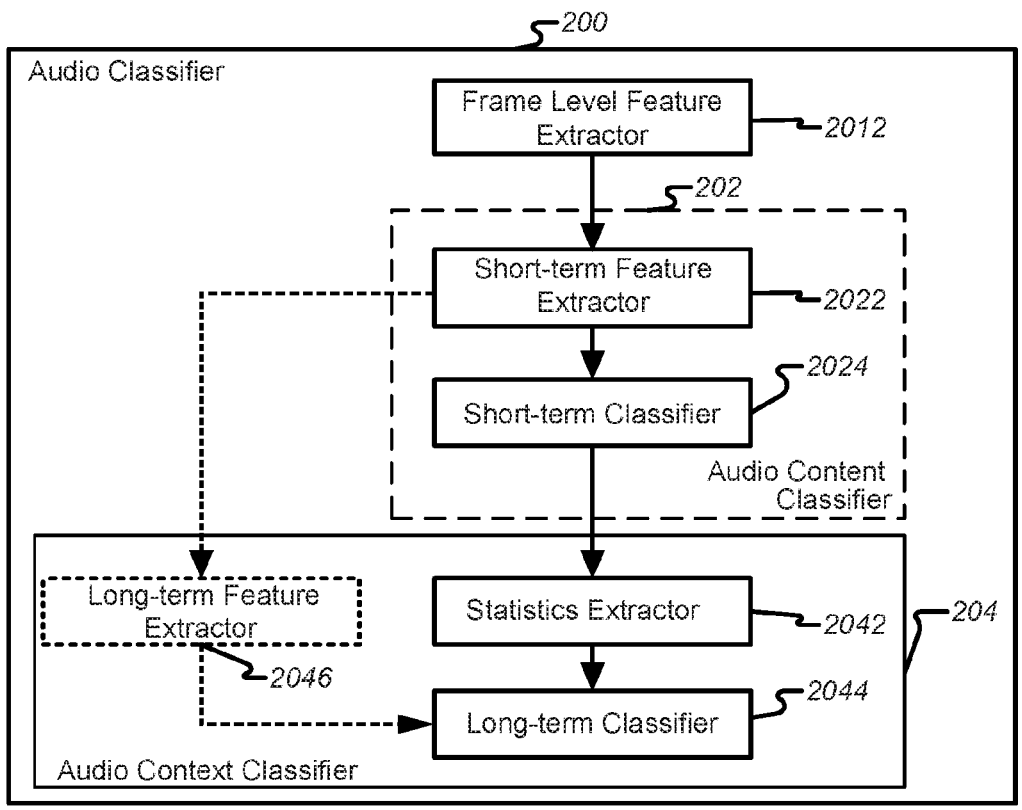

Alternatively or additionally, as shown in FIG. 28, the audio classifier 200 may comprise a frame-level feature extractor 2012 for extracting frame-level features from each of the sequence of audio frames comprised in a short-term segment, and the short-term feature extractor 2022 may be configured to calculate short-term features based on the frame-level features extracted from the sequence of audio frames.

As pre-processing, the input audio signal may be downmixed to a mono audio signal. The pre-processing is unnecessary if the audio signal is already a mono signal. It is then divided into frames with a predefined length (typically 10 to 25 milliseconds). Correspondingly, frame-level features are extracted from each frame.

The frame-level feature extractor 2012 may be configured to extract at least one of the following features: features characterizing properties of various short-term audio types, cutoff frequency, static signal-noise-ratio (SNR) characteristics, segmental signal-noise-ratio (SNR) characteristics, basic speech descriptors, and vocal tract characteristics.

The features characterizing properties of various short-term audio types (especially speech, short-term music, background sound and noise) may comprise at least one of the following features: frame energy, sub-band spectral distribution, spectral flux, Mel-frequency Cepstral Coefficient (MFCC), bass, residual information, Chroma feature and zero-crossing rate.

For detail of MFCC, reference may be made to L. Lu, H.-J. Zhang, and S. Li, "*Content-based Audio Classification* and Segmentation by Using Support Vector Machines", ACM Multimedia Systems Journal 8 (6), pp. 482-492, March, 2003, which is incorporated herein in its entirety by reference. For detail of Chroma feature, reference may be made to G. H. Wakefield, "Mathematical representation of joint time Chroma distributions" in SPIE, 1999, which is incorporated herein in its entirety by reference.

The cutoff frequency represents an audio signal's highest frequency above which the energy of the content is close to zero. It is designed to detect band limited content, which is useful in this application for audio context classification. A cutoff frequency is usually caused by coding, as most coders discard high frequencies at low or medium bitrates. For example, MP3 codec has a cutoff frequency of 16 kHz at 128 kbps; For another example, many popular VoIP codecs have a cutoff frequency of 8 kHz or 16 kHz.

Besides the cutoff frequency, signal degradation during the audio encoding process is considered as another characteristic for differentiating various audio contexts such as VoIP vs. non-VoIP contexts, high-quality vs. low-quality audio contexts. The features representing the audio quality, such as those for objective speech quality assessment (see Ludovic Malfait, Jens Berger, and Martin Kastner, "*P.563—The ITU-T Standard for Single-Ended Speech Quality Assessment*", IEEE Transaction on Audio, Speech, and Language Processing, VOL. 14, NO. 6, November 2006, which in incorporated herein in its entirety by reference), may be further extracted in multiple levels to capture richer characteristics. Examples of the audio quality features include:

a) Static SNR characteristics including estimated background noise level, spectral clarity, etc.
b) Segmental SNR characteristics including spectral level deviation, spectral level range, relative noise floor, etc.
c) Basic speech descriptors including pitch average, speech section level variation, speech level, etc.
d) Vocal tract characteristics including robotization, pitch cross power, etc.

For deriving the short-term features from the frame-level features, the short-term feature extractor 2022 may be configured to calculate statistics of the frame-level features, as the short-term features.

Examples of the statistics of the frame-level features include mean and standard deviation, which captures the rhythmic properties to differentiate various audio types, such as short-term music, speech, background and noise. For example, speech usually alternates between voiced and unvoiced sounds at a syllable rate whereas music does not, indicating that the variation of the frame-level features of speech is usually larger than that of music.

Another example of the statistics is the weighted average of the frame-level features. For example, for the cutoff frequency, the weighted average among the cutoff frequencies derived from every audio frames in a short-term segment, with the energy or loudness of each frame as weight, would be the cutoff frequency for that short-term segment.

Figure 29:
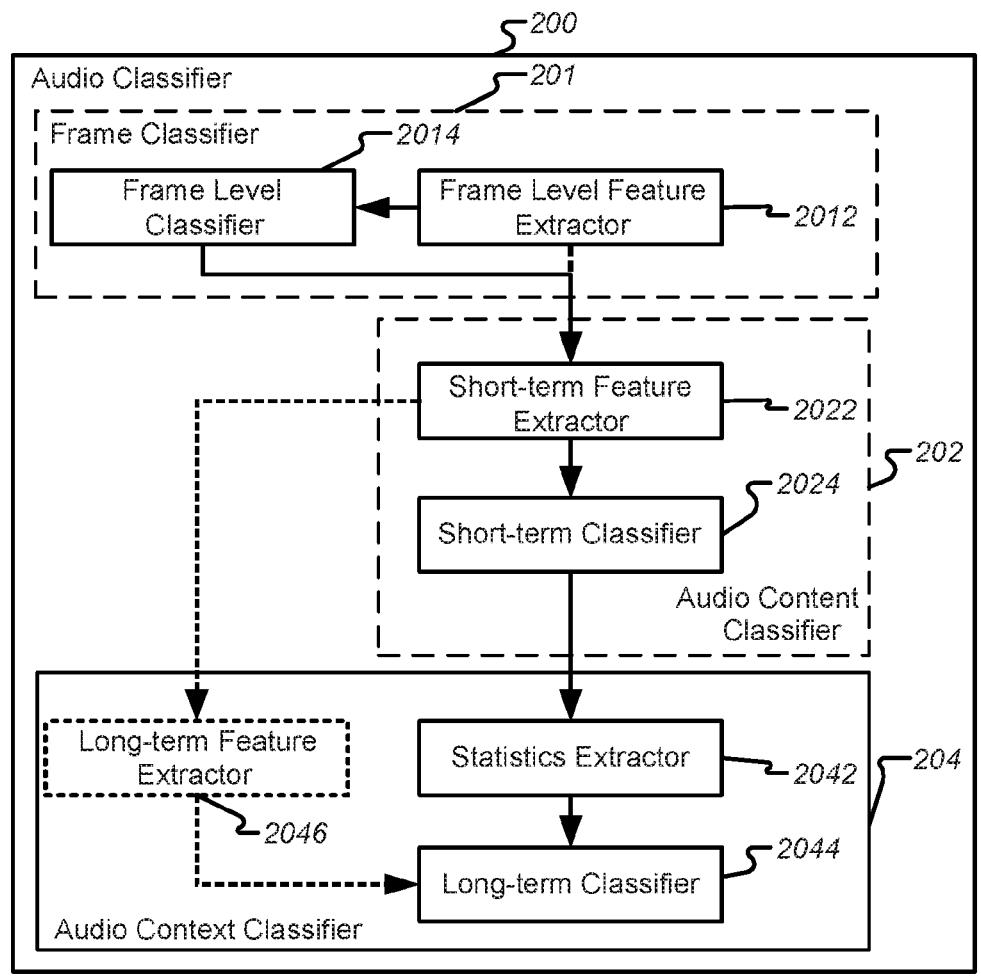

Alternatively or additionally, as shown in FIG. 29, the audio classifier 200 may comprise a frame-level feature extractor 2012 for extracting frame-level features from audio frames and a frame-level classifier 2014 for classifying each of the sequence of audio frames into frame-level audio types using respective frame-level features, wherein the short-term feature extractor 2022 may be configured to calculate the short-term features based on the results of the frame-level classifier 2014 with respect to the sequence of audio frames.

In other words, in addition to the audio content classifier 202 and the audio context classifier 204, the audio classifier 200 may further comprise a frame classifier 201. In such an architecture, the audio content classifier 202 classifies a short-term segment based on the frame-level classification results of the frame classifier 201, and the audio context classifier 204 classifies a long-term segment based on the short-term classification results of the audio content classifier 202.

The frame-level classifier 2014 may be configured to classify each of the sequence of audio frames into any classes, which may be referred to as "frame-level audio types". In one embodiment, the frame-level audio types may have an architecture similar to the architecture of the content types discussed hereinbefore and have also meaning similar to the content types, and the only difference is the frame-level audio types and the content types are classified at different levels of the audio signal, that is frame-level and short-term segment level. For example, the frame-level classifier 2014 may be configured to classify each of the sequence of audio frames into at least one of the following frame-level audio types: speech, music, background sound and noise. On the other hand, the frame-level audio types may also have an architecture partly or completely different from the architecture of the content types, more suitable to the frame-level classification, and more suitable to be used as the short-term features for short-term classification. For example, the frame-level classifier 2014 may be configured to classify each of the sequence of audio frames into at least one of the following frame-level audio types: voiced, unvoiced, and pause.

About how to derive short-term features from the results of the frame-level classification, a similar scheme may be adopted by referring to the description in Section 6.2.

As an alternative, both short-term features based on the results of the frame-level classifier 2014 and short-term features directly based on the frame-level features obtained by the frame-level feature extractor 2012 may be used by the short-term classifier 2024. Therefore, the short-term feature extractor 2022 may be configured to calculate the short-term features based on both the frame-level features extracted from the sequence of audio frames and the results of the frame-level classifier with respect to the sequence of audio frames.

In other words, the frame-level feature extractor 2012 may be configured to calculate both statistics similar to those discussed in Section 6.2 and those short-term features described in connection with FIG. 28, including at least one of the following features: features characterizing properties of various short-term audio types, cutoff frequency, static signal-noise-ratio characteristics, segmental signal-noise-ratio characteristics, basic speech descriptors, and vocal tract characteristics.

For working in real time, in all the embodiments the short-term feature extractor 2022 may be configured to work on the short-term audio segments formed with a moving window sliding in the temporal dimension of the long-term audio segment at a predetermined step length. About the moving window for the short-term audio segment, as well as the audio frame and the moving window for the long-term audio segment, reference may be made to Section 1.1 for detail.

6.4 Combination of Embodiments and Application Scenarios

Similar to Part 1, all the embodiments and variants there discussed above may be implemented in any combination thereof, and any components mentioned in different parts/embodiments but having the same or similar functions may be implemented as the same or separate components.

For example, any two or more of the solutions described in Sections 6.1 to 6.3 may be combined with each other. And any of the combinations may be further combined with any embodiment described or implied in Parts 1-5 and the other parts that will be described later. Especially, the type smoothing unit 712 discussed in Part 1 may be used in this part as a component of the audio classifier 200, for smoothing the results of the frame classifier 2014, or the audio content classifier 202, or the audio context classifier 204. Further, the timer 916 may also serve as a component of the audio classifier 200 to avoid abrupt change of the output of the audio classifier 200.

6.5 Audio Classifying Method

Similar to Part 1, in the process of describing the audio classifier in the embodiments hereinbefore, apparently disclosed are also some processes or methods. Hereinafter a summary of these methods is given without repeating some of the details already discussed hereinbefore.

Figure 30:
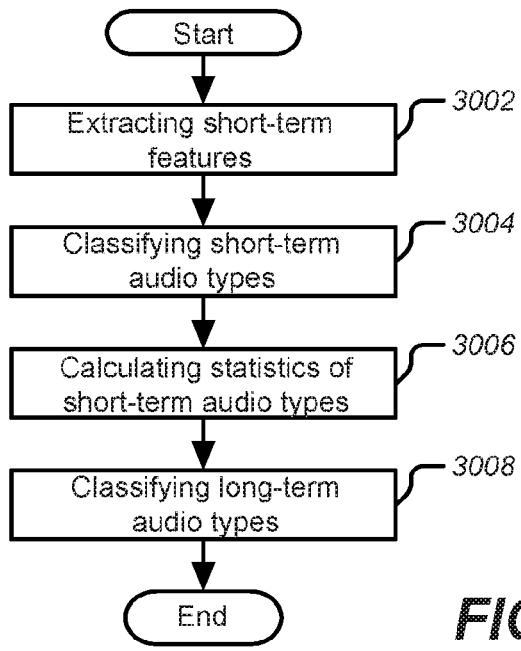
FIGS. 30-33 are flow charts illustrating an audio classifying method according to embodiments of the present application.

In one embodiment, as shown in FIG. 30, an audio classifying method is provided. To identify the long-term audio type (that is context type) of a long-term audio segment comprised of a sequence of short-term audio segments (either overlapped or non-overlapped with each other), the short-term audio segments are firstly classified (operation 3004) into short-term audio types, that is content types, and long-term features are obtained by calculating (operation 3006) the statistics of the results of classifying operation with respect to the sequence of short-term segments in the long-term audio segment. Then the long-term classifying (operation 3008) may be performed using the long-term features. The short-term audio segment may comprise a sequence of audio frames. Of course, for identifying the short-term audio type of the short-term segments, short-term features need be extracted from them (operation 3002).

The short-term audio types (content types) may include but is not limited to speech, short-term music, background sound and noise.

The long-term features may include but is not limited to: mean and variance of confidence values of the short-term audio types, the mean and the variance weighted by the importance degrees of the short-term segments, occurrence frequency of each short-term audio type and frequency of transitions between different short-term audio types.

Figure 31:
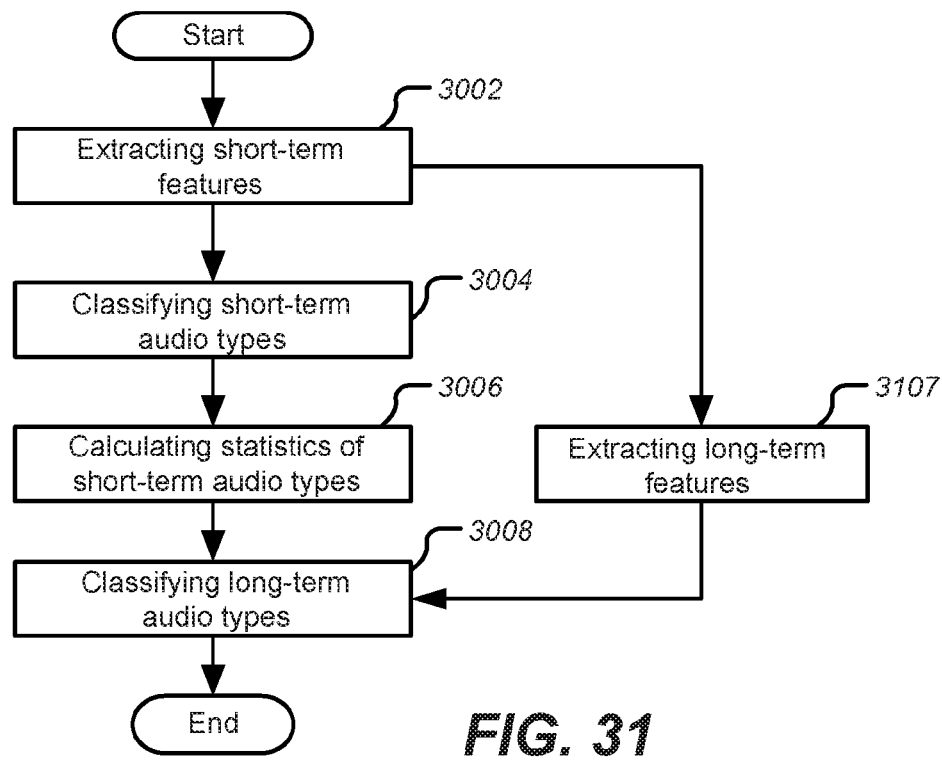

In a variant, as shown in FIG. 31, further long-term features may be obtained (operation 3107) directly based on the short-term features of the sequence of short-term segments in the long-term audio segment. Such further long-term features may include but are not limited to the following statistics of the short-term features: mean, variance, weighted mean, weighted variance, high average, low average, and ratio between the high average and the low average.

There are different ways for extracting the short-term features. One is to directly extract the short-term features from the short-term audio segment to be classified. Such features include but are not limited to rhythmic characteristics, interruptions/mutes characteristics and short-term audio quality features.

Figure 32:
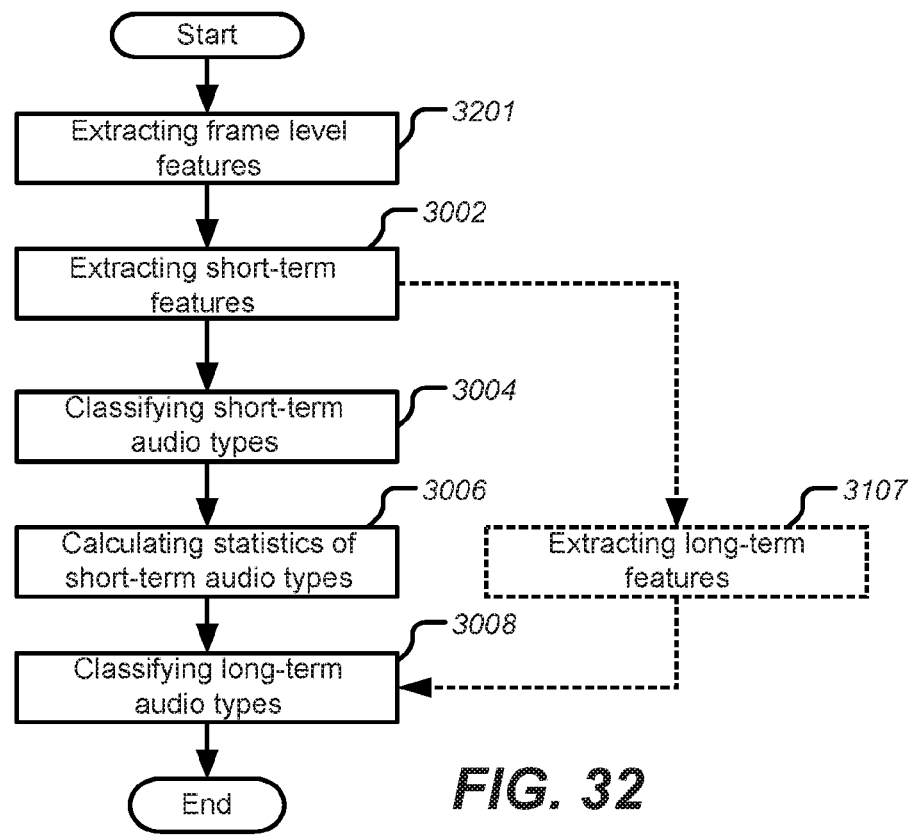

The second way is to extract frame-level features from the audio frames comprised in each short-term segment (operation 3201 in FIG. 32), and then calculate short-term features based on the frame-level features, such as calculate statistics of the frame-level features as the short-term features. The frame-level features may comprise but are not limited to: features characterizing properties of various short-term audio types, cutoff frequency, static signal-noise-ratio characteristics, segmental signal-noise-ratio characteristics, basic speech descriptors, and vocal tract characteristics. The features characterizing properties of various short-term audio types may further comprise frame energy, sub-band spectral distribution, spectral flux, Mel-frequency Cepstral Coefficient, bass, residual information, Chroma feature and zero-crossing rate.

The third way is to extract the short-term features in a manner similar to extraction of the long-term features: after extracting the frame-level features from audio frames in a short-term segment to be classified (operation 3201), classifying each audio frame into frame-level audio types using respective frame-level features (operation 32011 in FIG. 33); and the short-term features may be extracted (operation 3002) by calculating the short-term features based on the frame-level audio types (optionally including the confidence values). The frame-level audio types may have properties and an architecture similar to the short-term audio type (content type), and may also include speech, music, background sound and noise.

Figure 33:
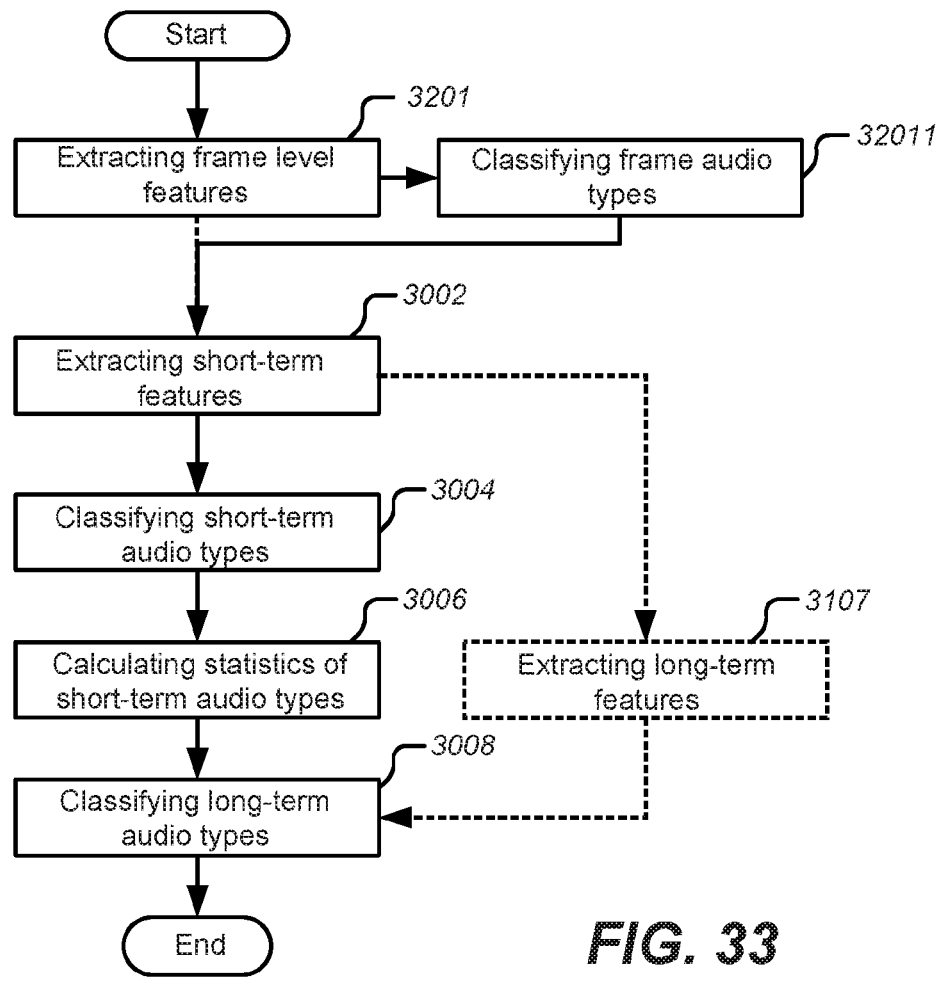

The second way and the third way may be combined together as shown by the dashed arrow in FIG. 33.

As discussed in Part 1, both short-term audio segments and long-term audio segments may be sampled with moving windows. That is, the operation of extracting short-term features (operation 3002) may be performed on short-term audio segments formed with a moving window sliding in the temporal dimension of the long-term audio segment at a predetermined step length, and the operation of extracting long-term features (operation 3107) and the operation of calculating statistics of short-term audio types (operation 3006) may also be performed on long-term audio segments formed with a moving window sliding in the temporal dimension of the audio signal at a predetermined step length.

Similar to the embodiments of the audio processing apparatus, any combination of the embodiments of the audio processing method and their variations are practical on one hand; and on the other hand, every aspect of the embodiments of the audio processing method and their variations may be separate solutions. In addition, any two or more solutions described in this section may be combined with each other, and these combinations may be further combined with any embodiment described or implied in the other parts of this disclosure. Especially, as already discussed in Section 6.4, the smoothing schemes and the transition scheme of audio types may be a part of the audio classifying method discussed here.

Part 7: VoIP Classifiers and Classifying Methods

In Part 6 a novel audio classifier is proposed for classifying an audio signal into audio context types at least partly based on the results of content type classification. In the embodiments discussed in Part 6, long-term features are extracted from a long-term segment of a length of several to several tens of seconds, thus the audio context classification may cause long latency. It is desired that the audio context may also be classified in real time or nearly in real time, such as at the short-term segment level.

7.1 Context Classification Based on Short-Term Segment

Figure 34:
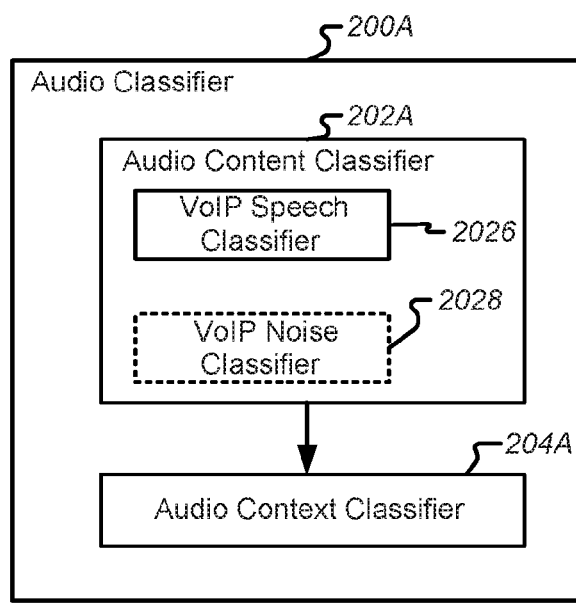
FIG. 34 is a diagram illustrating an audio classifier according to another embodiment of the present application.

Therefore, as shown in FIG. 34, an audio classifier 200A is provided, comprising audio content classifier 202A for identifying a content type of a short-term segment of an audio signal, and an audio context classifier 204A for identifying a context type of the short-term segment at least partly based on the content type identified by the audio content classifier.

Here the audio content classifier 202A may adopt the techniques already mentioned in Part 6, but may also adopt different techniques as will be discussed below in Section 7.2. Also, the audio context classifier 204A may adopt the techniques already mentioned in Part 6, with a difference that the context classifier 204A may directly use the results of the audio content classifier 202A, rather than use the statistics of the results from the audio content classifier 202A since both the audio context classifier 204A and the audio content classifier 202A are classifying the same short-term segment. Further, similar to Part 6, in addition to the results from the audio content classifier 202A, the audio context classifier 204A may use other features directly extracted from the short-term segment. That is, the audio context classifier 204A may be configured to classify the short-term segment based on a machine-learning model by using, as features, the confidence values of the content types of the short-term segment and other features extracted from the short-term segment. About the features extracted from the short-term segment, reference may be made to Part 6.

The audio content classifier 200A may simultaneously label the short-term segment as more audio types than VoIP speech/noise and/or non-VoIP speech/noise (VoIP speech/noise and non-VoIP speech/noise will be discussed below in Section 7.2), and each of the multiple audio types may have its own confidence value as discussed in Section 1.2. This can achieve better classification accuracy since richer information can be captured. For example, joint information of the confidence values of speech and short-term music reveals to what extent the audio content is likely to be a mixture of speech and background music so that it can be discriminated from pure VoIP content.

7.2 Classification Using VoIP Speech and VoIP Noise

This aspect of the present application is especially useful in a VoIP/non-VoIP classification system, which would be required to classify the current short-term segment for short decision latency.

For this purpose, as shown in FIG. 34, the audio classifier 200A is specially designed for VoIP/non-VoIP classification. For classifying VoIP/non-VoIP, a VoIP speech classifier 2026 and/or a VoIP noise classifier are developed to generate intermediate results for final robust VoIP/non-VoIP classification by the audio context classifier 204A.

A VoIP short-term segment would contain VoIP speech and VoIP noise alternatively. It is observed that high accuracy can be achieved to classify a short-term segment of speech into VoIP speech or non-VoIP speech, but not so for classifying a short-term segment of noise into VoIP noise or non-VoIP noise. Thus, it can be concluded that it will blur the discriminability by directly classifying the short-term segment into VoIP (comprising VoIP speech and VoIP noise but with VoIP speech and VoIP noise not specifically identified) and non-VoIP without considering the difference between speech and noise and thus with the features of these two content types (speech and noise) mixed together.

It is reasonable for classifiers to achieve higher accuracies for VoIP speech/non-VoIP speech classification than for VoIP noise/non-VoIP noise classification as speech contains more information than noise does and such features as cutoff frequency are more effective for classifying speech. According to the weight ranking obtained from adaBoost training process, the top weighted short-term features for VoIP/non-VoIP speech classification are: standard deviation of logarithm energy, cutoff frequency, standard deviation of rhythmic strength, and standard deviation of spectral flux. The standard deviation of logarithm energy, standard deviation of rhythmic strength, and standard deviation of spectral flux are generally higher for VoIP speech than for non-VoIP speech. One probable reason is that many short-term speech segments in a non-VoIP context such as a movie-like media or a game are usually mixed with other sounds such as background music or sound effect, of which the values of the above features are lower. Meanwhile, the cutoff feature is generally lower for VoIP speech than for non-VoIP speech, which indicates the low cutoff frequency introduced by the many popular VoIP codecs.

Therefore, in one embodiment, the audio content classifier 202A may comprise a VoIP speech classifier 2026 for classifying the short-term segment into the content type VoIP speech or the content type non-VoIP speech; and the audio context classifier 204A may be configured to classify the short-term segment into the context type VoIP or the context type non-VoIP based on confidence values of VoIP speech and non-VoIP speech.

In another embodiment, the audio content classifier 202A may further comprise a VoIP noise classifier 2028 for classifying the short-term segment into the content type VoIP noise or the content type non-VoIP noise; and the audio context classifier 204A may be configured to classify the short-term segment into the context type VoIP or the context type non-VoIP based on confidence values of VoIP speech, non-VoIP speech, VoIP noise and non-VoIP noise.

The content types of VoIP speech, non-VoIP speech, VoIP noise and non-VoIP noise may be identified with existing techniques as discussed in Part 6, Section 1.2 and Section 7.1.

Figure 35:
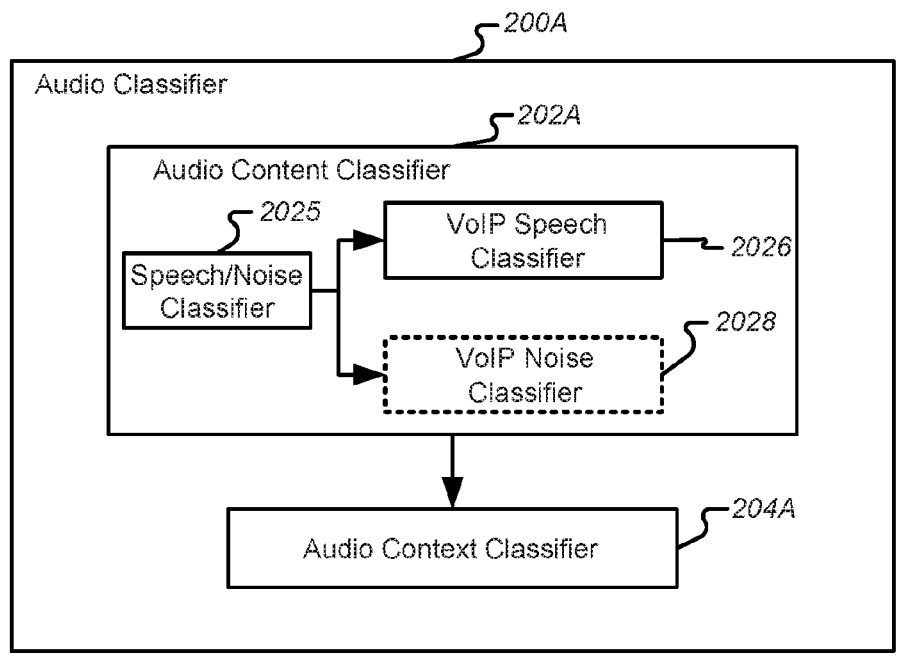
FIG. 35 is a diagram illustrating an audio classifier according to yet another embodiment of the present application.

Alternatively, the audio content classifier 202A may have a hierarchical structure as shown in FIG. 35. That is, we take advantage of the results from a speech/noise classifier 2025 to first classify the short-term segment into speech or noise/background.

On the basis of the embodiment using merely VoIP speech classifier 2026, if a short-term segment is determined as speech by the speech/noise classifier 2025 (in such a situation it is just a speech classifier), then the VoIP speech classifier 2026 continues to classify whether it is VoIP speech or non-VoIP speech, and calculates the binary classification result; Otherwise it may be regarded that the confidence value of VoIP speech is low, or the decision on the VoIP speech is uncertain.

On the basis of the embodiment using merely VoIP noise classifier 2028, if the short-term segment is determined as noise, by the speech/noise classifier 2025 (in such a situation it is just a noise (background) classifier), then the VoIP noise classifier 2028 continues to classify it into VoIP noise or non-VoIP noise, and calculate the binary classification result. Otherwise it may be regarded that the confidence value of VoIP noise is low, or the decision on the VoIP noise is uncertain.

Here, since generally speech is an informative content type and noise/background is an interfering content type, even if a short-term segment is not a noise, in the embodiment in the previous paragraph we can not determine definitely that the short-term segment is not of the context type VoIP. While if a short-term segment is not a speech, in the embodiment merely using the VoIP speech classifier 2026 it is probably not the context type VoIP. Therefore, generally the embodiment using merely VoIP speech classifier 2026 may be realized independently, while the other embodiment using merely VoIP noise classifier 2028 may be used as a supplementary embodiment cooperating with, for example, the embodiment using the VoIP speech classifier 2026.

That is, both VoIP speech classifier 2026 and VoIP noise classifier 2028 may be used. If a short-term segment is determined as speech by the speech/noise classifier 2025, then the VoIP speech classifier 2026 continues to classify whether it is VoIP speech or non-VoIP speech, and calculates the binary classification result. If the short-term segment is determined as noise by the speech/noise classifier 2025, then the VoIP noise classifier 2028 continues to classify it into VoIP noise or non-VoIP noise, and calculate the binary classification result. Otherwise, it may be regarded that short-term segment may be classified as non-VoIP.

The implementation of the speech/noise classifier 2025, the VoIP speech classifier 2026 and the VoIP noise classifier 2028 may adopt any existing techniques, and may be the audio content classifier 202 discussed in Parts 1-6.

If the audio content classifier 202A implemented according to above description finally classifies a short-term segment into none of speech, noise and background, or none of VoIP speech, non-VoIP speech, VoIP noise and non-VoIP noise, meaning all the relevant confidence values are low, then the audio content classifier 202A (and the audio context classifier 204A) may classify the short-term segment as non-VoIP.

For classifying the short-term segment into the context types of VoIP or non-VoIP based on the results of the VoIP speech classifier 2026 and the VoIP noise classifier 2028, the audio context classifier 204A may adopt machine-learning based techniques as discussed in Section 7.1, and as a modification, more features may be used, including short-term features directly extracted from the short-term segment and/or results of other audio content classifier(s) directed to other content types than VoIP related content types, as already discussed in Section 7.1.

Besides the above described machine-learning based techniques, an alternative approach to VoIP/non-VoIP classification can be a heuristic rule taking advantage of domain knowledge and utilizing the classification results in connection with VoIP speech and VoIP noise. An exemplary of such heuristic rules will be illustrated below.

If the current short-term segment of time t is determined as VoIP speech or non-VoIP speech, the classification result is directly taken as the VoIP/non-VoIP classification result since VoIP/non-VoIP speech classification is robust as discussed before. That is, if the short-term segment is determined as VoIP speech, then it is the context type VoIP; if the short-term segment is determined as non-VoIP speech, then it is the context type non-VoIP.

When the VoIP speech classifier 2026 makes a binary decision regarding VoIP speech/non-VoIP speech with respect to speech determined by the speech/noise classifier 2025 as mentioned above, the confidence values of VoIP speech and non-VoIP speech might be complementary, that is, the sum thereof is 1 (if 0 represents 100% not and 1 represents 100% yes), and the thresholds of confidence value for differentiating VoIP speech and non-VoIP speech may indicate actually the same point. If the VoIP speech classifier 2026 is not a binary classifier, the confidence values of VoIP speech and non-VoIP speech might be not complementary, and the thresholds of confidence value for differentiating VoIP speech and non-VoIP speech may not necessarily indicate the same point.

However, in the case where the VoIP speech or non-VoIP speech confidence is close to and fluctuates around the threshold, the VoIP/non-VoIP classification results are possible to switch too frequently. To avoid such fluctuation, a buffer scheme may be provided: both thresholds for VoIP speech and non-VoIP speech may be set larger, so that it is not so easy to switch from the present content type to the other content type. For ease of description, we may convert the confidence value for non-VoIP speech to the confidence value of VoIP speech. That is, if the confidence value is high, the short-term segment is regarded as closer to VoIP speech, and if the confidence value is low, the short-term segment is regarded as closer to non-VoIP speech. Although for non-binary classifier as described above a high confidence value of non-VoIP speech does not necessarily mean a low confidence value of VoIP speech, such simplification may well reflect the essence of the solution and the relevant claims described with language of binary classifiers shall be construed as covering equivalent solutions for non-binary classifiers.

Figure 36:
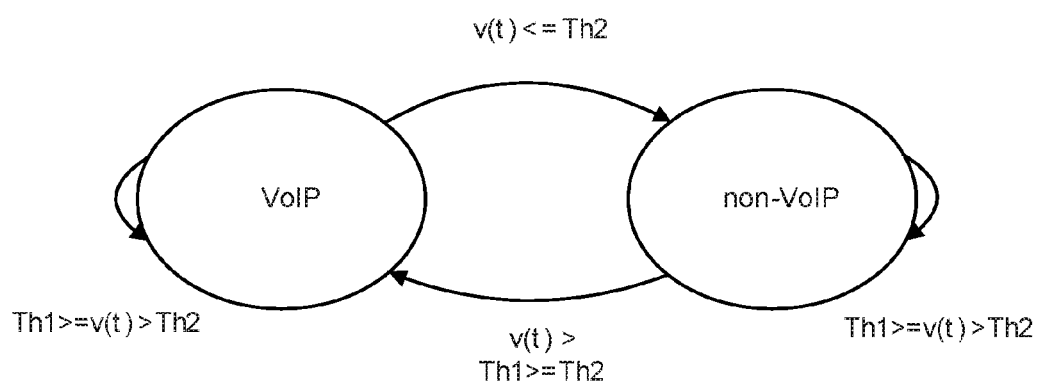
FIG. 36 is a diagram illustrating heuristic rules used in the audio classifier of the present application.

The buffer scheme is shown in FIG. 36. There is a buffer area between two thresholds Th1 and Th2 (Th1>=Th2). When the confidence value v(t) of VoIP speech falls in the area, the context classification will not change, as shown by the arrows on the left and right sides in FIG. 36. Only when the confidence value v(t) is greater than the larger threshold Th1, will the short-term segment be classified as VoIP (as shown by the arrow on the bottom in FIG. 36); and only when the confidence value is not greater than the smaller threshold Th2, will the short-term segment be classified as non-VoIP (as shown by the arrow on the top in FIG. 36).

If the VoIP noise classifier 2028 is used instead, the situation is similar. For making the solution more robust, the VoIP speech classifier 2026 and the VoIP noise classifier 2028 may be used jointly. Then, the audio context classifier 204A may be configured to: classify the short-term segment as the context type VoIP if the confidence value of VoIP speech is greater than a first threshold or if the confidence value of VoIP noise is greater than a third threshold; classify the short-term segment as the context type non-VoIP if the confidence value of VoIP speech is not greater than a second threshold, wherein the second threshold not larger than the first threshold, or if the confidence value of VoIP noise is not greater than a fourth threshold, wherein the fourth threshold not larger than the third threshold; otherwise classify the short-term segment as the context type for the last short-term segment.

Here, the first threshold may be equal to the second threshold, and the third threshold may be equal to the fourth threshold, especially for but not limited to binary VoIP speech classifier and binary VoIP noise classifier. However, since generally the VoIP noise classification result is not so robust, it would be better if the third and the fourth thresholds are not equal to each other, and both should be far from 0.5 (0 indicates high confidence to be non-VoIP noise and 1 indicates high confidence to be VoIP noise).

7.3 Smoothing Fluctuation

Figure 37:
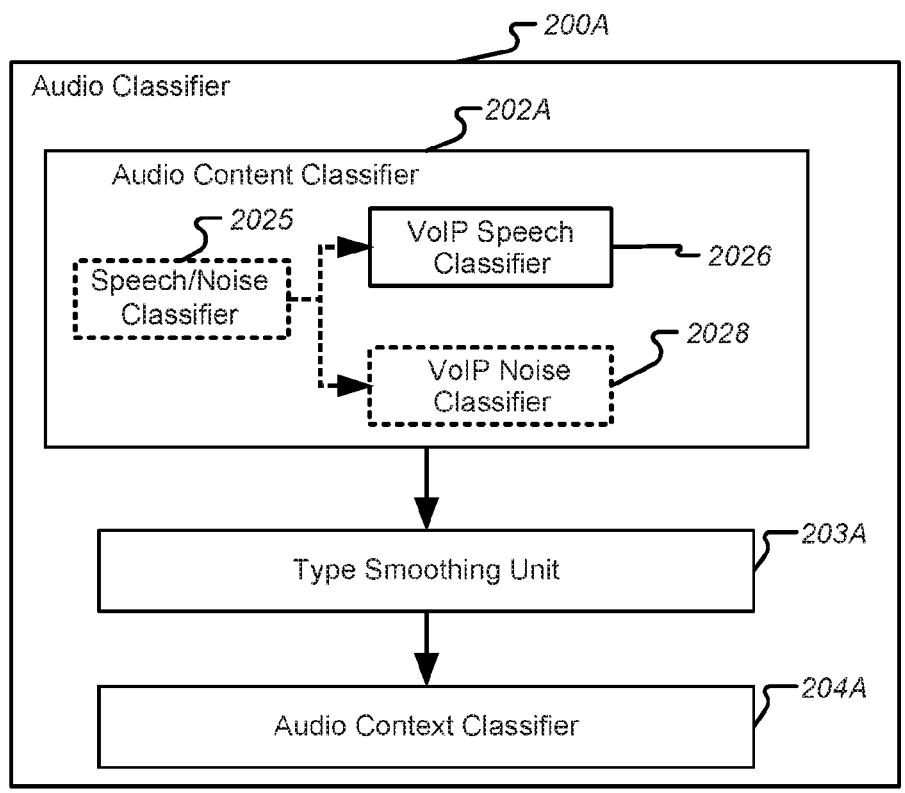
FIGS. 37 and 38 are diagrams illustrating more embodiments of the audio classifier according to the present application.

For avoiding rapid fluctuation, another solution is to smooth the confidence value as determined by the audio content classifier. Therefore, as shown in FIG. 37, a type smoothing unit 203A may be comprised in the audio classifier 200A. For the confidence value of each of 4 VoIP related content types as discussed before, the smoothing schemes discussed in Section 1.3 may be adopted.

Alternatively, similar to Section 7.2, VoIP speech and non-VoIP speech may regarded as a pair having complementary confidence values; and VoIP noise and non-VoIP noise may also be regarded a pair having complementary confidence values. In such a situation, only one out of each pair needs to be smoothed, and the smoothing schemes discussed in Section 1.3 may be adopted.

Take the confidence value of VoIP speech as an example, the formula (3) may be rewritten as:

$$v(t)=\beta \cdot v(t-1)+(1-\beta) \cdot \text{voipSpeechConf}(t) \tag{3''}$$

where v(t) is the smoothed VoIP speech confidence value at time t, v(t−1) is the smoothed VoIP speech confidence value at the last time, and voipSpeechConf is the VoIP speech confidence at current time t before smoothing, α is a weighting coefficient.

In a variant, if there is a speech/noise classifier 2025 as described above, if the confidence value of speech for a short-segment is low, then the short-term segment cannot be classified as VoIP speech robustly, and we can directly set voipSpeechConf (t)=v(t−1) without making the VoIP speech classifier 2026 actually work.

Alternatively, in the situation described above, we could set voipSpeechConf (t)=0.5 (or other value not higher than 0.5, such as 0.4-0.5) indicating an uncertain case (here, confidence=1 indicates a high confidence that it is VoIP and confidence=0 indicates a high confidence that it is not a VoIP).

Therefore, according to the variant, as shown in FIG. 37, the audio content classifier 200A may further comprise a speech/noise classifier 2025 for identifying content type of speech of the short-term segment, and the type smoothing unit 203A may be configured to set the confidence value of VoIP speech for the present short-term segment before smoothing as a predetermined confidence value (such as 0.5 or other value, such as 0.4-0.5) or the smoothed confidence value of the last short-term segment where the confidence value for the content type speech as classified by the speech/noise classifier is lower than a fifth threshold. In such a situation, the VoIP speech classifier 2026 may or may not work. Alternatively the setting of the confidence value may be done by the VoIP speech classifier 2026, this is equivalent to the solution where the work is done by the type smoothing unit 203A, and the claim shall be construed as covering both situations. In addition, here we use the language "the confidence value for the content type speech as classified by the speech/noise classifier is lower than a fifth threshold", but the scope of protection is not limited thereto, and it is equivalent to the situation where the short-term segment is classified into other content types than speech.

For the confidence value of VoIP noise, the situation is similar and detailed description is omitted here.

For avoiding rapid fluctuation, yet another solution is to smooth the confidence value as determined by the audio context classifier 204A, and the smoothing schemes discussed in Section 1.3 may be adopted.

Figure 38:
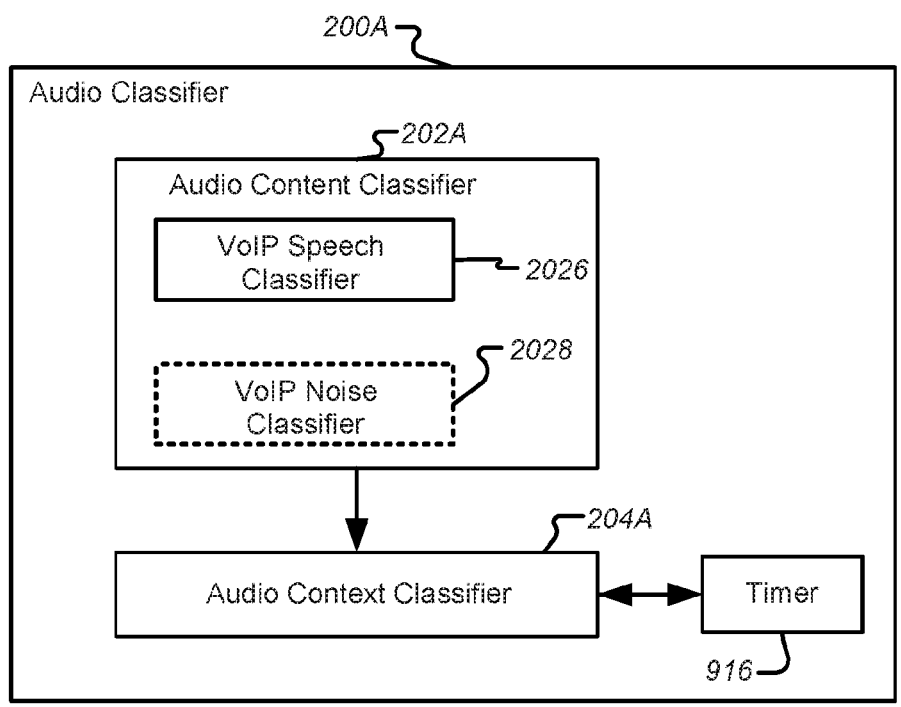

For avoiding rapid fluctuation, still another solution is to delay the transition of the context type between VoIP and non-VoIP, and the same scheme as that described in Section 1.6 may be used. As described in Section 1.6, the timer 916 may be outside the audio classifier or within the audio classifier as a part thereof. Therefore, as shown in FIG. 38, the audio classifier 200A may further comprise the timer 916. And the audio classifier is configured to continue to output the present context type until the length of the lasting time of a new context type reaches a sixth threshold (context type is an instance of audio type). By referring to Section 1.6, detailed description may be omitted here.

In addition or alternatively, as another scheme for delaying the transition between VoIP and non-VoIP, the first and/or second threshold as described before for VoIP/non-VoIP classification may be different depending on the context type of the last short-term segment. That is, the first and/or second threshold becomes larger when the context type of the new short-term segment is different from the context type of the last short-term segment, while becomes smaller when the context type of the new short-term segment is the same as the context type of the last short-term segment. By this way, the context type tends to be maintained at the current context type and thus abrupt fluctuation of the context type may be suppressed to some extent.

7.4 Combination of Embodiments and Application Scenarios

Similar to Part 1, all the embodiments and variants there of discussed above may be implemented in any combination thereof, and any components mentioned in different parts/embodiments but having the same or similar functions may be implemented as the same or separate components.

For example, any two or more of the solutions described in Sections 7.1 to 7.3 may be combined with each other. And any of the combinations may be further combined with any embodiment described or implied in Parts 1-6. Especially, the embodiments discussed in this part and any combination thereof may be combined with the embodiments of the audio processing apparatus/method or the volume leveler controller/controlling method discussed in Part 4.

7.5 VoIP Classifying Method

Similar to Part 1, in the process of describing the audio classifier in the embodiments hereinbefore, apparently disclosed are also some processes or methods. Hereinafter a summary of these methods is given without repeating some of the details already discussed hereinbefore.

Figure 39:
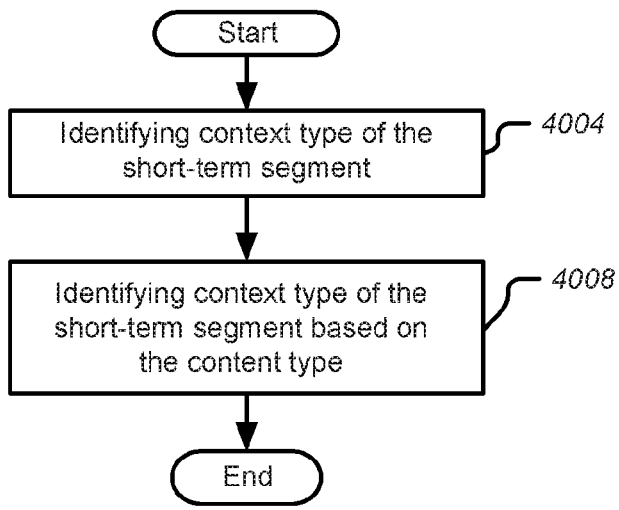
FIGS. 39 and 40 are flow charts illustrating an audio classifying method according to embodiments of the present application.

In one embodiment as shown FIG. 39, an audio classifying method includes identifying a content type of a short-term segment of an audio signal (operation 4004), then identifying a context type of the short-term segment at least partly based on the content type as identified (operation 4008).

For identifying the context type of an audio signal dynamically and fast, the audio classifying method in this part is especially useful in identifying the context type VoIP and non-VoIP. In such a situation, the short-term segment may be firstly classified into the content type VoIP speech or the content type non-VoIP speech, and the operation of identifying the context type is configured to classify the short-term segment into the context type VoIP or the context type non-VoIP based on confidence values of VoIP speech and non-VoIP speech.

Alternatively, the short-term segment may be firstly classified into the content type VoIP noise or the content type non-VoIP noise, and the operation of identifying the context type may be configured to classify the short-term segment into the context type VoIP or the context type non-VoIP based on confidence values of VoIP noise and non-VoIP noise.

The speech and the noise may be considered jointly. In such a situation, the operation of identifying the context type may be configured to classify the short-term segment into the context type VoIP or the context type non-VoIP based on confidence values of VoIP speech, non-VoIP speech, VoIP noise and non-VoIP noise.

For identifying the context type of the short-term segment, a machine-learning model may be used, taking both the confidence values of the content types of the short-term segment and other features extracted from the short-term segment as features.

The operation of identifying the context type may also be realized based on heuristic rules. When only VoIP speech and non-VoIP speech are involved, the heuristic rule is like this: classify the short-term segment as the context type VoIP if the confidence value of VoIP speech is greater than a first threshold; classify the short-term segment as the context type non-VoIP if the confidence value of VoIP speech is not larger than a second threshold, wherein the second threshold not larger than the first threshold; otherwise, classify the short-term segment as the context type for the last short-term segment.

The heuristic rule for the situation where only VoIP noise and non-VoIP noise are involved is similar.

When both speech and noise are involved, the heuristic rule is like this: classify the short-term segment as the context type VoIP if the confidence value of VoIP speech is greater than a first threshold or if the confidence value of VoIP noise is greater than a third threshold; classify the short-term segment as the context type non-VoIP if the confidence value of VoIP speech is not greater than a second threshold, wherein the second threshold not larger than the first threshold, or if the confidence value of VoIP noise is not greater than a fourth threshold, wherein the fourth threshold not larger than the third threshold; otherwise, classify the short-term segment as the context type for the last short-term segment.

Figure 40:
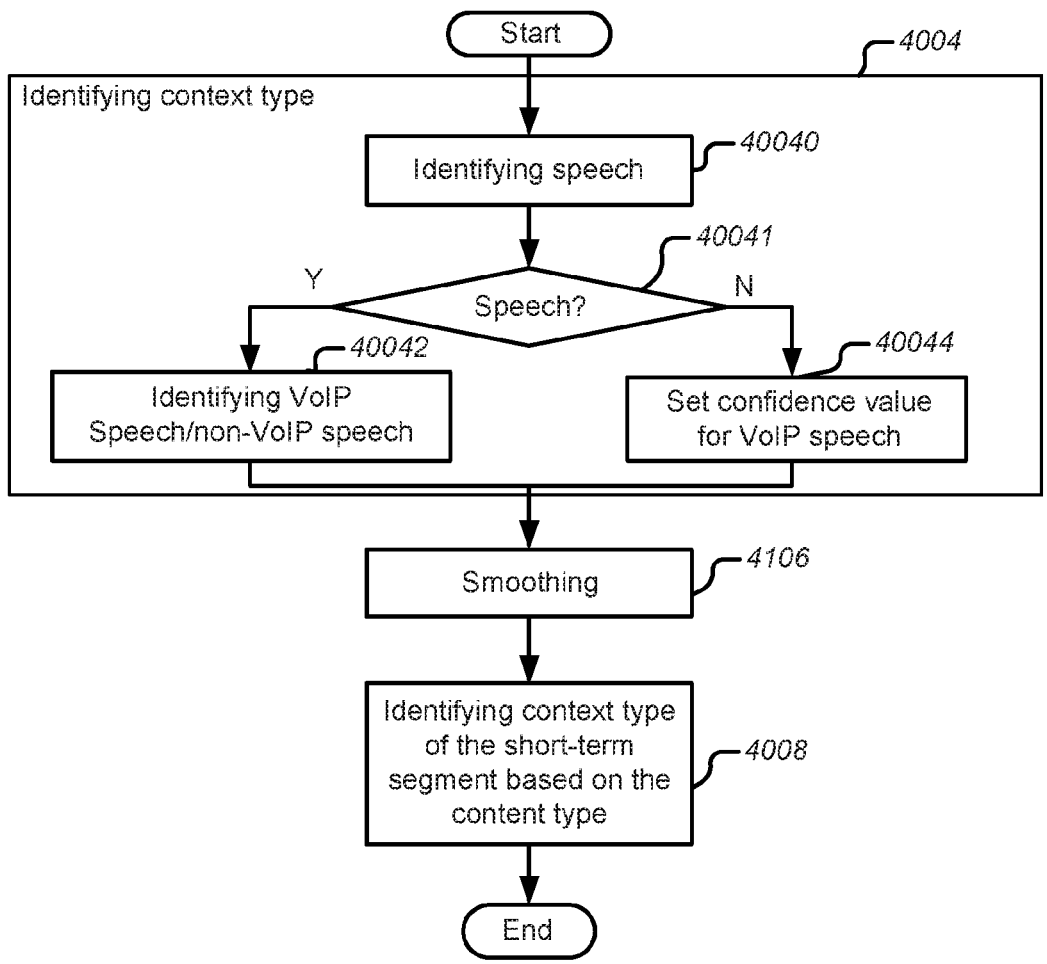

The smoothing scheme discussed in Section 1.3 and Section 1.8 may be adopted here and detailed description is omitted. As a modification to the smoothing scheme described in Section 1.3, before the smoothing operation 4106, the method may further comprise identifying the content type speech from the short-term segment (operation 40040 in FIG. 40), wherein the confidence value of VoIP speech for the present short-term segment before smoothing is set as a predetermined confidence value or the smoothed confidence value of the last short-term segment (operation 40044 in FIG. 40) where the confidence value for the content type speech is lower than a fifth threshold ("N" in operation 40041).

If otherwise the operation of identifying the content type speech robustly judges the short-term segment as speech ("Y" in operation 40041), then the short-term segment is further classified into VoIP speech or non-VoIP speech (operation 40042), before the smoothing operation 4106.

In fact, even without using the smoothing scheme, the method may also identify the content type speech and/or noise first, when the short-term segment is classified as speech or noise, further classification is implemented to classify the short-term segment into one of VoIP speech and non-VoIP speech, or one of VoIP noise and non-VoIP noise. Then the operation of identifying the context type is made.

As mentioned in Section 1.6 and Section 1.8, the transition scheme discussed therein may be taken as a part of the audio classifying method described here, and the detail is omitted. Briefly, the method may further comprise measuring the lasting time during which the operation of identifying the context type continuously outputs the same context type, wherein the audio classifying method is configured to continue to output the present context type until the length of the lasting time of a new context type reaches a sixth threshold.

Similarly, different sixth thresholds may be set for different transition pairs from one context type to another context type. In addition, the sixth threshold may be negatively correlated with the confidence value of the new context type.

As a modification to the transition scheme in the audio classifying method specially directed to VoIP/non-VoIP classification, any one or more of the first to fourth threshold for the present short-term segment may be set different depending on the context type of the last short-term segment.

Similar to the embodiments of the audio processing apparatus, any combination of the embodiments of the audio processing method and their variations are practical on one hand; and on the other hand, every aspect of the embodiments of the audio processing method and their variations may be separate solutions. In addition, any two or more solutions described in this section may be combined with each other, and these combinations may be further combined with any embodiment described or implied in the other parts of this disclosure. Specifically, the audio classifying method described here may be used in the audio processing method described before, especially the volume leveler controlling method.

Figure 41:
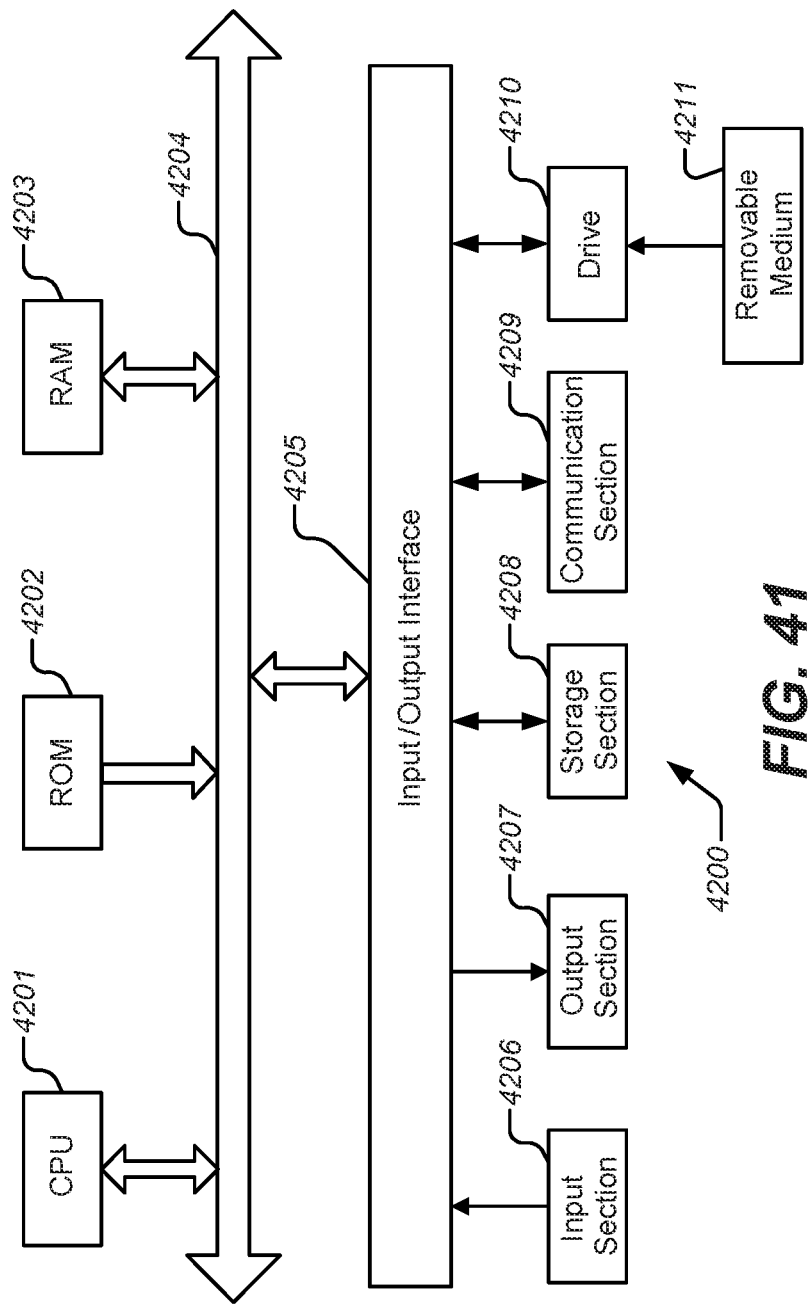
FIG. 41 is a block diagram illustrating an exemplary system for implementing embodiments of the present application.

As discussed at the beginning of the Detailed Description of the present application, the embodiment of the application may be embodied either in hardware or in software, or in both. FIG. 41 is a block diagram illustrating an exemplary system for implementing the aspects of the present application.

In FIG. 41, a central processing unit (CPU) 4201 performs various processes in accordance with a program stored in a read only memory (ROM) 4202 or a program loaded from a storage section 4208 to a random access memory (RAM) 4203. In the RAM 4203, data required when the CPU 4201 performs the various processes or the like are also stored as required.

The CPU 4201, the ROM 4202 and the RAM 4203 are connected to one another via a bus 4204. An input/output interface 4205 is also connected to the bus 4204.

The following components are connected to the input/output interface 4205: an input section 4206 including a keyboard, a mouse, or the like; an output section 4207 including a display such as a cathode ray tube (CRT), a liquid crystal display (LCD), or the like, and a loudspeaker or the like; the storage section 4208 including a hard disk or the like; and a communication section 4209 including a network interface card such as a LAN card, a modem, or the like. The communication section 4209 performs a communication process via the network such as the internet.

A drive 4210 is also connected to the input/output interface 4205 as required. A removable medium 4211, such as a magnetic disk, an optical disk, a magneto-optical disk, a semiconductor memory, or the like, is mounted on the drive 4210 as required, so that a computer program read there from is installed into the storage section 4208 as required.

In the case where the above-described components are implemented by the software, the program that constitutes the software is installed from the network such as the internet or the storage medium such as the removable medium 4211.

Please note the terminology used herein is for the purpose of describing particular embodiments only and is not intended to be limiting of the application. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, operations, steps, elements, and/or components, but do not preclude the presence or addition of one or more other features, integers, operations, steps, elements, components, and/or groups thereof.

The corresponding structures, materials, acts, and equivalents of all means or operation plus function elements in the claims below are intended to include any structure, material, or act for performing the function in combination with other claimed elements as specifically claimed. The description of the present application has been presented for purposes of illustration and description, but is not intended to be exhaustive or limited to the application in the form disclosed. Many modifications and variations will be apparent to those of ordinary skill in the art without departing from the scope and spirit of the application. The embodiment was chosen and described in order to best explain the principles of the application and the practical application, and to enable others of ordinary skill in the art to understand the application for various embodiments with various modifications as are suited to the particular use contemplated.

We claim:
1. A volume leveler controller comprising:
one or more processors;
memory storing instructions, which, when executed by the one or more processors, cause the one or more processors to perform operations comprising:
an audio content classifier configured for classifying a content type of an audio signal, the classifying including processing content of the audio signal to classify the content, and generating a confidence value indicating a level of confidence that the content was correctly classified; and
an adjusting unit configured for automatically adjusting a volume level of the audio signal during playback in a continuous manner based on the classified content type and confidence value.

2. An audio processing apparatus comprising a volume leveler controller according to claim 1.

3. An audio classifying method, comprising:
classifying, by an audio classifier, content in a segment of an audio signal into one or more content types, the classifying including processing the content in the segment to classify the content;
generating one or more confidence values indicating a level of confidence that the content was classified correctly; and
classifying, by an audio context classifier, a context type of the segment at least partly based on the one or more classified content types and the one or more confidence values.

4. The audio classifying method according to claim 3, further comprising:
classifying the segment as the context type VoIP if the confidence value of VoIP speech is greater than a first threshold or if the confidence value of VoIP noise is greater than a third threshold; or
classifying the segment as the context type non-VoIP if the confidence value of VoIP speech is not greater than a second threshold, wherein the second threshold is not larger than the first threshold; if the confidence value of VoIP noise is not greater than a fourth threshold, wherein the fourth threshold is not larger than the third threshold; or
classifying the segment as the context type for a past segment.

5. The audio classifying method according to claim 3, further comprising smoothing the confidence value of the content type based on one or more past confidence values of the content type.

6. The audio classifying method according to claim 5, wherein the smoothing operation is configured to determine a smoothed confidence value of the segment by calculating a weighted sum of the confidence value of the segment and a smoothed confidence value of a past segment of the audio signal.

7. The audio classifying method according to claim 6, further comprising classifying the content type speech from the segment, wherein the confidence value of VoIP speech for the present segment before smoothing is set as a predetermined confidence value or the smoothed confidence value of the past segment where the confidence value for the content type speech is lower than a fifth threshold.

8. The audio classifying method according to claim 3, further comprising:
classifying the segment into the content type Voice over Internet Protocol (VoIP) speech or the content type non-VoIP speech; and
classifying the segment into the context type VoIP or the context type non-VoIP based on confidence values of VoIP speech and non-VoIP speech.

9. The audio classifying method according to claim 8, further comprising:
classifying the segment into the content type VoIP noise or the content type non-VoIP noise; and
classifying the segment into the context type VoIP or the context type non-VoIP based on confidence values of VoIP speech, non-VoIP speech, VoIP noise and non-VoIP noise.

10. The audio classifying method according to claim 8, further comprising:
classifying the segment as the context type VoIP if the confidence value of VoIP speech is greater than a first threshold; or
classifying the segment as the context type non-VoIP if the confidence value of VoIP speech is not larger than a second threshold, wherein the second threshold not larger than the first threshold; or
classifying the segment as the context type for a past segment.

11. The audio classifying method according to claim 10, wherein at least one of the first or second thresholds is different depending on the context type of the past segment.

12. The audio classifying method according to claim 10, further comprising measuring a lasting time during which the operation of classifying the context type continuously outputs a same context type, wherein the audio classifying method is configured to continue to output the context type until the length of the lasting time of a new context type reaches a sixth threshold.

13. The audio classifying method according to claim 12, wherein different sixth thresholds are set for different transition pairs from one context type to another context type.

14. The audio classifying method according to claim 12, wherein the sixth threshold is negatively correlated with the confidence value of the new context type.

15. The audio classifying method according to claim 3, wherein the operation of classifying the context type is configured to classify the short term segment based on a machine-learning model by using, as features, the confidence values of the content types of the segment and other features extracted from the segment.

16. An audio processing apparatus comprising:
an audio classifying unit configured to process content of a segment of an audio signal to classify the content into one or more content types and to generate one or more confidence values indicating a confidence that the content was correctly classified; and
an audio context classifying unit configured to classify the segment into one or more context types based at least in part on the one or more classified content types and the one or more confidence values.

17. A non-transitory, computer-readable medium with instructions stored thereon that when executed by one or more processors, causes the one or more processors to perform operations comprising:

processing, by an audio classifier, content of a segment of an audio signal to classify the content into one or more content types;

generating one or more confidence values indicating a level of confidence that the content was correctly classified; and classifying, by an audio context classifier, the segment into a context type based at least in part on the one or more classified content types and the one or more confidence values.

* * * * *